(12) United States Patent
Gyoda

(10) Patent No.: US 8,698,131 B2
(45) Date of Patent: Apr. 15, 2014

(54) ORGANIC EL APPARATUS, METHOD OF MANUFACTURING ORGANIC EL APPARATUS, ELECTRONIC APPARATUS

(75) Inventor: Kozo Gyoda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 151 days.

(21) Appl. No.: 12/730,796

(22) Filed: Mar. 24, 2010

(65) Prior Publication Data

US 2010/0244005 A1    Sep. 30, 2010

(30) Foreign Application Priority Data

Mar. 26, 2009  (JP) ................ 2009-077571
Nov. 25, 2009  (JP) ................ 2009-267189

(51) Int. Cl.
*H01L 51/52* (2006.01)
*B32B 37/12* (2006.01)

(52) U.S. Cl.
USPC ...... 257/40; 257/E51.022; 438/409; 438/455; 438/456; 438/457; 438/458

(58) Field of Classification Search
USPC ............ 257/40, E51.022; 438/409, 455–458, 438/464
See application file for complete search history.

(56) References Cited

U.S. PATENT DOCUMENTS

| | | | |
|---|---|---|---|
| 6,147,451 A | 11/2000 | Shibata et al. | |
| 6,265,820 B1 * | 7/2001 | Ghosh et al. | 313/483 |
| 6,429,584 B2 * | 8/2002 | Kubota | 313/504 |
| 6,633,123 B2 * | 10/2003 | Tazawa | 313/506 |
| 7,015,632 B2 * | 3/2006 | Kobayashi et al. | 313/42 |
| 7,045,438 B2 * | 5/2006 | Yamazaki et al. | 438/455 |
| 7,221,089 B2 * | 5/2007 | Tsujimura et al. | 313/504 |
| 7,312,573 B2 * | 12/2007 | Chang et al. | 313/512 |
| 7,384,179 B2 * | 6/2008 | Sakai | 362/632 |
| 7,411,224 B2 * | 8/2008 | Kim et al. | 257/99 |
| 7,495,380 B2 * | 2/2009 | Jun | 313/495 |
| 7,642,559 B2 * | 1/2010 | Yamazaki et al. | 257/88 |
| 2003/0085654 A1 * | 5/2003 | Hayashi | 313/506 |
| 2005/0068738 A1 | 3/2005 | Kim et al. | |
| 2005/0248270 A1 * | 11/2005 | Ghosh et al. | 313/512 |
| 2006/0186805 A1 * | 8/2006 | Kim et al. | 313/506 |
| 2007/0207696 A1 * | 9/2007 | Park et al. | 445/25 |
| 2007/0216273 A1 * | 9/2007 | Yanagawa et al. | 313/46 |
| 2007/0216298 A1 | 9/2007 | Kaneko | |
| 2009/0045752 A1 * | 2/2009 | Azuma et al. | 315/169.3 |
| 2010/0007259 A1 | 1/2010 | Kaneko | |

FOREIGN PATENT DOCUMENTS

| | | |
|---|---|---|
| CN | 1602151 A | 3/2005 |
| JP | A 58-147087 | 9/1983 |
| JP | A 60-012747 | 1/1985 |
| JP | A 7-109171 | 4/1995 |
| JP | A-11-054268 | 2/1999 |
| JP | A-2004-203015 | 7/2004 |
| JP | A-2005-019082 | 1/2005 |
| JP | A-2006-049057 | 2/2006 |

(Continued)

*Primary Examiner* — Lex Malsawma
*Assistant Examiner* — Sheng Zhu
(74) *Attorney, Agent, or Firm* — Oliff PLC

(57) ABSTRACT

Provided is an organic EL apparatus including: an organic EL panel including organic EL devices; a heat releasing member; and a pair of film sheets of which at least one is transparent, wherein the organic EL panel and the heat releasing member overlap and are interposed and encapsulated by the pair of film sheets in a state where a portion of the heat releasing member is exposed outside the pair of film sheets.

10 Claims, 22 Drawing Sheets

(56) References Cited

FOREIGN PATENT DOCUMENTS

| JP | A 2006-196570 | 7/2006 |
| JP | A-2006-259307 | 9/2006 |
| JP | B2 3948000 | 7/2007 |
| JP | A-2007-265968 | 10/2007 |
| JP | A 2008-58489 | 3/2008 |
| JP | B2 4131639 | 8/2008 |

* cited by examiner

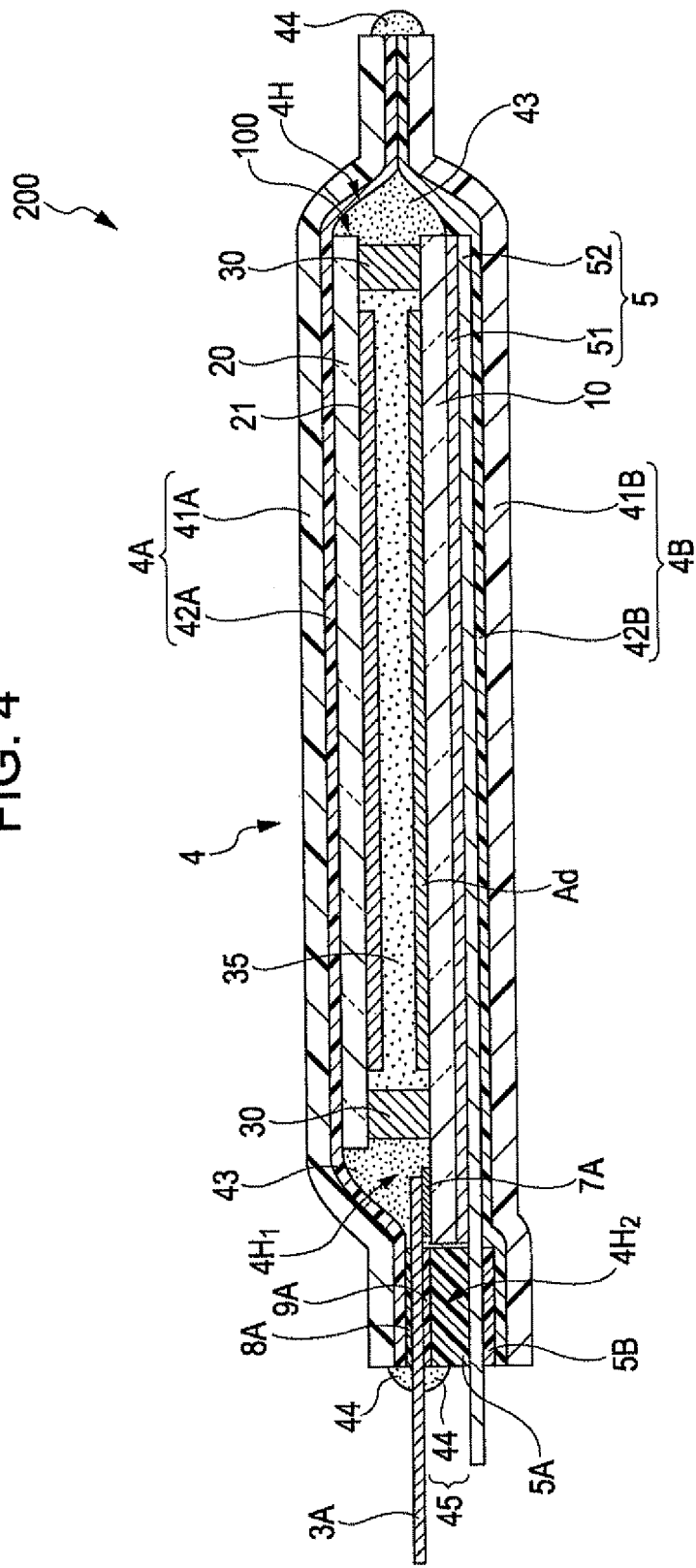

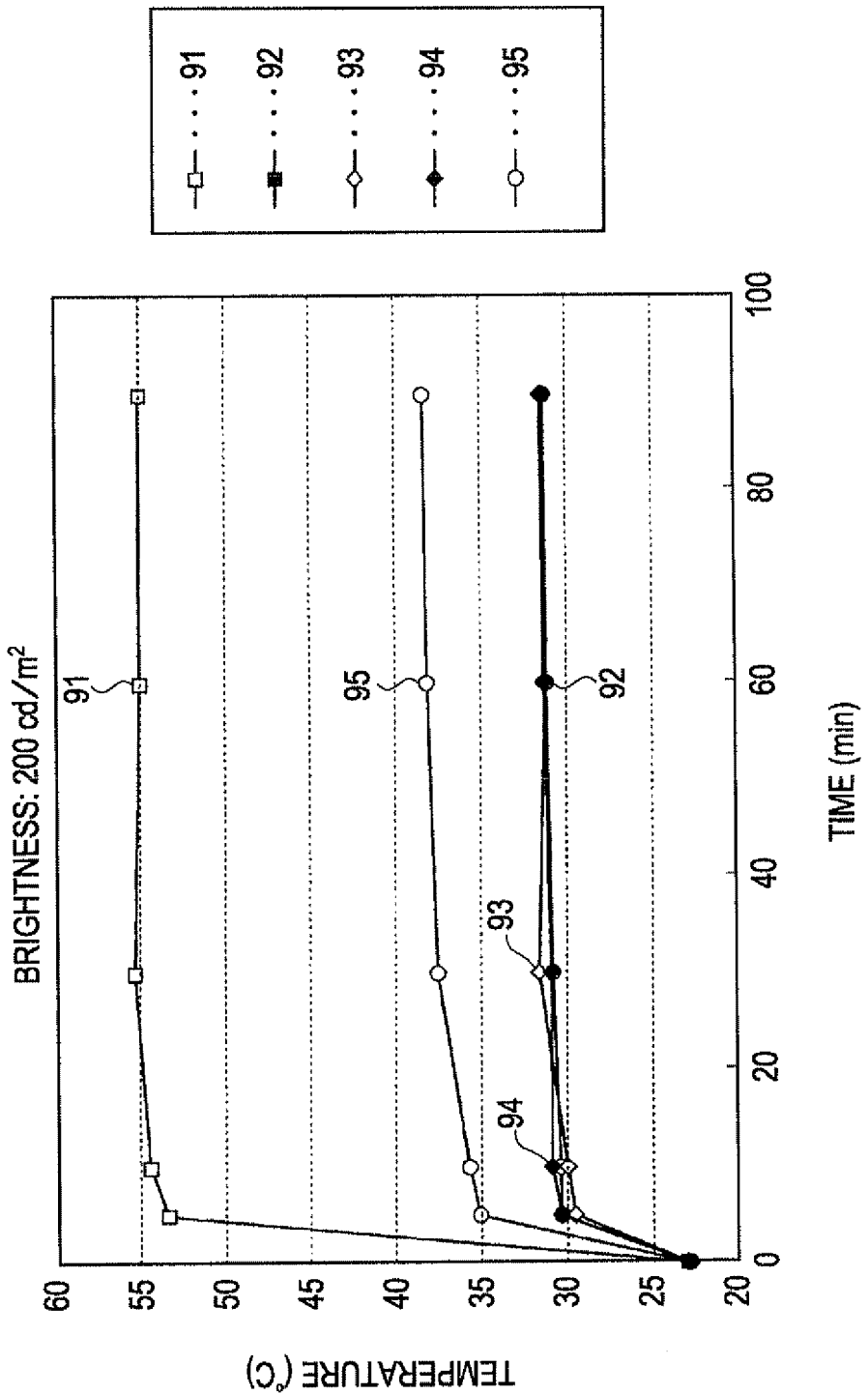

ONE SURFACE: GRAPHITE 25 μm

TWO SURFACES:
TWO-SURFACE LIGHTENING

ONE SURFACE: NO GRAPHITE

TWO SURFACES:
ONE-SURFACE LIGHTENING

ORGANIC EL APPARATUS, METHOD OF MANUFACTURING ORGANIC EL APPARATUS, ELECTRONIC APPARATUS

CROSS REFERENCES TO RELATED APPLICATIONS

The present invention contains subject matter related to Japanese Patent Application No. 2009-077571 filed in the Japanese Patent Office on Mar. 26, 2009 and Japanese Patent Application No. 2009-267189 on Nov. 25, 2009, the entire contents of which are incorporated herein by reference.

BACKGROUND

1. Technical Field

The invention relates to an organic EL apparatus having an organic EL (electroluminescence) device, a method of manufacturing the organic EL apparatus, and an electronic apparatus.

2. Related Art

An organic EL apparatus which is a thin, lightly-weighted self-luminous device has been expected to be used for various applications such as a mobile phone, a personal computer, an in-vehicle monitor, or the like. Recently, a glass substrate having high heat resistance has been thinned down to a thickness range of about 50 μm to 100 μm. Therefore, a flexible high-performance organic EL apparatus where peripheral driving circuits are embedded has been developed (for example, JP-A-2008-58489).

In the organic EL apparatus using the thin glass substrate, there is a problem in that, since organic EL apparatus is vulnerable to mechanical impact and a thickness thereof is small, it is difficult to treat the organic EL apparatus. JP Patent No. 4,131,639 discloses a liquid crystal apparatus having a similar configuration, where a liquid crystal panel using a thin glass substrate is reinforced with a thick polarizing plate having a thickness of 0.3 mm and these components are integrated between laminating films (refer to FIG. 7 of JP Patent No. 4,131,639).

However, there is a problem in that the heat generated at the time of light emission is easily accumulated in the organic EL panel covered with the laminating films. In addition, there is a problem in that, if it is used for a long time, the light emission characteristic is changed due to the influence of the heat. In JP Patent No. 4,131,639, the problem of heat releasing at the time of light emission of the organic EL panel is not considered, and any appropriate heat releasing apparatus is not disclosed.

SUMMARY

An advantage of some aspects of the invention is to provide an organic EL apparatus having strong mechanical strength and excellent heat releasing performance, a method of manufacturing the organic EL apparatus, and an electronic apparatus.

According to an aspect of the invention, there is provided an organic EL apparatus including: an organic EL panel including organic EL devices; a heat releasing member; and a pair of film sheets of which at least one is transparent, wherein the organic EL panel and the heat releasing member overlap and are interposed and encapsulated by the pair of film sheets in a state where a portion of the heat releasing member is exposed outside the pair of film sheets.

According to the above configuration, since the organic EL panel and the heat releasing member are integrated with the pair of film sheets, when the organic EL panel is driven, the heat generated from the organic EL devices is transferred to the heat releasing member, and the heat can be released from portions of the heat releasing member that are exposed outside the pair of film sheets. In other words, the portions of the heat releasing member are exposed outside the film sheet, and an organic EL apparatus having excellent heat releasing performance can be implemented.

Therefore, it is possible to provide an organic EL apparatus where the light emission characteristics of the organic EL panel cannot be easily varied due to the heat generated from the organic EL devices.

In addition, in the above organic EL apparatus, the heat releasing member may be a lamination structure constituted by a heat releasing sheet, of which thermal conductivity in the in-plane direction is higher than that in the thickness direction thereof, and a heat releasing plate that is made of a metal, wherein the organic EL panel overlaps the heat releasing sheet, and wherein a portion of the heat releasing plate is exposed outside the pair of film sheets.

According to the above configuration, although the organic EL devices are locally heated, the heat is distributed through the heat releasing sheet over the entire heat releasing plate, so that the heat can be speedily released. Therefore, the inner portion of the organic EL panel is not heated up to a high temperature, and the light emission characteristics can be maintained to be almost constant.

In addition, in the above organic EL apparatus, at least interstices generated between the pair of film sheets and outer circumferential portion end surfaces of the organic EL panel may be filled with a sealing resin, and the organic EL panel may be encapsulated by the pair of film sheets.

According to the above configuration, the organic EL panel is hermetically encapsulated between the pair of film sheets. Therefore, a gas such as oxygen or water vapor is infiltrated from the outside of the pair of film sheets into the organic EL panel, so that there is a problem in that the life cycle of light emission of the organic EL devices is decreased. In other words, an organic EL apparatus having a long life cycle of light emission can be implemented.

In addition, in the above organic EL apparatus, the organic EL panel may include a base material layer that is constructed with a glass substrate and organic EL devices that is disposed on the base material layer, and a thickness of the base material layer is equal to or larger than 20 μm and equal to or smaller than 50 μm.

According to the above configuration, the organic EL panel can have a flexibility, so that it is possible to implement an organic EL apparatus that can be bent although it is encapsulated by a pair of film sheets. In addition, since a glass substrate having high heat resistance is used, peripheral driving circuits such as a scan line driving circuit can be formed on the base material layer by using a low temperature polysilicon technology or the like. Therefore, an organic EL apparatus having high performance can be implemented.

Moreover, although the glass substrate may be broken by external stress, since the glass substrate is encapsulated by the pair of film sheets, the fragments can be prevented from being flying out at random.

In this case, if the thickness of the base material layer is smaller than 20 μm, defects called dimples or pits are increased, so that the light emission defects are noticeably increased. In addition, if the thickness is larger than 50 μm, sufficient flexibility cannot be provided, and various resin layers formed on the base material layer, for example, a planarizing resin layer or the like covering the organic EL devices are expanded due to the heat at the time of light emission, so that the driving devices for driving the organic EL devices may be pressed. However, if the thickness is equal to or larger than 20 μM and equal to or smaller than 50 μm, the number of occurrence of light emission defect is equal to or smaller than one, so that the light emission characteristic where almost no defect exists can be obtained. In addition, in the above thickness range, cracks are hardly generated by the pressure at the time of interposing the organic EL panel between the pair of film sheets, so that the organic EL apparatus can be manufactured at high yield.

In addition, in the above organic EL apparatus, the heat releasing sheet may include a graphite sheet.

According to the above configuration, since the thermal conductivity of the graphite sheet in the in-plane direction is higher than that in the thickness direction thereof, the in-plane heat releasing performance can be improved. In addition, high durability to the bending can be implemented.

In addition, in the above organic EL apparatus, a display panel may be further disposed at the side of the heat releasing member opposite to the side where the heat releasing member and the organic EL panel overlap, and the organic EL panel, the heat releasing member, and the display panel may be interposed and encapsulated by the pair of film sheets.

In addition, in the above organic EL apparatus, the display panel may be an organic EL panel or an electrophoretic panel having an electrophoretic layer.

According to the above configuration, an organic EL apparatus having display panels on the front and rear surfaces can be implemented.

Particularly, since the electrophoretic panel is a light-receiving type display and since the electrophoretic panel has a self heat releasing function, the heat releasing effect of the heat releasing member can be further improved.

In addition, the electrophoretic panel receives the heat generated from the organic EL panel, so that stabilized display characteristic can be implemented even in a state where the external temperature is lower than the room temperature. In other words, the self-luminous organic EL panel and the light-receiving electrophoretic panel are included, so that the organic EL apparatus which can obtain stabilized display quality can be implemented.

According to another aspect of the invention, there is provided a method of manufacturing an organic EL apparatus having an organic EL panel, where organic EL devices are formed, and a heat releasing member which is closely attached to the organic EL panel directly or through an adhesive agent layer, including: disposing the organic EL panel and the heat releasing member between a pair of film sheets, of which at least one is transparent, and inserting a lamination structure of the pair of film sheets, the organic EL panel, and the heat releasing member between a pair of pressing units; and pressing the lamination structure and adhering the pair of film sheets to circumferential portions of the organic EL panel by using the pair of pressing units in a state where there is an adhesive agent on the inner surfaces of the pair of film sheets and a portion of the heat releasing member is exposed outside the pair of film sheets between the pair of film sheets.

According to the above method, since the heat releasing member and the organic EL panel are integrated with the pair of film sheets and since the portions of the heat releasing member are exposed outside the film sheet, an organic EL apparatus having excellent heat releasing performance can be implemented. In the organic EL apparatus, since the heat releasing member including the heat releasing sheet of which the thermal conductivity in the in-plane direction is higher than that in the thickness direction is used, the heat generated from the organic EL panel is transferred in the surface direction of the heat releasing sheet, so that the heat can be speedily released to the outer side of the film sheet. Therefore, the organic EL panel is not heated up to a high temperature, and the light emission characteristics can be maintained to be almost constant.

In addition, in the above manufacturing method, in the pressing of the lamination structure and adhering of the pair of film sheets to the circumferential portions of the organic EL panel, the interstices may be sealed by pressing the lamination structure by using the pair of pressing units, pressing and spreading the adhesive agent into the interstices between the pair of film sheets, the organic EL panel, and the heat releasing member, and the organic EL panel may be encapsulated inside the pair of film sheets by adhering the portions of the pair of film sheets that face each other at the circumferential portions of the organic EL panel and the portions of the heat releasing member and the film sheets that face each other by using the adhesive agent.

According to the above method, since no interstice is formed between the film sheet and the heat releasing member, the transferring of the heat from the heat releasing member to the film sheet is facilitated, so that the heat releasing performance of the surface of the film sheet can be improved. In addition, since the circumferential portions of the organic EL panel is overlappedly sealed by the sealing resin and the film sheets, the sealing performance of the organic EL panel is also improved. In addition, since the film sheet and the heat releasing member are fixed, although tension stress or the like is exerted to the heat releasing member, the detachment or the position variation does not occur between the heat releasing member and the organic EL panel. Therefore, a stabilized heat releasing performance can be maintained.

In addition, in the above manufacturing method, the pair of pressing units may be a pair of pressing rollers, and in the disposing of the organic EL panel and the heat releasing member between the pair of film sheets and inserting of the lamination structure, the lamination structure may be inserted from an end portion of the sides of the pair of film sheets opposite to a side, where the heat releasing member is exposed, between the pair of pressing rollers.

According to the above method, the problem in that the bubbles remain on the surfaces of the organic EL panels or the end portions of the organic EL panels due to the step differences between the heat releasing member and the organic EL panel may be alleviated. Therefore, it is possible to implement an organic EL apparatus having excellent display quality and sealing performance, and since the transferring of the heat from the heat releasing member to the film sheet cannot be influenced by the remaining bubbles, so that the heat releasing performance of the surface of the film sheet can be improved.

In addition, in the above manufacturing method, the adhesive agent may be a thermoplastic adhesive agent, and the adhesive agent may be formed on the surfaces of the pair of film sheets, which face each other, and on the surfaces of the heat releasing member, which face the film sheets.

According to the above method, since the manufacturing can be performed by using a general laminating apparatus, a new manufacturing apparatus is unnecessary.

In addition, in the above manufacturing method, in the disposing of the organic EL panel and the heat releasing member between the pair of film sheets and inserting of the lamination structure, the display panel may further overlap the side of the heat releasing member opposite to the side where the organic EL panel overlaps, and in the pressing of the lamination structure and adhering of the pair of film sheets to the circumferential portions of the organic EL panel, the pair of film sheets may be sealed by circumferential portions of the lamination structure where the organic EL panel, the heat releasing member, and the display panel are laminated.

In addition, in the above manufacturing method, the display panel may be an organic EL panel or an electrophoretic panel having an electrophoretic layer.

According to the above method, an organic EL apparatus having display panels on the front and rear surfaces can be implemented.

Particularly, in the case where the electrophoretic panel is used as the display panel, the heat generated from the organic EL panel is released through the heat releasing member and the heat releasing sheet to the electrophoretic panel. More specifically, the electrophoretic panel is a light-receiving type display panel, so that the transferred heat can be released. In addition, the electrophoretic panel receives the heat generated from the organic EL panel, so that stabilized display characteristic can be implemented even in a state where the external temperature is lower than the room temperature. In other words, the self-luminous organic EL panel and the light-receiving electrophoretic panel are included, so that the organic EL apparatus which can obtain stabilized display quality can be manufactured.

According to still another aspect of the invention, there is provided an electronic apparatus having the aforementioned organic EL apparatus.

According to the above configuration, an electronic apparatus having strong mechanical strength and excellent heat releasing performance can be implemented.

BRIEF DESCRIPTION OF THE DRAWINGS

The invention will be described with reference to the accompanying drawings, wherein like numbers reference like elements.

FIG. 4 is a cross-sectional view taken along line IV-IV of FIG. 3.

FIG. 23 is a view illustrating a graph of a change in a temperature of a display area with respect to time at the time of light emission in Examples according to the first and second embodiments.

DESCRIPTION OF EXEMPLARY EMBODIMENTS

Figure 1:
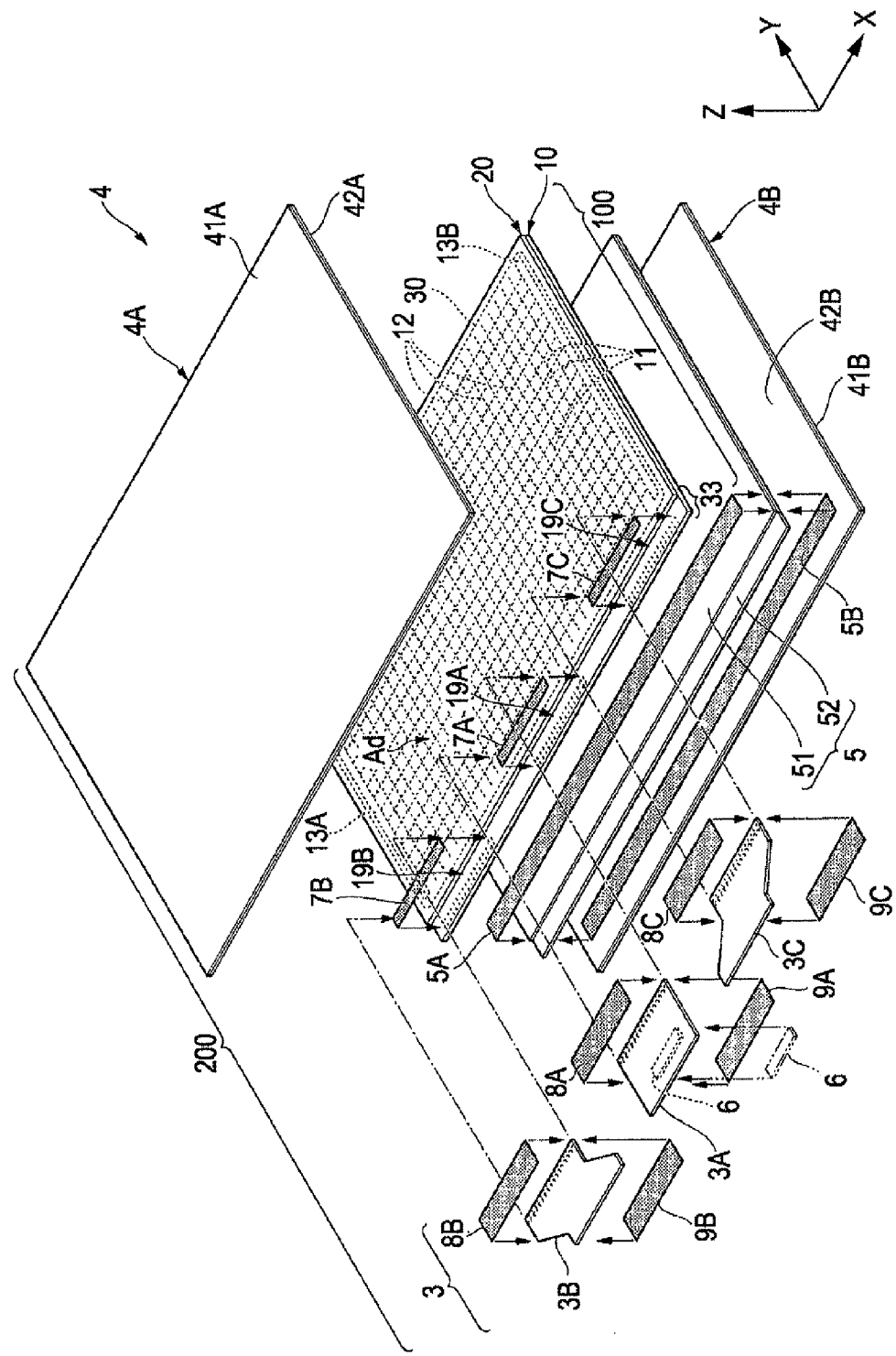
FIG. 1 is an exploded perspective view illustrating an organic EL apparatus according to a first embodiment of the invention.

Hereinafter, exemplary embodiments of the invention will be described with reference to the drawings. The embodiment is an example of the invention, but the invention is not limited thereto. In the below-described embodiments, shapes of components and combination thereof are exemplary ones, and thus, various modifications are available on the basis of design requirements without departing from the spirit of the invention. In addition, in the drawings hereinafter for the better understanding of the configurations, scales or numerical values are different from those of actual structures.

In addition, in the description hereinafter, positional relationship between elements is described in the XYZ rectangular coordinate system. Herein, a predetermined direction in a horizontal plane is set to the X axis direction; a direction perpendicular to the X axis direction is set to the Y axis direction in the horizontal plane; and the direction perpendicular to the X axis direction and the Y axis direction (that is, the vertical direction) is set to the Z axis direction. In the embodiments, the X axis direction is set to the extending direction of the scan lines; the Y axis direction is set to the extending direction of the data lines; and the Z axis direction is set to the direction of observation of an organic EL panel performed by an observer.

First Embodiment

Configuration of Organic EL Apparatus

FIG. 1 is an exploded perspective view illustrating an organic EL apparatus 200 according to a first embodiment of the invention. The organic EL apparatus 200 includes an organic EL panel 100, wiring substrates 3 (wiring substrates 3A, 3B, and 3C) connected to an end portion of the organic EL panel 100, a heat releasing member 5 (a heat releasing sheet 51 and a heat releasing plate 52) disposed on a rear surface (on the side opposite to an observation side) of the organic EL panel 100, and encapsulation structures 4 (a first flexible sheet member 4A and a second flexible sheet member 4B) where the organic EL panel 100, the wiring substrate 3, and the heat releasing member 5 are interposed therebetween to be integrally retained. In addition, in the organic EL apparatus 200, a frame and other additional apparatuses may be provided if necessary, but not shown in FIG. 1.

The organic EL panel 100 includes a first substrate 10 and a second substrate 20 which face each other. In a circumferential portion of a facing area where the first substrate 10 and the second substrate 20 faces, a seal member 30 having a rectangular frame shape as viewed in plane is disposed. The first substrate 10 and the second substrate 20 are attached to each by the seal member 30. A space (cell gap) surround by the first substrate 10, the second substrate 20 and the seal member 30 is encapsulated by a sealing resin.

A display area Ad is provided inside the seal member 30. In the display area Ad, a plurality of scan lines 12 extending in the X axis direction and a plurality of data lines 11 extending in the Y axis direction are disposed in a lattice shape as viewed in plane. At intersections between the scan lines 12 and the data lines 11, sub pixels corresponding to one of red, green, and blue colors are disposed. An organic EL device is formed at each sub pixel to emit one of the red, green, and blue light rays. The sub pixels are disposed in a matrix shape on the first substrate 10, and the display area Ad is formed by a plurality of the sub pixels. Although a pixel switching device (driving device) such as a TFT (thin film transistor) is disposed in each sub pixel, it is omitted in FIG. 1.

Scan line driving circuits 13A and 13B are disposed between the display area Ad and the seal member 30. Each of the scan line driving circuits 13A and 13B is disposed at the corresponding one of two sides of the display area Ad in the X direction. The scan line driving circuits 13A and 13B are formed along the Y direction, so that, with respect to a plurality of the scan lines 12 extending from the display area Ad in the X direction, each scan line 12 is connected to one of the left and right scan line driving circuits 13A and 13B. The scan line driving circuits 13A and 13B together with the pixel switching devices disposed in the display area Ad are integrally formed on the first substrate 10 by using a low temperature polysilicon technology.

An overhang section 33 that overhangs an outer portion of the second substrate 20 is provided to the first substrate 10. A plurality of terminal portions 19A, 19B, and 19C, each of which is constructed with a plurality of external terminals, are disposed in the overhang section 33. Among the terminal portions 19A, 19B, and 19C, the terminal portion 19A which is disposed at the central portion of the overhanging portion 33 includes a plurality of external terminals, each of which is connected to each data line 11; and each of the terminal portions 19B and 19C which are disposed at the left and right sides thereof includes a plurality of external terminals, each of which is connected to one of the pair of scan line driving circuits 13A and 13B.

The wiring substrates 3A, 3B, and 3C is connected to the corresponding terminal portions 19A, 19B, and 19C through the corresponding adhesive agents 7A, 7B, and 7C. On the wiring substrate 3A connected to the terminal portion 19A, a semiconductor chip 6 as a data line driving circuit is mounted. As the adhesive agents 7A, 7B, and 7C, a conducive adhesive agent such as ACF (anisotropic conductive film) is used. However, in the case where the external terminals of the wiring substrates 3A, 3B, and 3C or/and the external terminals of the terminal portions 19A, 19B, and 19C are formed in a protrusion shape and these terminals are directly contacted with each other to be conducted, an insulating adhesive agent such as NCF (non-conductive film) may be used. As a protrusion-shaped terminal, a bump electrode that is formed by covering a surface of a protrusion-shaped resin core with a conductive film as disclosed in JP-A-2006-196570 may be appropriately used.

In addition, in the case where the NCF is used, if a light-transmitting property NCF is used, when alignment between the external terminals of the wiring substrates 3A, 3B, and 3C and the external terminals of the terminal portions 19A, 19B, and 19C is performed, the state where the external terminals of the wiring substrates 3A, 3B, and 3C and the external terminals of the terminal portions 19A, 19B, and 19C overlap as viewed in plane can be directly checked. Therefore, the alignment can be easily performed, and accuracy thereof can also be improved.

The heat releasing member 5 that is formed by sequentially laminating from the organic EL panel 100 a heat releasing sheet 51 including a highly thermal conductive member such as graphite and a heat releasing plate 52 made of a metal such as aluminum is disposed on the rear surface side (the side opposite to the side where the first substrate 10 and the second substrate 20) of the organic EL panel 100.

The heat releasing sheet 51 is configured so that a thermal conductivity in the in-plane direction (XY plane direction) is higher than the thermal conductivity in the thickness direction (Z direction). For example, a graphite sheet that is formed by using highly-aligned graphite where graphite lamination structure is overlappedly laminated in a macroscopic scale is very appropriately used. The heat releasing sheets disclosed in JP-A-58-147087, JP-A-60-012747, JP-A-7-109171, JP Patent No. 3948000, or the like may bed used. Particularly, PGS graphite sheet (trade mark, manufactured by Panasonic Corporation) has a high thermal conductivity which is 2 to 4 times the thermal conductivity of copper (Cu) and 3 to 6 times the thermal conductivity of aluminum (Al) and such a bendability (flexibility) as paper, so that the product may be very appropriately used as the heat releasing sheet 51 in the embodiment.

The heat releasing sheet 51 is configured to be at least disposed at a position where it overlaps the display area Ad. Preferably, the heat releasing sheet 51 is configured to be disposed at a position where peripheral driving circuits such as the scan line driving circuits 13A and 13B are included. According to the configuration, the heat generated from the display area Ad or the peripheral driving circuits can be efficiently released out. In addition, in the embodiment, the heat releasing sheet 51 covers the display area Ad and the formation areas of the scan line driving circuits 13A and 13B, so that the heat releasing sheet 51 is formed to have an area wider than the first substrate 10.

The heat releasing plate 52 is a metal plate having a high thermal conductivity that is made of a metal such as copper or aluminum or an alloy thereof. Although the in-plane direction thermal conductivity thereof is lower than that of a graphite sheet, since it can be produced at low cost, a flexible heat releasing plate can be obtained. In the embodiment, the heat releasing plate 52 is formed by using phosphor bronze to have a small thickness of about 50 μm, so that the heat releasing plate 52 having a flexibility and a shape recovery property (spring property) can be obtained.

The heat releasing plate 52 is configured to be at least disposed at a position where it overlaps the display area Ad and a portion thereof is configured to overhang an outer portion of the overhanging portion 33 of the first substrate 10. Preferably, the heat releasing plate 52 is configured to be disposed at a position where peripheral driving circuits such as the scan line driving circuits 13A and 13B are included. According to the configuration, heat generated from the display area Ad or the peripheral driving circuits can be efficiently released out. In addition, in the embodiment, the heat releasing plate 52 is formed in an area wider than the first substrate 10 so that the heat releasing plate 52 can cover the display area Ad and the formation areas of the scan line driving circuits 13A and 13B.

Figure 2:
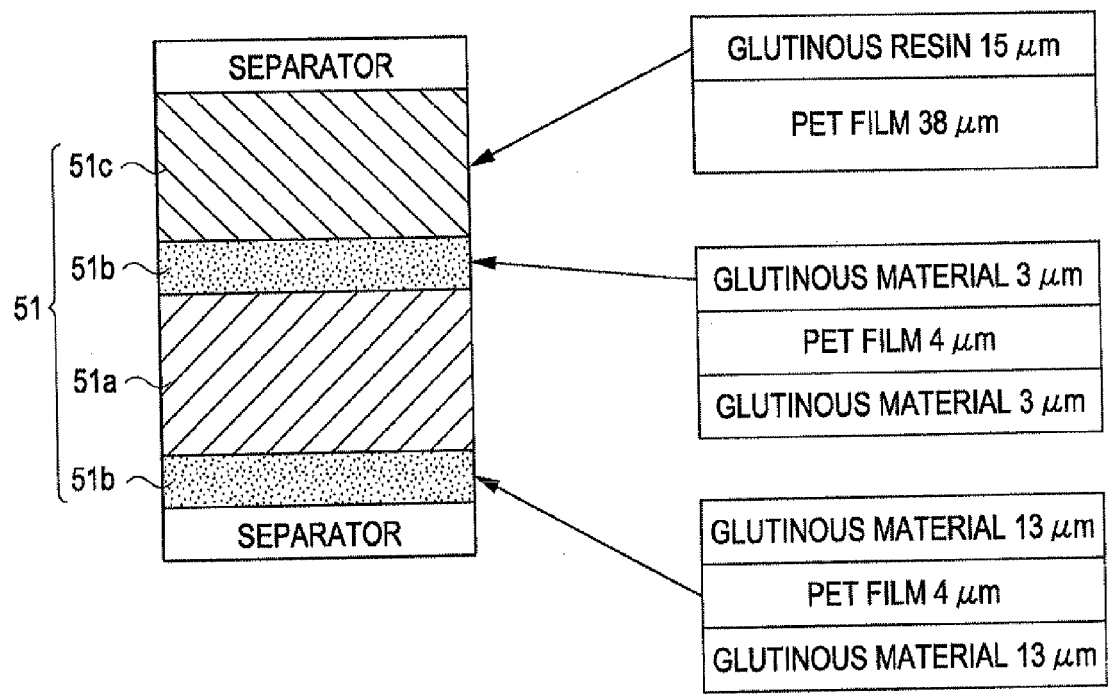
FIG. 2 is a cross-sectional view illustrating a schematic configuration of a heat releasing sheet.

FIG. 2 is a diagrammatic view illustrating an example of a cross-sectional structure of a heat releasing sheet 51. The heat releasing sheet 51 is obtained by sequentially laminating a PET separator, a 30 µm double-sided tape (13 µm glutinous material/4 µm PET film/13 µm glutinous material), a 70 µm graphite sheet, a 10 µm double-sided tape (3 µm glutinous material/4 µm PET film/3 µm glutinous material), a 53 µm tacky sheet (38 µm PET film/15 µm glutinous resin), and a PET separator. At the time of using the heat releasing sheet 51, the one PET separator is detached, and the heat releasing sheet 15 is closely attached through the glutinous material to the organic EL panel. The other PET separator is detached, and the heat releasing sheet 15 is closely attached through the glutinous material to heat releasing plate 52.

Returning to FIG. 1, a flexible encapsulation structure 4 that is closely attached to the organic EL panel 100 to encapsulate the organic EL panel 100 therein is provided to the outer surface sides of the organic EL panel 100. The encapsulation structure 4 includes a pair of a first flexible sheet member 4A and a second flexible sheet member 4B that are disposed to interpose the organic EL panel 100, the wiring substrates 3A, 3B, and 3C, and the heat releasing member 5 therebetween. At least the first flexible sheet member 4A, which is disposed at the observation side, of the pair of first flexible sheet member 4A and the second flexible sheet member 4B is constructed with a transparent material.

The first flexible sheet member 4A and the second flexible sheet member 4B are constructed with flexible film sheets 41A and 41B where adhesive agent layers 42A and 42B are formed on the one side thereof. As a resin for constituting the adhesive agent layers 42A and 42B, various resins such as a thermoplastic resin, a thermosetting resin, or an ultraviolet curing resin may be used. In the embodiment, the thermoplastic resin is used. A film sheet having an adhesive agent layer made of a thermoplastic resin is generally called a laminating film.

Each of the first flexible sheet member 4A and second flexible sheet member 4B is formed to have an area wider than the organic EL panel 100. The first flexible sheet member 4A and second flexible sheet member 4B are adhered to each other by adhesive agent layers 42A and 42B at the circumferential portion that is the outer portion of the organic EL panel 100, in a state where the end portions (the portion where the semiconductor chip 6 is mounted) of the side opposite to the side connected to the terminal portions 19A, 19B and 19C of the wiring substrates 3A, 3B, and 3C and the portion that overhangs the outer portion of the overhanging portion 33 of the heat releasing member 5 are exposed.

In addition, the front and rear surfaces of the wiring substrates 3A, 3B, and 3C located at the circumferential portions of the organic EL panel 100 and the front and rear surfaces of the heat releasing member 5, that is, the surfaces that face the first flexible sheet member 4A and the second flexible sheet member 4B of each member, are provided with adhesive agent layers 5A, 5B, 8A, 8B, 8C, 9A, 9B, and 9C. Next, the first flexible sheet member 4A and the wiring substrates 3A, 3B, and 3C are attached to each other by using the adhesive agent layer 8A, 8B, and 8C provided to the wiring substrates 3A, 3B, and 3C and the adhesive agent layer 42A provided to the first flexible sheet member 4A. The first flexible sheet member 4A and the heat releasing member 5 are attached to each other by using the adhesive agent layer 5A provided to the heat releasing member 5 and the adhesive agent layer 42A provided to the first flexible sheet member 4A. The second flexible sheet member 4B and the heat releasing member 5 are attached to each other by using the adhesive agent layer 5B provided to the heat releasing member 5 and the adhesive agent layer 42B provided to the second flexible sheet member 4B. The wiring substrates 3A, 3B, and 3C and the heat releasing member 5 are attached to each other by using the adhesive agent layer 9A, 9B, 9C provided to the wiring substrates 3A, 3B, and 3C and the adhesive agent layer 5A provided to the heat releasing member 5. For the adhesive agent layers 5A, 5B, 8A, 8B, 8C, 9A, 9B, and 9C, various resins such as a thermoplastic resin, a thermosetting resin, or an ultraviolet curing resin may be used. In the embodiment, the thermoplastic resin or the thermosetting resin is used.

Figure 3A:
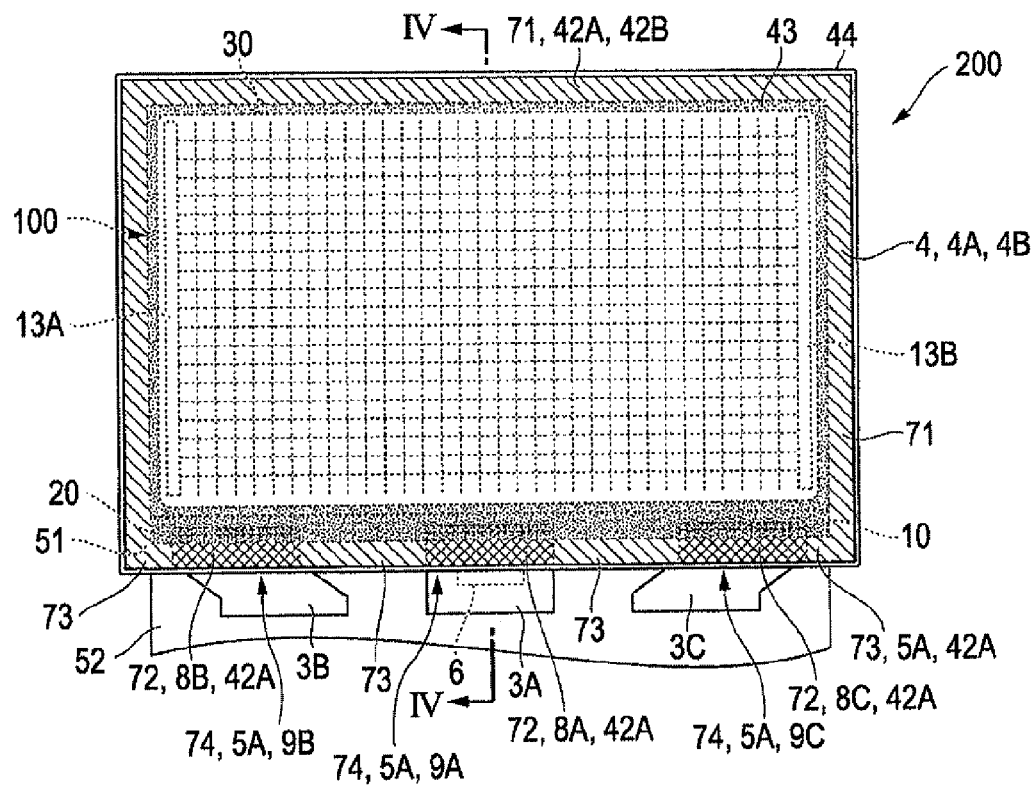
FIGS. 3A and 3B are plan views illustrating an organic EL apparatus.
Figure 3B:
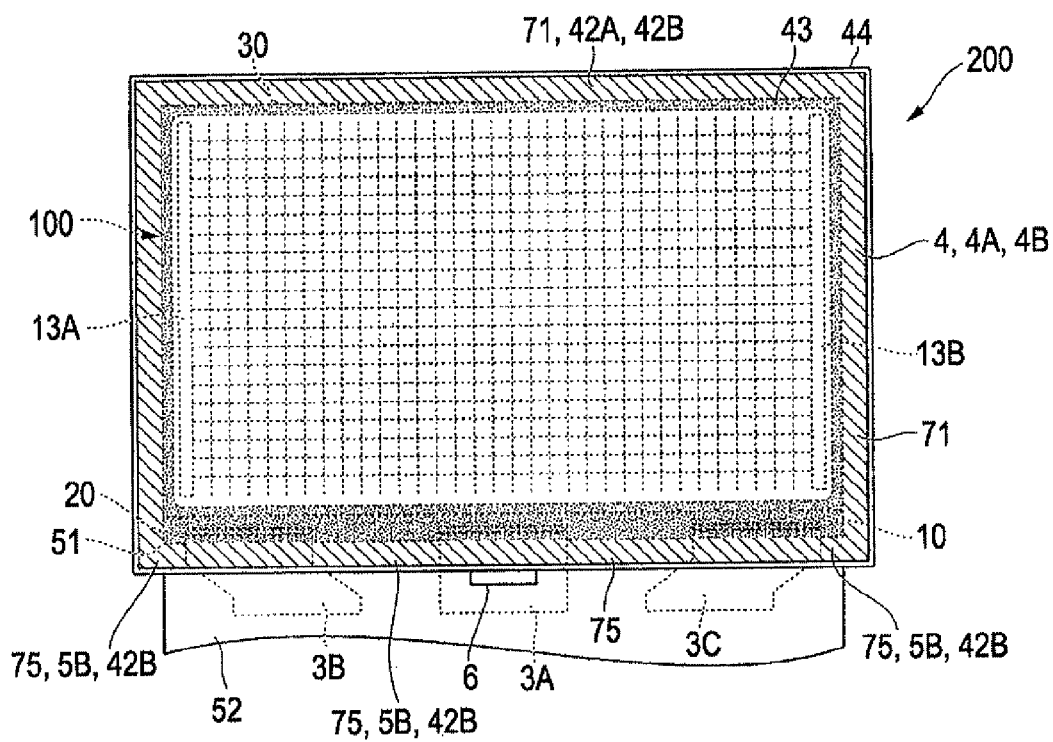

FIG. 3A is a plan view illustrating the organic EL apparatus 200 as viewed from the side of the first flexible sheet member 4A. FIG. 3B is a plan view illustrating the organic EL apparatus 200 as viewed from the side of the second flexible sheet member 4B.

As shown in FIG. 3A, in the circumferential portions of the organic EL panel 100 as viewed from the side of the first flexible sheet member 4A, the adhesion portion 71 between the first flexible sheet member 4A (the adhesive agent layer 42A) and the second flexible sheet member 4B (the adhesive agent layer 42B), the adhesion portions 72 between the first flexible sheet member 4A and the wiring substrates 3A, 3B, and 3C (the adhesive agent layer 8A, 8B, 8C), and the adhesion portions 73 between the first flexible sheet member 4A and the heat releasing member 5(adhesive agent layer 5A) and between the second flexible sheet member 4B and the heat releasing member 5(adhesive agent layer 5A) are continuously formed without interstice along the four sides of the outer circumferential portions of the organic EL panel 100. In addition, although concealed by the rear surfaces of the wiring substrates 3A, 3B, and 3C, the adhesion portions 74 between the wiring substrates 3A, 3B, and 3C (the adhesive agent layer 9A, 9B, and 9C) and the heat releasing member 5 (the adhesive agent layer 5A) are disposed at the positions where the adhesion portions 74 overlap the adhesion portions 72. The adhesion portions 71, 73, and 74 are continuously formed without interstice along the four sides of the outer circumferential portions of the organic EL panel 100.

In addition, as shown in FIG. 3B, in the circumferential portions of the organic EL panel 100 as viewed from the side of the second flexible sheet member 4B, the adhesion portion 75 between the second flexible sheet member 4B (the adhesive agent layer 42B) and the heat releasing member 5 (the adhesive agent layer 5B) is disposed. The adhesion portions 71 and 75 are continuously formed without interstice along the four sides of the outer circumferential portions of the organic EL panel 100.

In addition, the space surrounded by the adhesion portions 71, 72, 73, 74, and 75 and the seal member 30 is encapsulated by a first sealing resin 43 as a sealing resin layer, so that the space is sealed.

Therefore, according to the configuration, the organic EL panel 100 is hermetically encapsulated inside the pair of first flexible sheet member 4A and the second flexible sheet member 4B, that is, inside the encapsulation structure 4.

In addition, in FIG. 3, the heat releasing sheet 51 is formed to have a smaller area than the first flexible sheet member 4A and the second flexible sheet member 4B, and only the heat releasing plate 52 is configured to be exposed to the outer sides of the flexible sheet members 4A and 4B. However, the configuration of the heat releasing member 5 is not limited thereto, but the heat releasing sheet 51 and the heat releasing plate 52 ma be exposed to the outer sides of the first flexible sheet member 4A and the second flexible sheet member 4B.

FIG. 4 is a cross-sectional view taken along line IV-IV of FIG. 3. The first flexible sheet member 4A and the second flexible sheet member 4B are disposed to be closely attached to the main surface of the second substrate 20 of the organic EL panel 100 and to the main surface of the heat releasing member 5 (more specifically, the heat releasing plate 52), respectively. The first flexible sheet member 4A and the second flexible sheet member 4B are bent at the end portions of the organic EL panel 100 and the heat releasing member 5 so as to be closely attached to each other directly or through the wiring substrate 3A and/or the heat releasing member 5 (more specifically, the heat releasing plate 52). The closely attached portion between the first flexible sheet member 4A and the second flexible sheet member 4B is attached by using the adhesive agent layer 42A and the adhesive agent layer 42B. The closely attached portion between the first flexible sheet member 4A and the wiring substrate 3A is attached by using the adhesive agent layer 42A and the adhesive agent layer 8A. The closely attached portion between the second flexible sheet member 4B and the heat releasing member 5 is attached by using the adhesive agent layer 42B and the adhesive agent layer 5B. The closely attached portion between the wiring substrate 3A and the heat releasing member 5 is attached by using the adhesive agent layer 9A and the adhesive agent layer 5A.

A step difference between the organic EL panel 100 and the wiring substrate 3A, a step difference between the organic EL panel 100 and the heat releasing member 5, and an interstice $4H_1$ caused by the shapes of the end portion is formed in the end portion of the organic EL panel 100. The interstice $4H_1$ is provided with a first sealing resin 43. The first sealing resin 43 is disposed to cover the end surface of the first substrate 10, the end surface of the second substrate 20, and the end surface of the seal member 30 so as to surround the entire outer circumferential portions of the first substrate 10 and the second substrate 20.

In addition, an interstice $4H_2$ caused by a step difference between the heat releasing member 5 and the organic EL panel 100 is formed between the wiring substrate 3A and the heat releasing member 5. A fourth sealing resin 45 is provided to the interstice $4H_2$. The fourth sealing resin 45 covers the end surface of the first substrate 10, so that it is provided without interstice in the entire width direction (the X direction) of the wiring substrate 3A.

In the outer circumferential portions of the organic EL panel 100, the first sealing resin 43 and the fourth sealing resin 45 are disposed to bury the interstices $4H_1$ and $4H_2$. Accordingly, the end portion of the organic EL panel 100 is sealed by the first flexible sheet member 4A, the second flexible sheet member 4B, the wiring substrate 3A, and the sealing resins 43 and 45.

In addition, in the end surfaces of the first flexible sheet member 4A and the second flexible sheet member 4B, a second sealing resin 44 is disposed to cover the boundary portion between the sheet members. The second sealing resin 44 is disposed to cover the boundary portion between the first flexible sheet member 4A and the second flexible sheet member 4B, and the boundary portions between the first flexible sheet member 4A and the second flexible sheet member 4B and the wiring substrate 3A so as to surround the entire outer circumferential portion of the encapsulation structure 4. Therefore, all of the first sealing resin 43, the fourth sealing resin 45, the first flexible sheet member 4A, the second flexible sheet member 4B, and the wiring substrate 3A are contributed to the sealing. As a result, high sealing performance can be implemented.

For example, when the pair of first flexible sheet member 4A and the second flexible sheet member 4B are heated and pressed, a thickness of the adhesive agent layers 42A and 42B are set so that the sealing resins 43 and 44 are formed by softening the adhesive agent layers 42A and 42B, or actively, the interstice 4H or the end surfaces of the first flexible sheet member 4A and the second flexible sheet member 4B may be filled with the sealing resin. For example, when the organic EL panel 100 is interposed by the first flexible sheet member 4A and the second flexible sheet member 4B, a sealing resin is disposed in the end portion of the organic EL panel 100, and the sealing resin is pressed and spread by the pair of first flexible sheet member 4A and the second flexible sheet member 4B, so that the sealing resin can be disposed in the end portion of the organic EL panel 100 and in the boundary portion between the first flexible sheet member 4A and the second flexible sheet member 4B without interstice.

Configuration of Organic EL Panel

Figure 5:
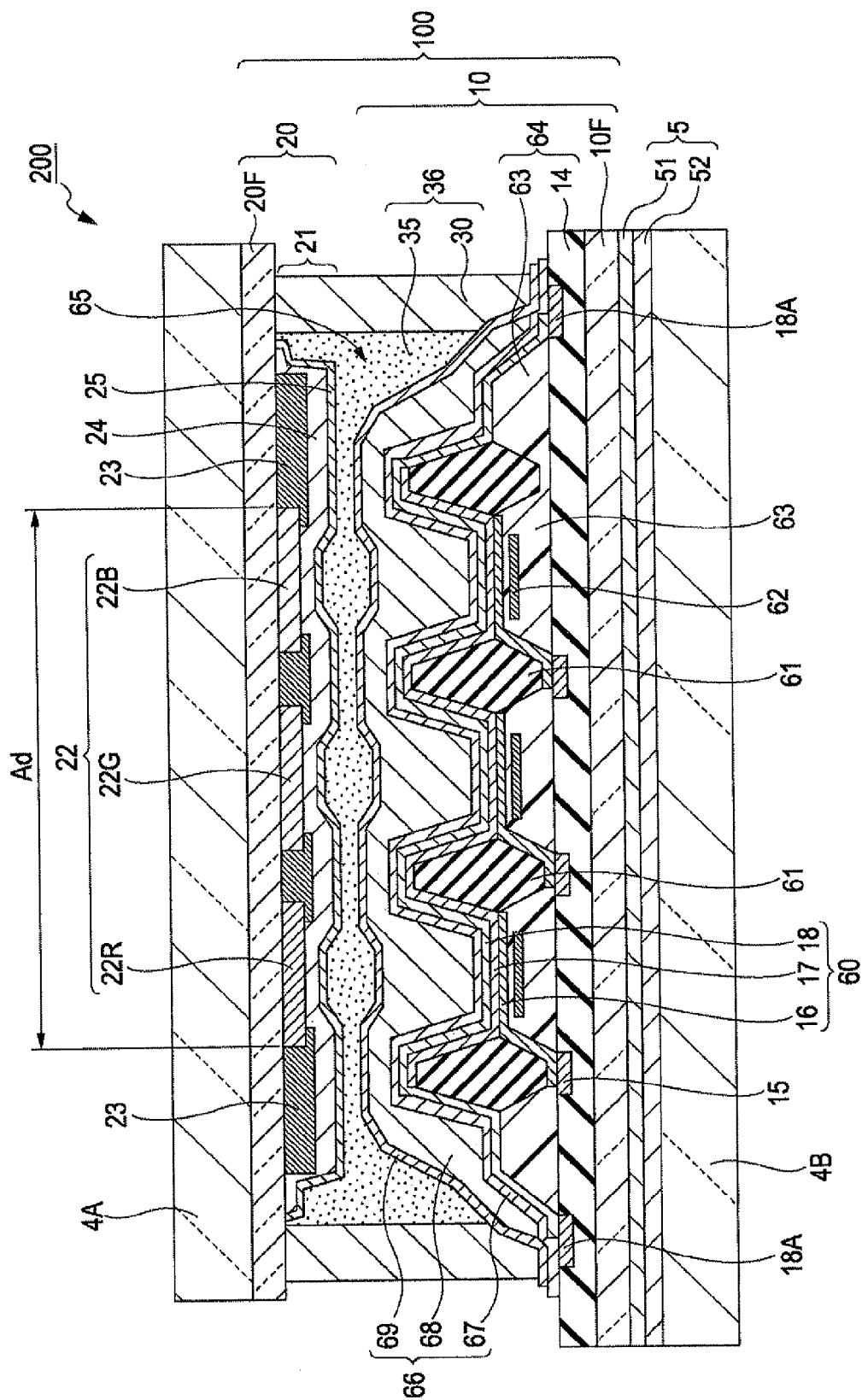
FIG. 5 is a cross-sectional view illustrating a detailed configuration of an organic EL panel of an organic EL apparatus.

FIG. 5 is a cross-sectional view illustrating a detailed configuration of the organic EL apparatus 200. The organic EL panel 100 is formed by facing the first substrate 10 and the second substrate 20 and adhering the first substrate 10 and the second substrate 20 through the adhesion layer 36 to integrate the first substrate 10 and the second substrate 20.

A plurality of organic EL devices 60 are formed on the first substrate 10. The organic EL device 60 has a configuration where an organic light-emitting layer 17 which emits, for example, white light is interposed between a pixel electrode 16 as an anode (first electrode) and a common electrode 18 as a cathode (second electrode). A thin film sealing layer 66 is formed on the first substrate 10 so as to cover a plurality of the organic EL devices 60.

The organic EL devices 60 are arrayed regularly in a matrix shape on the first substrate 10, so that the display area Ad is configured. The outside area of the display area Ad is a non-display area. In addition, the organic EL devices 60 may be three types of organic EL devices, for example, an organic EL device emitting red light, an organic EL device emitting green light, and an organic EL device emitting blue light that are formed by using three types of R (red), G (green), and B (blue) organic materials.

The first substrate 10 includes a first base material layer 10F. As the first base material layer 10F, an insulating substrate such as a glass substrate or a plastic substrate or a conductive substrate such as a stainless plate or an aluminum plate may be used. A thickness of the first base material layer 10F is configured to be small, so that a flexibility is provided thereto.

In the embodiment, since peripheral driving circuit embedded type organic EL panel is manufactured by using a low temperature poly silicon technology, a glass substrate having high thermal resistance is used as the first base material layer 10F. In this case, a thickness of the first base material layer 10F is equal to or larger than 10 μm and equal to or smaller than 100 μm, preferably, equal to or larger than 20 μm and equal to or smaller than 50 μm, more preferably, equal to or larger than 20 μm and equal to or smaller than 40 μm.

For example, if the thickness of the first base material layer 10F is smaller than 20 μm, defects called dimples or pits are increased, so that light emission defects are noticeably increased.

In addition, if the thickness is larger than 50 μm, a sufficient flexibility cannot be provided to the first base material layer 10F, and various resin layers formed on the first base material layer 10F such as an organic buffer layer 68 covering the organic EL devices 60 or a third sealing resin 35 filling the gap between the first base material layer 10F and the second substrate 20 are expanded by heat at the time of light emission, so that the pixel switching devices 15 driving the organic EL devices 60 may be pressed.

In the case where a glass substrate having a thickness which is smaller than 50 μm is used, the pressure exerted to the pixel switching devices 15 can be reduced due to the flexible glass substrate. However, if the flexibility of the glass substrate is decreased, this effect is difficult to obtain, so that the driving devices may be broken, or the electrical characteristics of the driving devices may deteriorate. Particularly, since the organic EL panel 100 covered with the first flexible sheet member 4A and the second flexible sheet member 4B may be easily heated at the time of light emission. In comparison with a general organic EL panel, special treatment needs to be made on the organic EL panel 100.

By taking into consideration the aforementioned properties in the case of using the first flexible sheet member 4A and the second flexible sheet member 4B, the inventor examines a relationship between the thickness of the glass substrate and the number of occurrence of the light emission defect. Therefore, it is found out that, in the case where the thickness of the glass substrate is equal to or larger than 20 μm and equal to or smaller than 50 μm, specially excellent mechanical strength and electrical characteristics can be obtained.

In other words, in the case where the thickness of the glass substrate is smaller than 20 μm, light emission defects caused by dimples or the like are increased. In the case where the thickness is larger than 50 μm, the pixel switching devices 15 such as TFTs are broken or the electrical characteristics thereof deteriorate. Therefore, in the case where the thickness is equal to or larger than 20 μm and equal to or smaller than 50 μm, the number of occurrence of light emission defect is equal to or smaller than one, so that the light emission characteristic where almost no defect exists can be obtained. In addition, in the above thickness range, cracks are hardly generated by the pressure at the time of interposing the organic EL panel 100 between the pair of first flexible sheet member 4A and the second flexible sheet member 4B, so that an organic EL apparatus 200 can be manufactured at high yield.

In this manner, similarly to the case where the first flexible sheet member 4A and the second flexible sheet member 4B are used, even in the organic EL apparatus 200 where thermal influence at the time of light emission is noticeably increased, excellent mechanical strength and excellent electrical characteristics can be obtained by using the glass substrate having a thickness which is equal to or larger than 20 μm and equal to or smaller than 50 μm.

A circuit layer 64 including an inorganic insulating layer 14 and a resin planarizing layer 63 is formed on the first base material layer 10F. The inorganic insulating layer 14 is constructed with, for example, a silicon compound such as silicon dioxide ($SiO_2$) or silicon nitride (SiN). The pixel switching devices 15, which is constructed with a plurality of thin film transistors (TFTs) and are in one-to-one correspondence with a plurality of the organic EL devices 60, and the second electrode connection wire lines 18A, which are connected to the common electrode 18 of the organic EL devices 60, are formed on the inorganic insulating layer 14. In addition, the scan lines 12, the data lines 11, and the scan line driving circuits 13A and 13B, or the power supply lines for supplying current to the pixel electrode 16 shown in FIG. 1 are formed in the layer.

A resin planarizing layer 63 where a metal reflecting layer 62 made of an aluminum (Al) alloy or the like is embedded is formed on the inorganic insulating layer 14. The resin planarizing layer 63 is constructed with, for example, an insulating resin material such as a photosensitive acryl resin or a cyclic olefin resin.

A pixel electrode 16 of the organic EL device 60 is formed in the area where it overlaps the metal reflecting layer 62 on the resin planarizing layer 63 as viewed in plane. The pixel electrode 16 is constructed with a metal oxide having a high hole injection property such as ITO (indium tin oxide). The pixel electrode 16 is connected to the pixel switching device 15 on the first base material layer 10F through a contact hole (not shown) that passes through the resin planarizing layer 63 and the inorganic insulating layer 14.

In order to partition the organic EL devices 60, insulating partition wall layers 61, which is made of, for example, an acryl resin, is formed on the resin planarizing layer 63 (on the circuit layer 64) in a lattice shape as viewed in plane. Due to the partition wall layer 61, a plurality of the pixel electrodes 16 are partitioned in the exposed state.

In addition, an organic light-emitting layer 17 is formed so as to cover the partition wall layer 61 and the surface of the pixel electrode 16.

The organic light-emitting layer 17 includes a light-emitting layer that is excited by recombination of holes and electrons injected by an electric field to emit light. The organic light-emitting layer 17 may be constructed as a multi-layered structure including layers as well as the light-emitting layer. As the layers other than the light-emitting layer, there are layers for the recombination, such as a hole injection layer for facilitating hole injection, a hole transport layer for facilitating transporting the injected holes to the light-emitting layer, an electron injection layer for facilitating electron injection, and an electron transport layer for facilitating transporting the injected electrons to the light-emitting layer.

As the light-emitting layer of the organic light-emitting layer 17, a low-molecular-weight organic EL material or a high-molecular-weight organic EL material may be used.

The low-molecular-weight organic EL material is an organic compound having a relatively low molecular weight among organic compounds that are excited by the recombination of the holes and the electrons to emit light. In addition, the high-molecular-weight organic EL material is an organic compound having a relatively high molecular weight among the organic compounds that are excited by the recombination of the holes and the electrons to emit light.

The low-molecular-weight organic EL material or the high-molecular-weight organic EL material are made of a substance according to color light (white light) emitted by the organic EL device 60. The material of the layer contributing the recombination in the light-emitting layer is a substance according to a material of a layer contacting with the contributing layer.

The common electrode 18 is formed on the organic light-emitting layer 17 to cover the organic light-emitting layer 17 along the unevenness shape thereof. The common electrode 18 includes, for example, an electron injection buffer layer for facilitating the electron injection to the organic light-emitting layer 17 and a conductive layer having a low electric resistance, which is formed on the electron injection buffer layer.

The electron injection buffer layer is constructed with, for example, LiF (lithium fluoride), Ca (calcium), or MgAg (magnesium-silver alloy). In addition, the conductive layer is a conductive layer having lower electrical resistance, which is made of, for example, ITO or a metal such as Al. The conductive layer may not be formed on the entire surface of the display area Ad. For example, a first conductive layer having a high transparence which is made of Mg or Ag may be formed on the entire surface of the display area Ad, and a second conductive layer having a low resistance and a low transparence which is made of Al or the like may be formed as an auxiliary electrode in a stripe shape on a portion where it overlaps the partition wall layer 61.

The common electrode 18 is connected to the second electrode connection wire lines 18A which are constructed with an inorganic conductive layer made of Al or the like which is formed on the circumferential portion (non-display area) of the display area Ad. The second electrode connection wire lines 18A are connected to terminal portions 19B and 19C (refer to FIG. 1) through leading wire lines (not shown). The second electrode connection wire lines 18A are continuously formed along the three sides of the rectangular-shaped display area Ad (at the sides where the terminal portion 19A shown in FIG. 1 is not formed).

The common electrode 18 is configured to cover the entire surface of the display area Ad and to be connected to the second electrode connection wire lines 18A surrounding the display area Ad. In addition, the common electrode 18 is formed to cover the entire portion of a member surrounding the outermost portion (hereinafter, referred to as a surrounding member) that is exposed on the circuit layer 64, in a state where the partition wall layer 61, particularly, the portion forming the outermost circumferential portion, that is, the circumferential side portion of the partition wall layer 61 of the outermost circumferential position of the organic light-emitting layer 17 is covered. Therefore, the common electrode 18 together with the surrounding member is configured to seal the outer sides of a plurality of the organic EL devices 60 that are disposed in the display area Ad. Particularly, since the organic EL devices 60 are formed on the inorganic insulating layer 14, and since the outer circumferential portion of the common electrode 18 is connected to the inorganic insulating layer 14, all of the bottom surfaces, the top surfaces, and the side surfaces of a plurality of the organic EL devices 60 are covered with the inorganic layers, so that high sealing performance is implemented.

A thin film sealing layer 66 which covers the inorganic insulating layer 14, the resin planarizing layer 63, and the common electrode 18 of the organic EL devices 60 is formed on the common electrode 18. The thin film sealing layer 66 includes an electrode protecting layer 67 which covers the entire portion of the common electrode 18 that is exposed on the circuit layer 64 and which is connected to the inorganic insulating layer 14, an organic buffer layer (planarizing resin layer) 68 which covers a portion of the electrode protecting layer 67 that is formed at least in the display area Ad, and an inorganic gas barrier layer 69 which covers the entire portion of the organic buffer layer 68 that is exposed on the circuit layer 64 and which is connected to the electrode protecting layer 67 or the inorganic insulating layer 14.

The electrode protecting layer 67 is constructed with an inorganic material, for example, a silicon compound such as a silicon oxide nitride (SiON).

The organic buffer layer 68 is formed to bury an unevenness shape caused by the partition wall layers 61 and the opening portions 61H, so that the unevenness on the circuit layer 64 is planarized. In addition, the organic buffer layer 68 is closely attached to the inorganic gas barrier layer 69 and has a function of buffering mechanical impact. As a material for the organic buffer layer 68, a resin having a high transparence and a low moisture permeability such as an epoxy compound may be used.

The inorganic gas barrier layer 69 is constructed with an inorganic material, for example, SiON or the like, particularly, by taking into consideration a light-transmitting property, a gas barrier, and a water resistance.

The thin film sealing layer 66 together with the common electrode 18 functions as a sealing member for preventing external moisture or oxygen from infiltrating into the organic EL devices. The inorganic gas barrier layer 69 in the thin film sealing layer 66 is formed on the surface planarized by the organic buffer layer 68. Therefore, in comparison with the electrode protecting layer 67, step coverage is good, and high sealing function can be obtained. Particularly, since the mechanical impact can be alleviated by the organic buffer layer 68, cracks or the like cannot be easily generated, and excellent sealing performance can be maintained for a long time.

In addition, since the inorganic gas barrier layer 69 is in contact with the inorganic insulating layer 14 directly or through the electrode protecting layer 67 which is an inorganic layer, the problem of infiltration of moisture or oxygen from the interface between the inorganic gas barrier layer 69 and the inorganic insulating layer 14 can be reduced. Therefore, all the common electrodes 18 formed to be in contact with the same inorganic insulating layer 14 are contributed to the sealing, so that very high sealing performance can be implemented.

The second substrate 20 is disposed to face the surface where the thin film sealing layer 66 of the first substrate 10 is formed. The second substrate 20 is connected through the adhesion layer 36 to the thin film sealing layer 66 of the first substrate 10.

The second substrate 20 includes a second base material layer 20F which is constructed with a light-transmitting material such as a transparent glass substrate or a transparent plastic substrate. In the embodiment, in order to improve the sealing performance through the second substrate 20, a glass substrate which has a lower moisture permeability than the plastic substrate is used, and the glass substrate is allowed to be thinned, so that the flexibility is provided thereto. In this case, a thickness of the second base material layer 20F is equal to or larger than 10 µm and equal to or smaller than 100 µm, preferably, equal to or larger than 20 µm and equal to or smaller than 50 µm, more preferably, equal to or larger than 20 µm and equal to or smaller than 40 µm.

A color filter layer 21 is formed on the surface where it faces the first substrate 10 of the second base material layer 20F. The color filter layer 21 has a configuration where red color layers 22R, green color layers 22G, and blue color layers 22B corresponding to red sub pixels, green sub pixels, and blue sub pixels are arrayed regularly in a matrix shape. In addition, the color filter layer 21 includes black matrix layers (light-shielding layers) 23 at positions surrounding the color layers 22R, 22G, and 22B, more specifically, the areas corresponding to the partition wall layers 61. As a material for the black matrix layer 23, for example, Cr (chromium) or the like may be used.

The color layers 22R, 22G and 22B are disposed to face and to overlap the white organic light-emitting layers 17 formed on the pixel electrodes 16 as viewed in plane. Therefore, light emitted from a plurality of the organic light-emitting layers 17 transmits the corresponding color layers 22R, 22G and 22B, so that color light such as red light, green light, and blue light is emitted to the observer's side.

In addition, the color filter layer 21 is configured to include an overcoat layer 24 which covers the color layers 22R, 22G and 22B and the black matrix layer 23 and an inorganic gas barrier layer 25 which covers the overcoat layer 24.

The overcoat layer 24 is disposed to extend from the inner side of the display area Ad to the vicinity of the formation area of the seal member 30 around the non-display area. The overcoat layer 24 is constructed with, for example, a resin material such as an acryl or polyimide. The inorganic gas barrier layer 25 is constructed with an inorganic material, for example, a silicon compound such as a silicon oxide nitride (SiON).

The adhesion layer 36 is configured to include the seal member 30 which is formed in a frame shape along the outer circumferential portion of the second substrate 20 and a third sealing resin 35 which is disposed to fill the area within the range of the seal member 30 without interstice.

The third sealing resin 35 denotes a portion which is disposed between the first substrate 10 and the second substrate 20 and which is a portion of the thin film sealing layer 66 corresponding to at least the display area Ad. As a material for the third sealing resin 35, a low elastic resin that is obtained by adding a curing agent such as isocyanate to, for example, a urethane series resin or an acryl series resin may be used.

The seal member 30 is formed in the non-display area between the first substrate 10 and the second substrate 20 so as to surround the third sealing resin 35. As a material for the seal member 30, a high adhesive agent that is obtained by adding a curing agent such as an acid anhydride and a promoter such as a silan coupling agent to a material having a low moisture permeability, for example, an epoxy series resin may be used.

The heat releasing sheet 51 and the heat releasing plate 52 are disposed to be closely attached on the outer surface of the first base material layer 10F sequentially from the side of the first base material layer 10F. In addition, the second flexible sheet member 4B and the first flexible sheet member 4A are closely attached on the outer surfaces of the heat releasing plate 52 and the second base material layer 20F.

Method of Manufacturing Organic EL Apparatus

FIGS. 6 to 9 are views for explaining a method of manufacturing the organic EL apparatus 200. In FIGS. 6 to 9, in the method of manufacturing the organic EL apparatus 200, a process of integrating the organic EL panel 100, the wiring substrates 3A, 3B, and 3C, and the heat releasing member 5 with the first flexible sheet member 4A and the second flexible sheet member 4S is mainly described. In addition, the description hereinafter is made with reference to FIG. 1.

Figure 6:
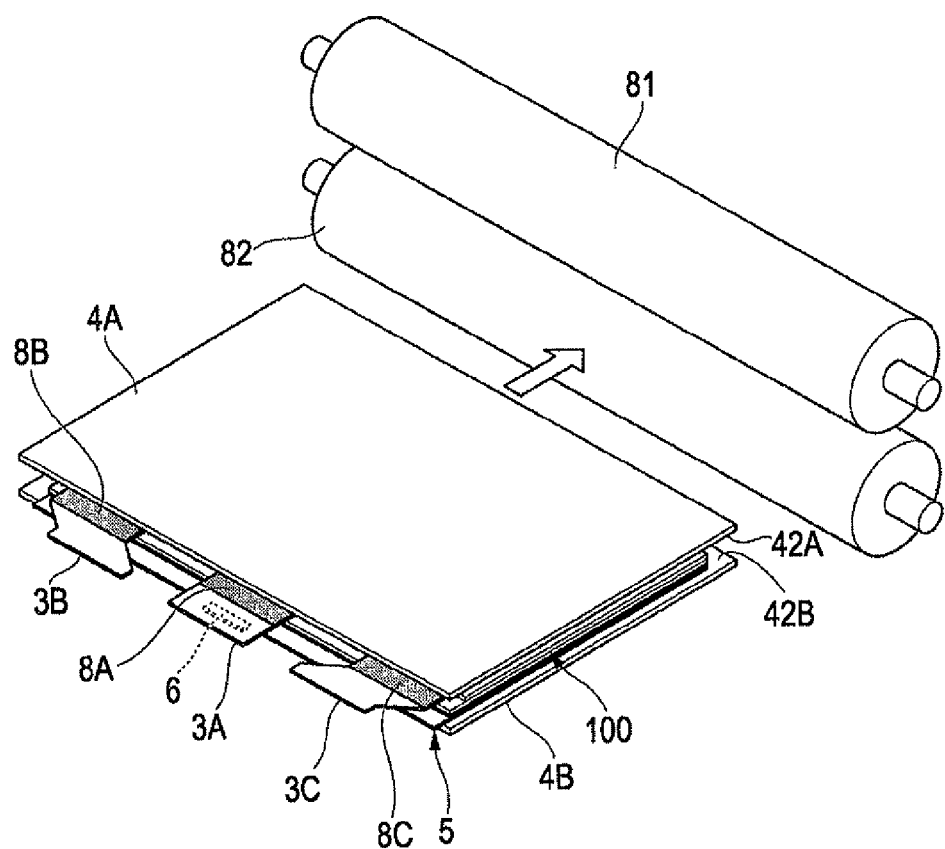
FIG. 6 is a view for explaining a method of manufacturing an organic EL apparatus.

First, as shown in FIG. 6, the wiring substrates 3A, 3B, and 3C are connected to the end portion of the organic EL panel 100 to which a flexibility is provided by thinning the glass substrate, and the lamination structure of the organic EL panel 100, the wiring substrates 3A, 3B, and 3C, and the heat releasing member 5 is disposed between the first flexible sheet member 4A and second flexible sheet member 4B. Well-known methods disclosed in JP-A-2008-58489, JP Patent No. 4,131,639, or the like may be used as the method of manufacturing the organic EL panel 100 using a thin glass substrate.

Figure 7:
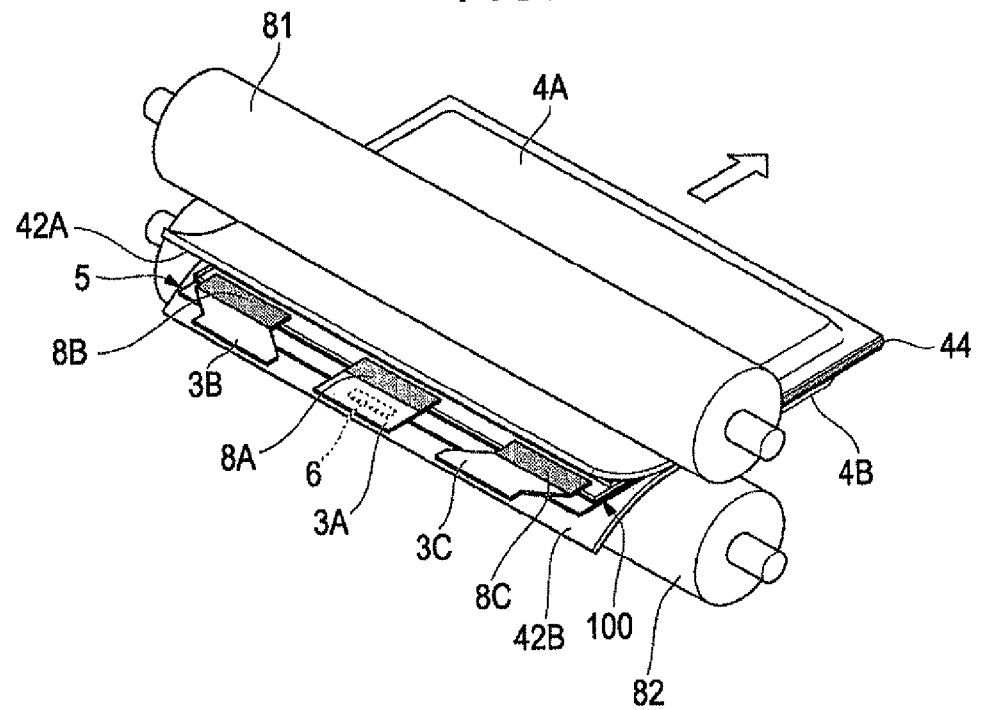
FIG. 7 is a view for explaining a method of manufacturing an organic EL apparatus.

Next, as shown in FIG. 7, the lamination structure is inserted between a pair of pressing rollers 81 and 82 from the positive-Y-directional side (the end portion of the side opposite to the side connected to the wiring substrates 3A, 3B, and 3C of the organic EL panel 100 and the end portion of the side opposite to the side where the heat releasing member 5 is exposed to the outer sides of the first flexible sheet member 4A and the second flexible sheet member 4B). Next, the lamination structure is heated and pressed by the pair of pressing rollers 81 and 82 on the surfaces of the first flexible sheet member 4A and the second flexible sheet member 4B, which face each other, through the adhesive agent layers 42A and 42B, the adhesive agent layers 8A, 8B, 8C, 9A, 9B, and 9C, and the adhesive agent layers 5A and 5B in a state where the portions of the wiring substrates 3A, 3B, and 3C (the end portions of the side opposite to the side connected to the terminal portions 19A, 19B, and 19C) and the portions of the heat releasing member 5 (the portions that overhang the outer portion of the overhanging portion 33) are exposed to the outer sides of the first flexible sheet member 4A and the second flexible sheet member 4B.

Next, the adhesive agent layers 42A and 42B and the adhesive agent layers 8A, 8B, 8C, 9A, 9B, and 9C are pressed and spread with respect to the interstices $4H_1$ (refer to FIG. 4) between the first flexible sheet member 4A, the second flexible sheet member 4B, the organic EL panel 100, and the wiring substrates 3A, 3B, and 3C to seal the interstices $4H_1$. The portions where the first flexible sheet member 4A and second flexible sheet member 4B face each other, the portions where the first flexible sheet member 4A and the wiring substrates 3A, 3B, and 3C face each other, the portion where the second flexible sheet member 4B and the heat releasing member 5 face other, and the portions where the wiring substrates 3A, 3B, and 3C and the heat releasing member 5 face each other are adhered to each other through the circumferential portions of the organic EL panel 100 by using the adhesive agent layers 42A and 42B, the adhesive agent layers 8A, 8B, 8C, 9A, 9B, and 9C, and the adhesive agent layers 5A and 5B, so that the organic EL panel 100 is encapsulated inside the first flexible sheet member 4A and the second flexible sheet member 4B.

In addition, in the process, the portions of the adhesive agent layers 42A and 42B, and the adhesive agent layers 8A, 8B, 8C, 9A, 9B, and 9C are extracted to the outer sides of the first flexible sheet member 4A and the second flexible sheet member 4B, so that the second sealing resin 44 that seals the boundary portion between the first flexible sheet member 4A and the second flexible sheet member 4B is formed in the end surfaces of the first flexible sheet member 4A and the second flexible sheet member 4B.

Figure 8:
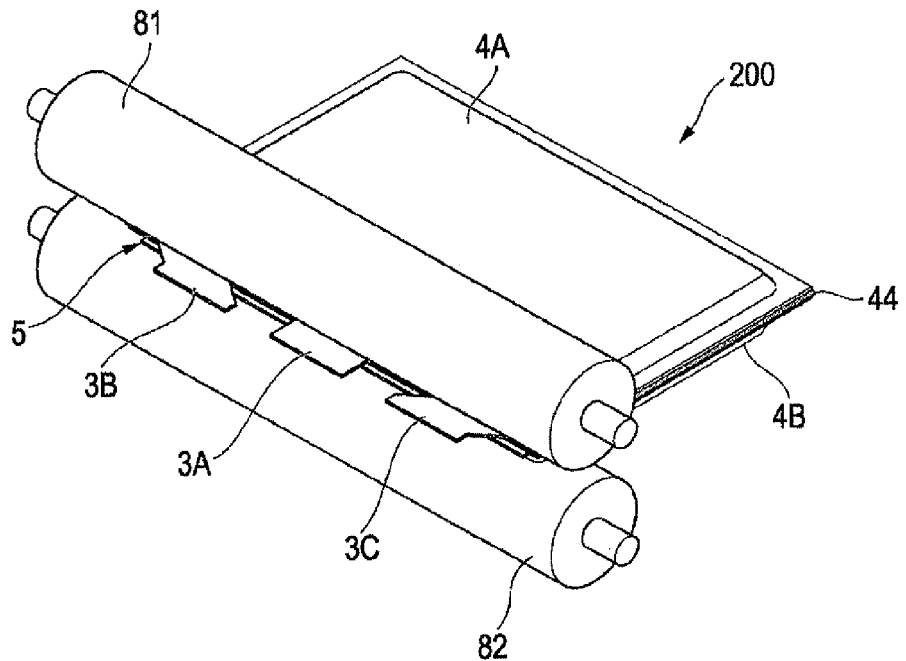
FIG. 8 is a view for explaining a method of manufacturing an organic EL apparatus.

FIG. 8 is a view illustrating a state where the first flexible sheet member 4A and the second flexible sheet member 4B are allowed to proceed in the transport direction of the pressing rollers 81 and 82 so that the adhesion is performed up to the end portions of the wiring substrates 3A, 3B, and 3C of the first flexible sheet member 4A and the second flexible sheet member 4B. In this state, the circumferential portions of the organic EL panel 100 is hermetically encapsulated inside the pair of first flexible sheet member 4A and the second flexible sheet member 4B by the first flexible sheet member 4A and the second flexible sheet member 4B, the wiring substrates 3A, 38, and 3C, the adhesive agent layers 42A and 42B, the adhesive agent layers 8A, 8B, 8C, 9A, 9B, and 9C, an the adhesive agent layers 5A and 5B. In addition, the portions of the adhesive agent layers 42A and 42B and the adhesive agent layers 8A, 8B, 8C, 9A, 9B, and 9C are flown to bury the interstices between the first flexible sheet member 4A, the second flexible sheet member 4B, and the organic EL panel 100, so that the circumferential portions of the organic EL panel 100 is sealed.

Figure 9:
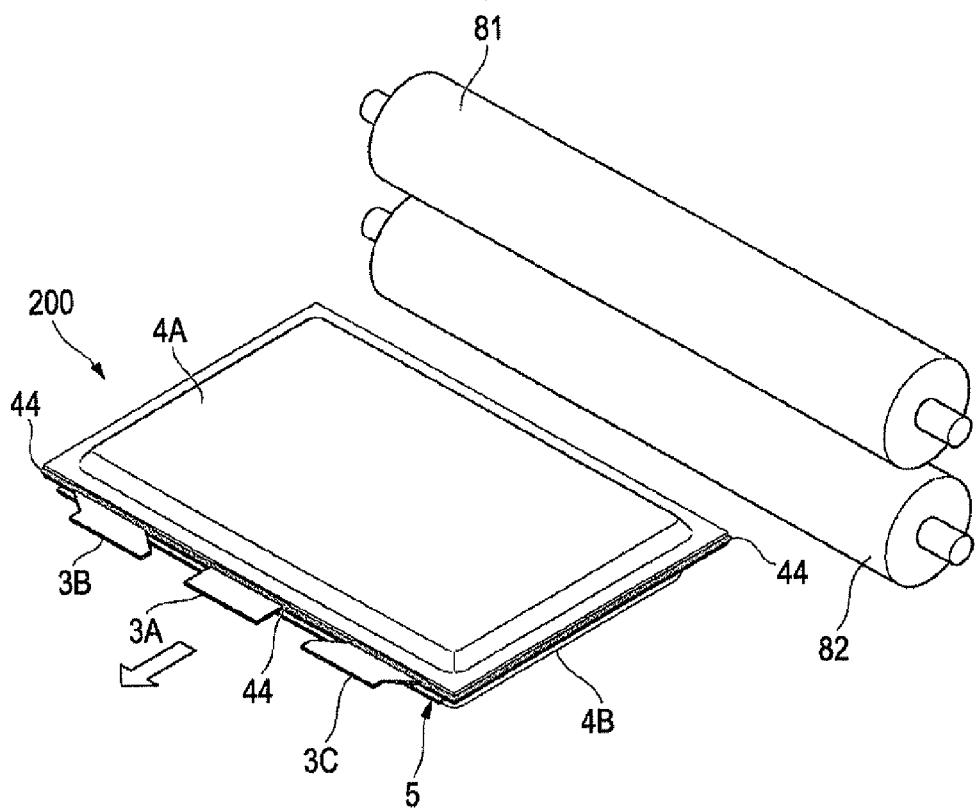
FIG. 9 is a view for explaining a method of manufacturing an organic EL apparatus.

As a result, the organic EL apparatus 200 is implemented. If the sealing process shown in FIGS. 7 and 8 is finished, as shown in FIG. 9, the pressing rollers are driven to rotate in the reverse direction, so that the organic EL apparatus 200 is extracted in the direction opposite to the insertion direction.

In addition, in the above manufacturing method, the pair of pressing rollers 81 and 82 is used as a pair of pressing units for pressing the lamination structure. However, the pressing units are not limited thereto, but various pressing units may be used. For example, plate-shaped pressing members are disposed at two sides of the lamination structure, and the lamination structure interposed therebetween may be pressed. In addition, the hearting and pressing treatment using the pressing rollers 81 and 82 are performed because a thermoplastic adhesive agent or a thermosetting adhesive agent is used as the adhesive agent layers 42A, 42B, 8A, 8B, 8C, 9A, 9B, 9C, 5A, and 5B. However, in the case where an ultraviolet curing adhesive agent or the like is used as the adhesive agent layers 42A, 42B, 8A, 8B, 8C, 9A, 9B, 9C, 5A, and 5B, the heating treatment is unnecessary.

In addition, in the above manufacturing method, after the adhesive agent layers 42A, 42B, 8A, 8B, 8C, 9A, 9B, 9C, 5A, and 5B are formed on the film sheets 41A and 41B, the wiring substrates 3A, 3B, and 3C, and the heat releasing member 5 in advance, the pressing treatment is performed. While the adhesive agents are coated or dropped into the portions between the film sheets 41A and 41B, the adhesion between the film sheets 41A and 41B may be performed. According to the method, the film sheet 41A and the organic EL panel 100 are closely attached to each other directly without interposing the adhesive agent layers 42A and 42B, white display can be performed.

According to the aforementioned organic EL apparatus 200 and the manufacturing method thereof according to the embodiment, the heat releasing member 5 and the organic EL panel 100 are integrated into the pair of first flexible sheet member 4A and the second flexible sheet member 4B, and the portions of the heat releasing member 5 are exposed to the outer sides of the first flexible sheet member 4A and the second flexible sheet member 4B, an organic EL apparatus having excellent heat releasing performance can be implemented. In the organic EL apparatus 200, since the heat releasing member 5 including the heat releasing sheet 51 of which the thermal conductivity in the in-plane direction is higher than that in the thickness direction is used, the heat generated from the organic EL panel 100 is transferred in the surface direction of the heat releasing sheet 51, so that the heat can be speedily released to the outer sides of the first flexible sheet member 4A and the second flexible sheet member 4B. Therefore, the inner portion of the organic EL panel 100 is not heated up to a high temperature, and the light emission characteristics can be maintained to be almost constant.

In addition, since the heat releasing sheet 51 that is constructed with a graphite sheet having excellent heat releasing performance and the metal heat releasing plate 52 that is easily available at a low price are used as the heat releasing member 5, the production cost can be suppressed, and the thin heat releasing member 5 having a high heat releasing efficiency can be implement. In addition, since the exposed portions of the first flexible sheet member 4A and the second flexible sheet member 4B is the metal heat releasing plate 52, durability with respect to breakage or abrasion can be improved.

In addition, in the organic EL apparatus according to the embodiment, the first flexible sheet member 4A and the second flexible sheet member 4B are adhered to the heat releasing member 5 and the wiring substrates 3A, 3B, and 3C, so that the organic EL panel 100 is hermetically encapsulated in the inside thereof; and the sealing resins 43 and 45 are formed in the interstices 4H₁ formed on the end surfaces of the organic EL panel 100 between the first flexible sheet member 4A, the second flexible sheet member 4B, and the organic EL panel 100, the interstices 4H₁ formed on the end surface of the heat releasing member 5 between the first flexible sheet member 4A, the second flexible sheet member 4B, and the heat releasing member 5, and the interstices 4H₂ between the wiring substrates 3A, 3B, and 3C and the heat releasing member 5, so that the interstices 4H₁ and 4H₂ are sealed. Therefore, the circumferential portions of the organic EL panel 100 can be overlappedly encapsulated by the first flexible sheet member 4A, the second flexible sheet member 4B, and first sealing resin 43. As a result, an organic EL apparatus 200 having a high mechanical strength and excellent sealing performance can be implemented.

In other words, in the organic EL apparatus disclosed in JP Patent No. 4,131,639, since an air layer exist in the interstice between the laminating films (corresponding to the first flexible sheet member 4A and the second flexible sheet member 4B) and the organic EL panel (refer to FIG. 7 in JP Patent No. 4,131,639), the circumferential portions of the organic EL panel is encapsulated through the air layer by the laminating films. In this case, although the laminating films protect the internal organic EL panel from the external air layer, the organic EL panel cannot be protected from the air layer that is already formed in the interstice between the laminating films and the organic EL panel in advance. Therefore, the sealing function due to the laminating films is also limited.

On the contrary, in the organic EL apparatus 200 according to the embodiment, since no air layer exists between the organic EL panel 100, the first flexible sheet member 4A, and the second flexible sheet member 4B, the circumferential portions of the organic EL panel 100 can be overlappedly encapsulated by the first flexible sheet member 4A, the second flexible sheet member 4B, and the first sealing resin 43. Therefore, the first flexible sheet member 4A and the second flexible sheet member 4B can be allowed to sufficiently function as the sealing members, high sealing performance can be implemented.

In addition, in the organic EL apparatus 200 according to the embodiment, since the wiring substrates 3A, 3B, and 3C, the heat releasing member 5, the first flexible sheet member 4A, and the second flexible sheet member 48 are adhered to each other, the circumferential portions of the organic EL panel 100 is encapsulated without interstice. Therefore, moisture or oxygen cannot be infiltrated from the interfacial surfaces between the wiring substrates 3A, 3B, and 3C, the first flexible sheet member 4A, and the second flexible sheet member 4B and the interfacial surfaces between the heat releasing member and the flexible sheet members 4A and 4B.

In other words, in the organic EL apparatus disclosed in JP Patent No. 4,131,639, although wiring substrates are interposed between a pair of laminating films, the thermoplastic adhesive agent formed on the inner surfaces of the laminating films does not have a substantial adhesion force with respect to the wiring substrates that are made of a polyimide resin or the like but it is easily detached from the wiring substrates, so that interstices are generated between the laminating films and the wiring substrates. Therefore, if the organic EL panel is allowed to be bent or applied with mechanical impact such as dropping, the detachment between the wiring substrates and the laminating films occur, and moisture or oxygen are infiltrated from the interstices.

On the contrary, in the organic EL apparatus 200 according to the embodiment, since the first flexible sheet member 4A, the second flexible sheet member 4B, the wiring substrates 3A, 3B, and 3C, and the heat releasing member 5 are strongly adhered to each other, although the organic EL panel 100 is allowed to be bent or applied with mechanical impact such as dropping, the detachment between the first flexible sheet member 4A, the second flexible sheet member 4B, the wiring substrates 3A, 3B, and 3C, and the heat releasing member 5 does not occur, so that high sealing performance can be maintained.

In addition, since the first flexible sheet member 4A and the second flexible sheet member 4B are configured to cover the connection portions between the wiring substrates 3A, 3B, and 3C and the organic EL panel 100 so as to be adhered to the wiring substrates 3A, 3B, and 3C, although the organic EL panel 100 is allowed to be applied with mechanical impact such as dropping, crack, or the like does not occur in the connection portions between the wiring substrates 3A, 3B, and 3C and the organic EL panel 100. In addition, since the first flexible sheet member 4A, the second flexible sheet member 4B, and the wiring substrates 3A, 3B, and 3C are fixed, although tension stress or the like is exerted to the wiring substrates 3A, 3B, and 3C, the detachment does not occur in the connection portions between the wiring substrates 3A, 3B, and 3C and the organic EL panel 100.

In other words, in the organic EL apparatus disclosed in JP Patent No. 4,131,639, since the laminating films and the wiring substrates are not substantially adhered to each other, if the tension stress is exerted to the wiring substrates, the stress is directly exerted to the connection portions between the wiring substrates and the organic EL panel, the detachment or the like occurs. On the contrary, in the organic EL apparatus 200 according to the embodiment, since the stress is absorbed by the first flexible sheet member 4A and the second flexible sheet member 4B, strong stress is not exerted to the connection portions between the wiring substrates 3A, 3B, and 3C and the organic EL panel 100.

Therefore, according to the organic EL apparatus 200 according to the embodiment, the organic EL apparatus having excellent mechanical strength and sealing performance and an improved reliability of connection between the wiring substrates 3A, 3B, and 3C and the organic EL panel 100 can be implemented.

In addition, in the organic EL apparatus 200 according to the embodiment, since the first flexible sheet member 4A, the second flexible sheet member 4B, and the heat releasing member 5 are fixed, although tension stress or the like is exerted to the heat releasing member 5, the position variation or the detachment do not occur between the heat releasing member 5 and the organic EL panel 100. Therefore, a stabilized heat releasing performance can be maintained.

In addition, since the interstices (air layers) are not formed between the first flexible sheet member 4A, the second flexible sheet member 4B, and the heat releasing member 5, heat transfer from the heat releasing member 5 to the first flexible sheet member 4A and the second flexible sheet member 4B is facilitated, the heat releasing performance of the surfaces of the first flexible sheet member 4A and the second flexible sheet member 4B is also improved.

In addition, in the organic EL apparatus 200 according to the embodiment, since the surface where the second substrate 20 including a glass substrate having a low moisture permeability and the light-emitting device portion 65 are formed is encapsulated, the sealing performance can be further increased. Since the second substrate 20 protects the organic EL devices 60, when the organic EL panel 100 is interposed by the first flexible sheet member 4A and the second flexible sheet member 4B, the organic EL devices 60 cannot be easily damaged. Therefore, the excellent light emission characteristics of the organic EL devices 60 can be maintained, and the production yield can also be improved.

In addition, in the organic EL apparatus 200 according to the embodiment, since the organic EL devices 60 are formed on the inorganic insulating layer 14 and since the inorganic gas barrier layer 69 of the thin film sealing layer 66 covering the organic EL devices 60 is in contact with the inorganic insulating layer 14 directly or through the electrode protecting layer 67 which is an inorganic layer, the circumferential portion of the organic EL devices 60 can be covered with the inorganic layer, so that the sealing performance can be further improved. In addition, in the embodiment, since the surface of the thin film sealing layer 66 is covered with the third sealing resin 35 and since the circumferential portion of the third sealing resin 35 is sealed with the seal member 30 having a low moisture permeability, the first sealing resin 43 disposed adjacent to the seal member 30, the adhesive agent layers 42A and 42B adjacent thereto, and the first flexible sheet member 4A and the second flexible sheet member 4B together with the circumferential portions of the organic EL devices 60 can be sealed overlappedly several times, the organic EL apparatus 200 having greatly high sealing performance can be obtained.

Second Embodiment

Configuration of Organic EL Apparatus

Figure 10:
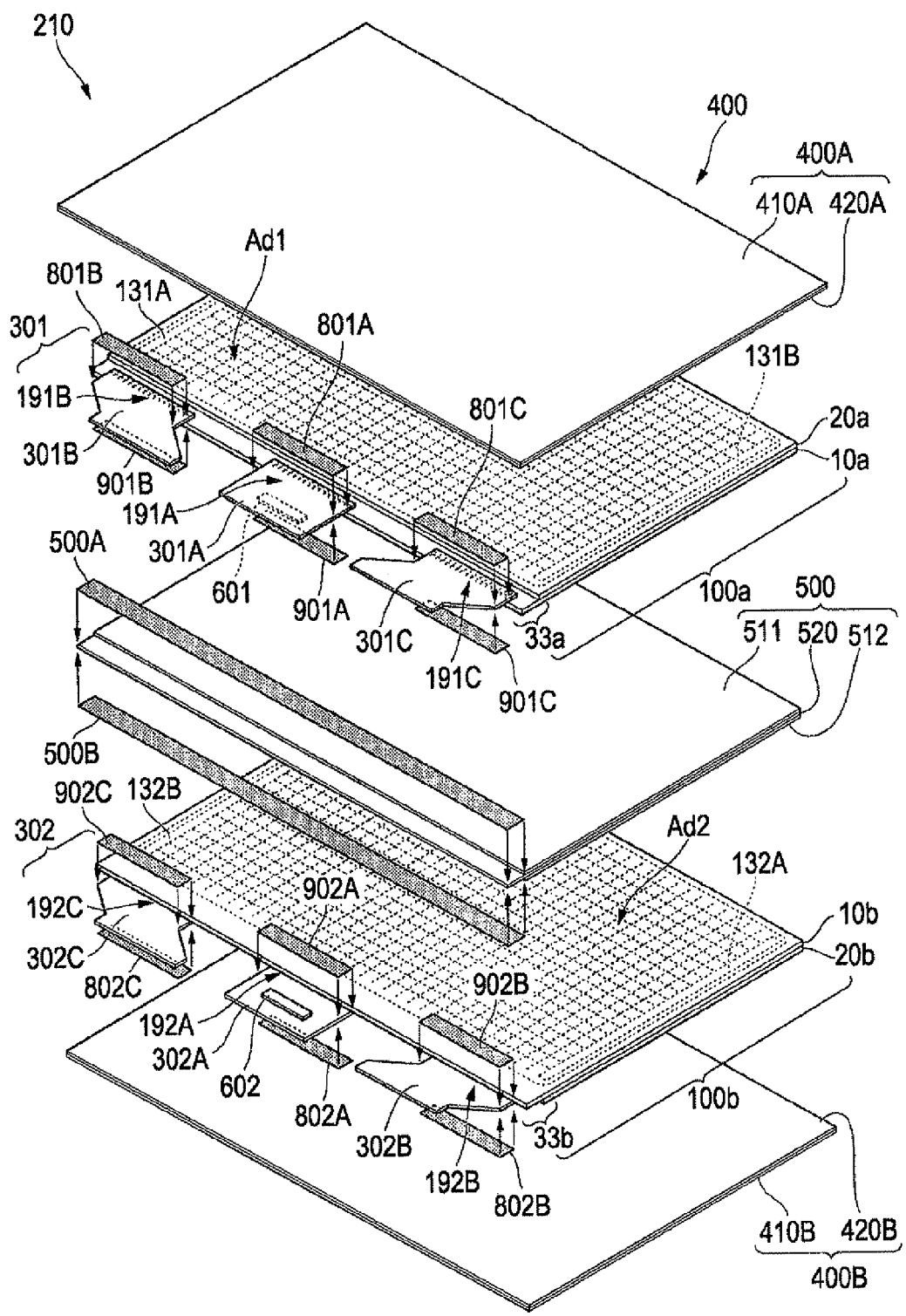
FIG. 10 is an exploded perspective view illustrating an organic EL apparatus according to a second embodiment of the invention.

FIG. 10 is an exploded perspective view illustrating an organic EL apparatus 210 according to a second embodiment of the invention. The organic EL apparatus 210 according to the embodiment has a two-side display function using two organic EL panels 100a and 100b.

The organic EL apparatus 210 includes the first organic EL panel 100a, first wiring substrates 301 (301A, 301B, and 301C) connected to an end portion of the first organic EL panel 100a, a heat releasing member 500 (a first heat releasing sheet 511, a heat releasing plate 520, and a second heat releasing sheet 512) disposed on a rear surface (on the side opposite to an observation side) of the first organic EL panel 100a, a second organic EL panel 100b disposed on the side opposite to the first organic EL panel 100a of the heat releasing member 500, second wiring substrates 302 (302A, 302B, and 302C) connected to an end portion of the second organic EL panel 100b, and encapsulation structures 400 (a first flexible sheet member 400A and a second flexible sheet member 400B) where the first organic EL panel 100a, the first wiring substrate 301, and the heat releasing member 500, the second organic EL panel 100b, and the second wiring substrate 302 are interposed therebetween to be integrally retained.

The organic EL apparatus 210 according to the embodiment is different from the organic EL apparatus 200 according to the first embodiment in that the pair of organic EL panels 100a and 100b are disposed at two sides of the heat releasing member 500, and the pair of first flexible sheet member 400A and the second flexible sheet member 400B are disposed to interpose the organic EL panels 100a and 100b. The configurations of the first organic EL panel 100a and the second organic EL panel 100b are the same as that of the organic EL panel 100 according to the first embodiment, and the configurations of the first wiring substrate 301 and the second wiring substrate 302 are the same as that of the wiring substrate 3 according to the first embodiment.

The heat releasing member 500 includes a heat releasing plate 520 made of a metal and a pair of heat releasing sheets 511 and 512 which are disposed at two sides of the heat releasing plates 520. The configuration of the heat releasing plate 520 is the same as that of the heat releasing plate 52 according to the first embodiment, and the configurations of the heat releasing sheets 511 and 512 are the same as that of the heat releasing sheet 51 according to the first embodiment.

The first organic EL panel 100a and the second organic EL panel 100b are formed with the same structure and the same size, and the facing components of the first organic EL panel 100a and the second organic EL panel 100b as viewed in the Z direction are disposed to entirely overlap. The first wiring substrates 301A, 301B, and 301C and the second wiring substrates 302A, 302B, and 302C are also formed with the same structure and the same size, and the facing components of the first wiring substrates 301A, 301B, and 301C and the second wiring substrates 302A, 302B, and 302C as viewed in the Z direction are disposed to entirely overlap.

In the first organic EL panel 100a and the second organic EL panel 100b, the first substrates 10a and 10b where the organic EL devices are formed are disposed to face each other, and the heat releasing member 500 is interposed therebetween.

The heat releasing member 500 has a three-layer structure of a first heat releasing sheet 511, a heat releasing plate 520, and a second heat releasing sheet 512. The first heat releasing sheet 511 and the first organic EL panel 100a are closely attached to each other, and the second heat releasing sheet 512 and the second organic EL panel 100b are closely attached to each other.

The first heat releasing sheet 511 is configured to be at least disposed at a position where it overlaps a display area Ad1 of the first organic EL panel 100a, preferably, disposed at a position including peripheral driving circuits such as the scan line driving circuits 131A and 131B. Similarly, the second heat releasing sheet 512 is configured to be at least disposed at a position where it overlaps a display area Ad2 of the second organic EL panel 100b, preferably, disposed at a position including peripheral driving circuits such as the scan line driving circuits 132A and 132B. Therefore, the heat generated from the display areas Ad1 and Ad2 or the peripheral driving circuits can be efficiently released out. In addition, in the embodiment, the heat releasing sheets 511 and 512 covers the display areas Ad1 and Ad2 and the formation areas of the scan line driving circuits 131A, 131B, 132A, and 132B, so that each of the heat releasing sheets 511 and 512 is formed to have an area wider than each of the first substrates 10a and 10b of the organic EL panels 100a and 100b.

The heat releasing plate 520 is configured to be at least disposed at a position where it overlaps the display areas Ad1 and Ad2, and portions thereof are configured to overhang outer portions of the overhanging portions 33a and 33b of the first substrates 10a and 10b. Preferably, the heat releasing plate 520 is disposed at a position including peripheral driving circuits such as the scan line driving circuits 131A, 131B, 132A, and 132B. Therefore, the heat generated from the display areas Ad1 and Ad2 or the peripheral driving circuits can be efficiently released out. In addition, in the embodiment, the heat releasing plate 520 covers the display areas Ad1 and Ad2 and the formation areas of the scan line driving circuits 131A, 131B, 132A, and 132B, so that the heat releasing plate 520 is formed to have an area wider than each of the first substrates 10a and 10b.

In the outer surface side of the first organic EL panel 100a (the positive-Z-direction size of the second substrate 20a) and the outer surface side of the second organic EL panel 100b (the negative-Z-direction of the second substrate 20b), a flexible encapsulation structure 400 which is closely attached to the organic EL panels to encapsulate the organic EL panels inside thereof is disposed. The encapsulation structure 400 includes the pair of first flexible sheet member 400A and the second flexible sheet member 400B which are disposed to interpose the organic EL panels 100a and 100b, the wiring substrates 301A, 301B, 301C, 302A, 302B, and 302C, and the heat releasing member 500. The pair of first flexible sheet member 400A and the second flexible sheet member 400B is constructed with a transparent material.

Each of the first flexible sheet member 400A and the second flexible sheet member 400B is constructed with each of flexible film sheets 410A and 410B, of which one surface side is provided with each of the adhesive agent layers 420A and 420B. As a resin for the adhesive agent layers 420A and 420B, various resins such as a thermoplastic resin, a thermosetting resin, or an ultraviolet curing resin may be used. In the embodiment, the thermoplastic resin is used.

Each of the first flexible sheet member 400A and the second flexible sheet member 400B is formed to have an area wider than each of the organic EL panels 100a and 100b. The first flexible sheet member 400A and the second flexible sheet member 400B are adhered to each other by the adhesive agent layers 420A and 420B at the circumferential portions that are the outer portions of the organic EL panels 100a and 100b, in a state where the end portion (the portions where the semiconductor chips 601 and 602 are mounted) of the side opposite to the side connected to the terminal portions 191A, 191B, 191C, 192A, 192B, and 192C of the wiring substrates 301A, 301B, 301C, 302A, 302B, and 302C and the portions that overhangs the outer portions of the overhanging portions 33a and 33b of the heat releasing member 500 are exposed.

In addition, the front and rear surfaces of the wiring substrates 301A, 301B, 301C, 302A, 302B, and 302C located in the circumferential portions of the organic EL panels 100a and 100b and the front and rear surfaces of the heat releasing member 500 are provided with the adhesive agent layers 500A, 500B, 801A, 801B, 801C, 802A, 802B, 802C, 901A, 901B, 901C, 902A, 902B, and 902C.

Among the first flexible sheet member 400A, the first wiring substrates 301A, 301B, and 301C, and the heat releasing member 500, the first flexible sheet member 400A and the first wiring substrates 301A, 301B, 301C are attached to each other by using the adhesive agent layers 801A, 801B, and 801C provided to the first wiring substrates 301A, 301B, and 301C and the adhesive agent layer 420A provided to the first flexible sheet member 400A; the first flexible sheet member 400A and the heat releasing member 500 are attached to each other by using the adhesive agent layer 500A provided to the heat releasing member 500 and the adhesive agent layer 420A provided to the first flexible sheet member 400A; and the first wiring substrates 301A, 301B, and 301C and the heat releasing member 500 are attached to each other by using the adhesive agent layers 901A, 901B, and 901C provided to the first wiring substrates 301A, 301B, and 301C and the adhesive agent layer 500A provided to the heat releasing member 500.

In addition, among the second flexible sheet member 400B, the second wiring substrates 302A, 302B, and 302C, and the heat releasing member 500, the second flexible sheet member 400B and the second wiring substrates 302A, 302B, and 302C are attached to each other by using the adhesive agent layers 802A, 802B, and 802C provided to the second wiring substrates 302A, 302B, and 302C and the adhesive agent layer 420B provided to the second flexible sheet member 400B; the second flexible sheet member 400B and the heat releasing member 500 are attached to each other by using the adhesive agent layer 500B provided to the heat releasing member 500 and the adhesive agent layer 420B provided to the second flexible sheet member 400B; and the second wiring substrates 302A, 302B, and 302C and the heat releasing member 500 are attached to each other by using the adhesive agent layers 902A, 902B, and 902C provided to the second wiring substrates 302A, 302B, and 302C and the adhesive agent layer 500B provided to the heat releasing member 500.

For the adhesive agent layers 500A, 500B, 801A, 801B, 801C, 802A, 802B, 802C, 901A, 901B, 901C, 902A, 902B, and 902C, various resins such as a thermoplastic resin, a thermosetting resin, or an ultraviolet curing resin may be used. In the embodiment, the thermoplastic resin or the thermosetting resin is used.

Next, according to the same principle described in the first embodiment, the adhesive agent layers 420A and 420B of the first flexible sheet member 400A and the second flexible sheet member 400B and the adhesive agent layers 500A, 500B, 801A, 801B, 801C, 802A, 802B, 802C, 901A, 901B, 901C, 902A, 902B, and 902C formed on the wiring substrates 301A, 301B, 301C, 302A, 302B, and 302C and the heat releasing member 500 are inserted into the interstices between the organic EL panels 100a and 100b, the first flexible sheet member 400A, and the second flexible sheet member 400B, the interstices between the wiring substrates 301A, 301B, 301C, 302A, 302B, and 302C, the first flexible sheet member 400A, and the second flexible sheet member 400B, the interstices between the heat releasing member 500, the first flexible sheet member 400A, and the second flexible sheet member 400B, and the interstices between the heat releasing member 500 and the wiring substrates 301A, 301B, 301C, 302A, 302B, and 302C, so that the interstices are sealed. According to the configuration, the organic EL panels 100a and 100b are hermetically encapsulated inside the pair of first flexible sheet member 400A and the second flexible sheet member 400B, that is, inside the encapsulation structure 400.

Method of Manufacturing Organic EL Apparatus

The method of manufacturing the organic EL apparatus 210 is the same as the aforementioned method according to the first embodiment. In other words, the first wiring substrates 301A, 301B, and 301C, and the second wiring substrates 302A, 302B, and 302C are connected to the end portions of the first organic EL panel 100a and the second organic EL panel 100b to which a flexibility is provided by thinning the glass substrate, and the lamination structure of the first organic EL panel 100a, the first wiring substrates 301A, 301B, and 301C, the heat releasing member 500, the second organic EL panel 100b, and the first wiring substrates 302A, 302B, and 302C is disposed between the first flexible sheet member 400A and the second flexible sheet member 400B.

Next, the lamination structure is inserted between a pair of pressing rollers from the positive-Y-directional side (the end portion of the side opposite to the side connected to the wiring substrates 301A, 301B, 301C, 302A, 302B, 302C of the organic EL panels 100a and 100b and the end portion of the side opposite to the side where the heat releasing member 500 is exposed to the outer sides of the first flexible sheet member 400A and the second flexible sheet member 400B). Next, the lamination structure is heated and pressed by the pair of pressing rollers on the surfaces of the first flexible sheet member 400A and the second flexible sheet member 400B, which face each other, through the adhesive agent layers 420A and 420B, the adhesive agent layers 801A, 801B, 801C, 802A, 802B, 802C, 901A, 901B, 901C, 902A, 902B, and 902C, and the adhesive agent layers 500A and 500B in a state where the portions of the wiring substrates 301A, 301B, 301C, 302A, 302B, and 302C (the end portions of the side opposite to the side connected to the terminal portions 191A, 191B, 191C, 192A, 192B, and 192C) and the portions of the heat releasing member 500 (the portions that overhang the outer portions of the overhanging portions 33a and 33b) are exposed to the outer sides of the first flexible sheet member 400A and the second flexible sheet member 400B.

Next, the adhesive agent layers 420A and 420B and the adhesive agent layers 801A, 801B, 801C, 802A, 802B, 802C, 901A, 901B, 901C, 902A, 902B, and 902C are pressed and spread with respect to the interstices between the first flexible sheet member 400A, the second flexible sheet member 400B, the organic EL panels 100a and 100b, and the wiring substrates 301A, 301B, 301C, 302A, 302B, and 302C to seal the interstices. The portions where the first flexible sheet member 400A and the second flexible sheet member 400B face each other, the portions where the first flexible sheet member 400A, the second flexible sheet member 400B, and he wiring substrates 301A, 301B, 301C, 302A, 302B, and 302C face each other, the portions where the first flexible sheet member 400A, the second flexible sheet member 400B, and the heat releasing member 500 face each other, the portions where the wiring substrates 301A, 301B, 301C, 302A, 302B, and 302C and the heat releasing member 500 face each other are adhered to each other through the circumferential portions of the organic EL panels 100a and 100b by using the adhesive agent layers 420A and 420B, the adhesive agent layers 801A, 801B, 801C, 802A, 802B, 802C, 901A, 901B, 901C, 902A, 902B, and 902C, and the adhesive agent layers 500A and 500B, so that the organic EL panels 100a and 100b are encapsulated inside the first flexible sheet member 400A and the second flexible sheet member 400B.

In addition, in the process, the portions of the adhesive agent layers 420A and 420B, and the adhesive agent layers 801A, 801B, 801C, 802A, 802B, 802C, 901A, 901B, 901C, 902A, 902B, and 902C are extracted to the outer sides of the first flexible sheet member 400A and the second flexible sheet member 400B, so that the second sealing resin 44 that seals the boundary portion between the first flexible sheet member 400A and the second flexible sheet member 400B is formed in the end surfaces of the first flexible sheet member 400A and the second flexible sheet member 400B.

When the sealing process is finished, the pressing rollers are driven to rotate in the reverse direction, so that the organic EL apparatus 210 is extracted in the direction opposite to the insertion direction. As a result, the organic EL apparatus 210 is completed.

According to the organic EL apparatus 210 and the manufacturing method thereof according to the embodiment, since the heat releasing member 500 and the organic EL panels 100a and 100b are integrated with the pair of first flexible sheet member 400A and the second flexible sheet member 400B, and since the portions of the heat releasing member 500 are exposed outside the first flexible sheet member 400A and the second flexible sheet member 400B, the organic EL apparatus having excellent heat releasing performance can be implemented. In the organic EL apparatus 210, since the heat releasing member 500 including the heat releasing sheets 511 and 512 of which the thermal conductivity in the in-plane direction is higher than that in the thickness direction is used, the heat generated from the organic EL panels 100a and 100b is transferred in the surface direction of the heat releasing sheets 511 and 512, so that the heat can be speedily released outside the first flexible sheet member 400A and the second flexible sheet member 400B. Therefore, the inner portions of the organic EL panels 100a and 100b is not heated up to a high temperature, and the light emission characteristics can be maintained to be almost constant.

In addition, the first flexible sheet member 400A and the second flexible sheet member 400B are adhered to the heat releasing member 500 and the wiring substrates 301A, 301B, 301C, 302A, 302B, and 302C, so that the organic EL panels 100a and 100b are hermetically encapsulated in the inside thereof; and the sealing resins are formed in the interstices formed on the end surfaces of the organic EL panels 100a and 100b between the first flexible sheet member 400A, the second flexible sheet member 400B, and the organic EL panels 100a and 100b, the interstices formed on the end surface of the heat releasing member 500 between the first flexible sheet member 400A, the second flexible sheet member 400B, and the heat releasing member 500, and the interstices between the wiring substrates 301A, 301B, 301C, 302A, 302B, and 302C and the heat releasing member 500, so that the interstices are sealed. Therefore, the circumferential portions of the organic EL panels 100a and 100b can be overlappedly encapsulated by the first flexible sheet member 400A, the second flexible sheet member 400B, and the sealing resin. As a result, an organic EL apparatus having a high mechanical strength and excellent sealing performance can be implemented.

In addition, since the wiring substrates 301A, 301B, 301C, 302A, 302B, and 302C and the first flexible sheet member 400A and the second flexible sheet member 400B are fixed, the detachment does not occur in the connection portions between the wiring substrates 301A, 301B, 301C, 302A, 302B, and 302C and the organic EL panels 100a and 100b. In addition, since the heat releasing member 500 and the first flexible sheet member 400A and the second flexible sheet member 400B are fixed, the position variation does not easily occur between the heat releasing member 500 and the organic EL panels 100a and 100b. Therefore, a stabilized heat releasing performance can be maintained.

Third Embodiment

Configuration of Organic EL Apparatus

Figure 11A:
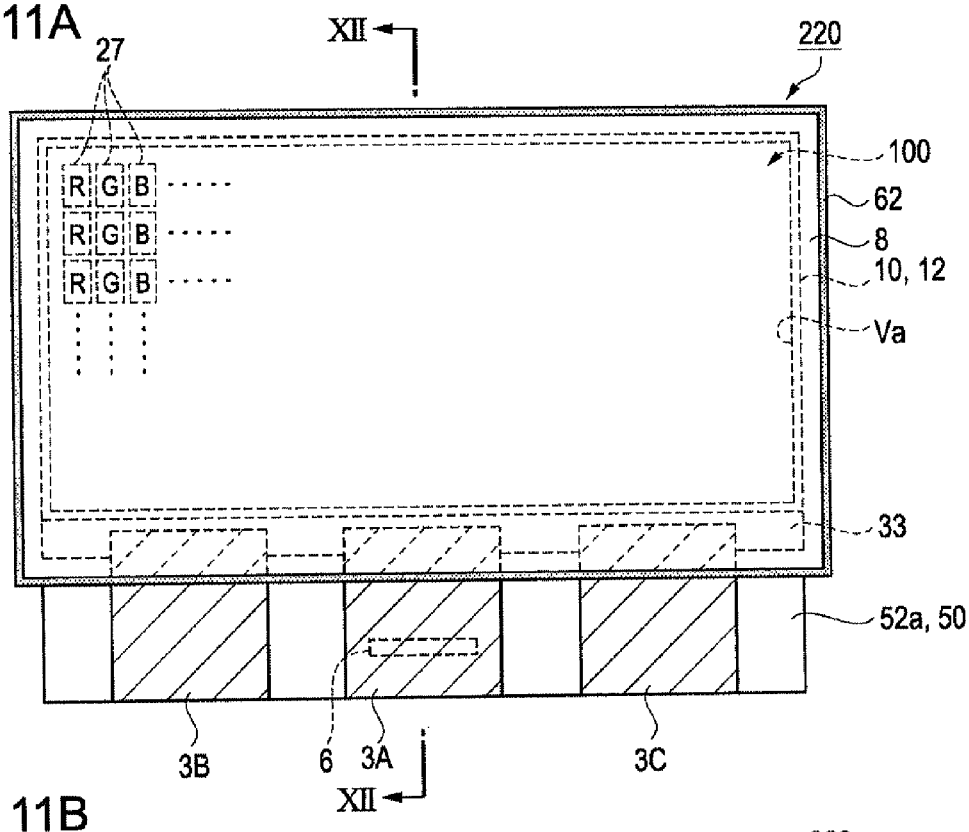
FIGS. 11A and 11B are schematic plan views illustrating a configuration of an organic EL apparatus.
Figure 11B:
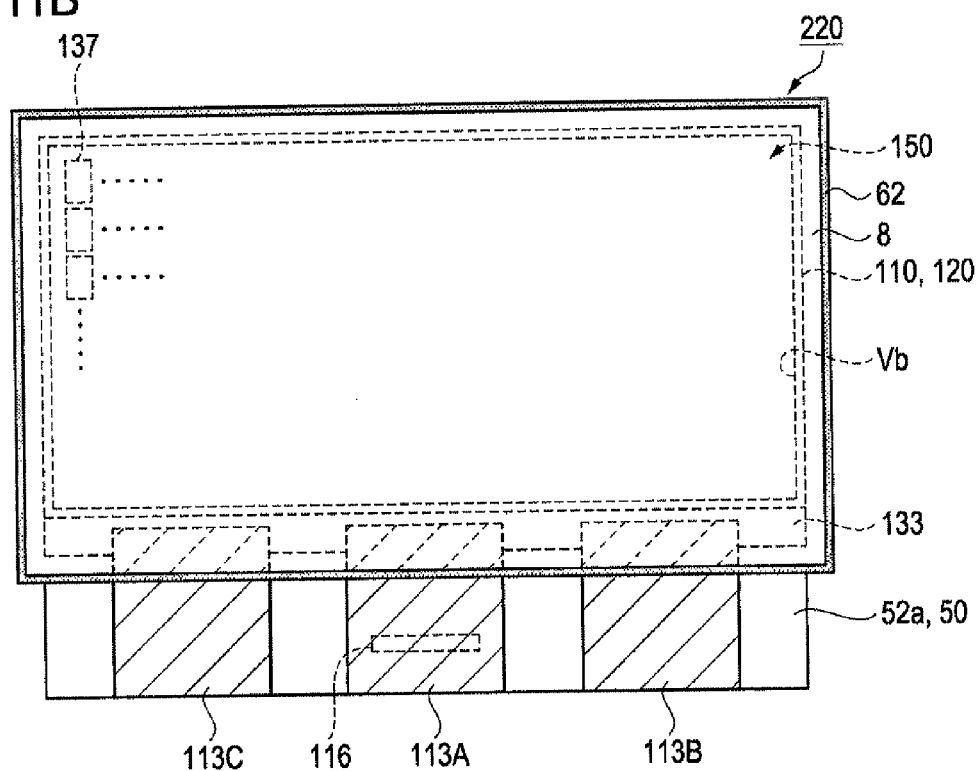
Figure 12:
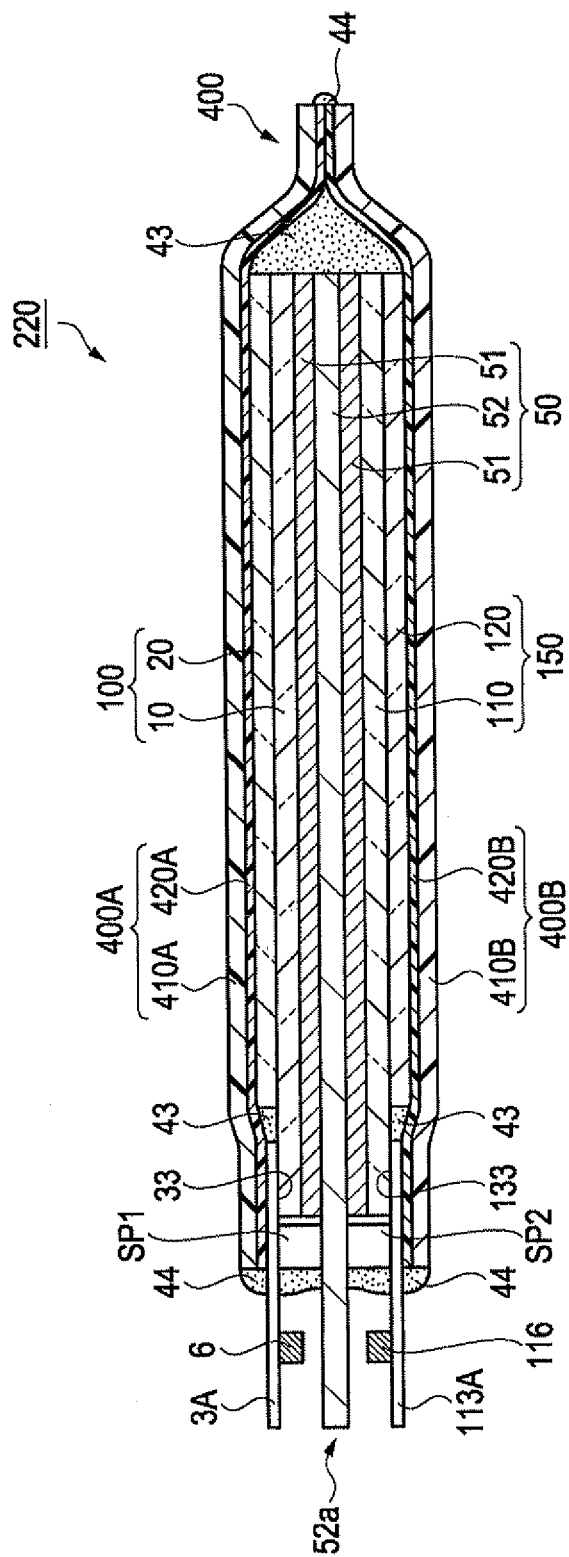
FIG. 12 is a schematic cross-sectional view illustrating a structure of an organic EL apparatus taken along line XII-XII of FIG. 11A.
Figure 13:
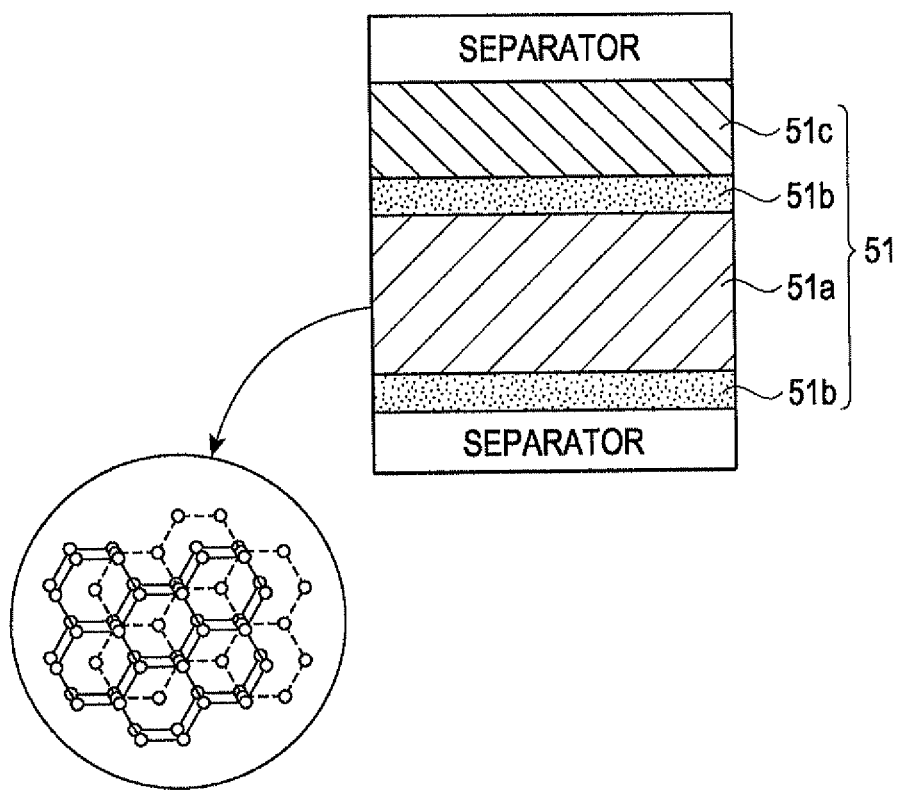
FIG. 13 is a schematic cross-sectional view illustrating a configuration of a heat releasing sheet.

The organic EL apparatus according to the embodiment is described with reference to FIGS. 11A to 16. FIGS. 11A and 11B are schematic plan views illustrating a configuration of an organic EL apparatus. FIG. 12 is a schematic cross-sectional view illustrating a structure of an organic EL apparatus taken along line XII-XII of FIG. 11A. FIG. 13 is a schematic cross-sectional view illustrating a configuration of a heat releasing sheet.

As shown in FIGS. 11A and 11B, the organic EL apparatus 220 according to the embodiment includes an organic EL panel 100 which is disposed at the one surface side and an electrophoretic panel 150 which is disposed at the other surface side.

In addition, hereinafter, the same components as those of the embodiments are denoted by the same reference numerals, and redundant description is appropriately omitted.

The organic EL panel 100 and the electrophoretic panel 150 overlap through a sheet-shaped heat releasing member 50, and similarly to the second embodiment, is interposed and sealed by an encapsulation structure 400 that is constructed with a pair of film sheets.

The sheet-shaped heat releasing member 50 overlaps at least a light-emitting area (display area) Va of the organic EL panel 100 as viewed in plane so that a portion 52a thereof is exposed outside the encapsulation structure 400.

As shown in FIG. 11A, the organic EL panel 100 includes a plurality of light-emitting pixels 27 that are disposed within the light-emitting area Va. A plurality of the light-emitting pixels 27 can obtain different light-emission colors of red (R), green (G), and blue (B) and are arrayed in a so-called stripe type where the same color light-emitting pixels 27 are arrayed in the same direction and the different color light-emitting pixels 27 are alternately arrayed. An organic EL device as a light-emitting device described later is disposed on each of the light-emitting devices 27.

The organic EL panel 100 includes a first substrate 10 that is a device substrate where the organic EL devices are disposed and a second substrate 20 that is a sealing substrate where the organic EL devices formed on the first substrate 10 are sealed. The short sides of the rectangular first substrate 10 are longer than the short sides of the similarly rectangular second substrate 20, and the portion of the first substrate 10 that is protruded from the second substrate 20 as viewed in plane becomes the overhanging portion 33. The wiring substrates 3A, 3B, and 3C that are three relay substrates which are to be connected to external driving circuits for driving the organic EL panel 100 are electrically connected to the overhanging portion 33. Among the three wiring substrates 3A, 3B, and 3C that are disposed in the overhanging portion 33 at a substantially equal interval, a semiconductor chip 6 that is a driver IC is mounted on the central wiring substrate 3A.

The portion 52a of the heat releasing member 50 that is exposed outwards from the encapsulation structure 400 are configured to extend substantially up to the positions of the front end portions of the three wiring substrates 3A, 3B, and 3C.

As shown in FIG. 11B, the electrophoretic panel 150 that is disposed at the rear surface side of the organic EL panel 100 is a light-receiving type display panel having an electrophoretic layer and includes a plurality of the pixels 137 that are disposed within the display area Vb. The pixels 137 can switch the display between the white display and the black display through control of driving the electrophoretic layer.

The electrophoretic layer is interposed between the first substrate 110 that is the rectangular device substrate and the second substrate 120 that is the opposite substrate, and the pixels 137 are disposed in a matrix shape in the short side direction and the long side direction.

The short sides of the rectangular first substrate 110 are longer than the short sides of the similarly rectangular second substrate 120, and the portion of the first substrate 110 that is protruded from the second substrate 120 as viewed in plane becomes the overhanging portion 133. The wiring substrates 113A, 113B, and 113C which are to be connected to external driving circuits for driving the electrophoretic panel 150 are electrically connected to the overhanging portion 133. Among the three wiring substrates 113A, 113B, and 113C that are the three relay substrate which are disposed in the overhanging portion 133 at a substantially equal interval, a semiconductor chip 116 that is a driver IC is mounted on the central wiring substrate 113A.

As shown in FIG. 12, the organic EL apparatus 220 is formed by integrating the organic EL panel 100 and the electrophoretic panel 150 through the heat releasing member 50 with the encapsulation structure that is constructed with the pair of film sheets (the first flexible sheet member 400A and the second flexible sheet member 400B).

The first flexible sheet member 400A includes a transparent film sheet 410A and an adhesive agent layer 420A which is formed on the one surface of the film sheet 410A.

As the film sheet 410A, a transparent resin film having a low gas permeability is very appropriately used in terms of prevention of the infiltration of external moisture, gas or the like.

As a material for the resin film, there may be, for example, a polyester such as PET (polyethylene terephthalate) or PEN (polyethylene naphthalate) or a resin such as a PBS (polyether sulfone), PC (polycarbonate), or PE (polyethylene). A thickness thereof is about 50 μm.

As a member constituting the adhesive agent layer 420A that can be adhered to the organic EL panel 100 or the electrophoretic panel 150, for example, a thermoplastic epoxy resin adhesive agent may be used. In addition, an adhesive agent having a glutinosity may be used. If the gluing agent is used, a repair property can be obtained. In other words, if the adhesive agent layer 420A can be sealed by closely attaching the film sheet 410A, the second substrate 20 of the organic EL panel 100, or the second substrate 120 of the electrophoretic panel 150, both of the adhesive agent and the gluing agent can be used.

In addition, the film sheet 410B and the adhesive agent layer 420B constituting the second flexible sheet member 400B may be constructed with the same material.

The heat releasing member 50 disposed between the organic EL panel 100 and the electrophoretic panel 150 is formed by laminating the heat releasing sheet 51 on the two surfaces of, for example, the metal heat releasing plate 52.

Preferably, the thermal conductivity of the heat releasing sheet 51 in the in-plane direction is higher than that in the thickness direction thereof.

As shown in FIG. 13, in the embodiment, a graphite sheet 51a having a thickness of about 70 µm is used as the base material layer; glutinous layers 51b are provided to the two surfaces thereof; and a tacky sheet 51c having a thickness of about 50 µm is laminated on the one glutinous layer 51b. Removable separators are disposed in order to protect the surface of the tacky sheet 51c and the surface of the other glutinous layer 51b.

As seen from the schematic enlarged view surrounded by a circle in FIG. 13, the graphite sheet 51a is formed by using a highly-aligned graphite where graphite layered structures are laminated in a macroscopic scale.

As the glutinous layers 51b, a double-sided tape having a thickness of, for example, about are 30 µm is used.

As the tacky sheet 51c, a member that is obtained by coating a gluing agent on a PET film having a thickness of, for example, about 38 µm is used.

As the separator, a member that is obtained by performing a demolding process on the surface of the PET film is used.

In addition, as the heat releasing sheet 51, heat releasing sheets disclosed in JP-A-58-147087, JP-A-60-012747, JP-A-7-109171, and JP Patent No. 3948000 may be used. Particularly, PGS graphite sheet (trade mark, manufactured by Panasonic Corporation) has a high thermal conductivity which is 2 to 4 times the thermal conductivity of copper (Cu) and 3 to 6 times the thermal conductivity of aluminum (Al) and such a bend-ability (flexibility) as paper, so that the product may be very appropriately used as the heat releasing sheet 51 in the embodiment.

As the heat releasing plate 52, a metal plate having a high thermal conductivity that is made of a metal such as copper or aluminum or an alloy thereof may be preferably used. In the embodiment, the heat releasing plate 52 is formed by using phosphor bronze to have a small thickness of about 50 µm, so that the heat releasing plate 52 having a flexibility and a shape recovery property (spring property) can be obtained.

First, the separator disposed on the side of graphite sheet 51a is removed, and the graphite sheet 51a is closely attached to the organic EL panel 100. Subsequently, the separator disposed on the side of tacky sheet 51c is removed, and the tacky sheet 51C is closely attached to the heat releasing plate 52. Similarly, the separator disposed on the side of the side of the graphite sheet 51a of the other heat releasing sheet 51 is removed, and the graphite sheet 51a is closely attached to the electrophoretic panel 150. Subsequently, the separator disposed on the side of the tacky sheet 51c is removed, and the tacky sheet 51C is closely attached to the heat releasing plate 52.

In this manner, the organic EL panel 100 and the electrophoretic panel 150 overlap through the heat releasing member 50.

In the embodiment, among the heat releasing member 50, the heat releasing sheet 51 has such an planar area that the heat releasing sheet 51 overlaps at least the light-emitting area Va of the organic EL panel 100. In addition, a portion 52a of the heat releasing plate 52 is configured to be exposed outside the encapsulation structure 400.

In addition, the invention is not limited thereto, but the heat releasing sheet 51 and the heat releasing plate 52 may be formed with the same size or shape, and a portion of the lamination structure thereof may be exposed.

In addition, the heat releasing sheet 51 disposed between the electrophoretic panel 150 and the heat releasing plate 52 may be omitted. The important feature is that, the heat releasing sheet 51 is provided to at least the side of the organic EL panel 100, and the heat is distributed over the in-plane area of the organic EL panel 100 and transferred to the heat releasing plate 52.

In the ease where the organic EL panel 100, the heat releasing member 50, and the electrophoretic panel 150 are interposed and sealed by the first flexible sheet member 400A and second flexible sheet member 400B, interstices occur with respect to each sheet member. For example, as shown in FIG. 12, the interstices may occur in the outer end portions (the portions where the end surfaces converge) of the organic EL panel 100, the heat releasing member 50, and the electrophoretic panel 150, between the wiring substrate 3A and the second substrate 20 in the overhanging portion 33 of the first substrate 10, similarly between the wiring substrate 113A and the second substrate 120 in the overhanging portion 133 of the first substrate 110, and between the portion 52a of the heat releasing plate 52, the wiring substrate 3A, and the wiring substrate 113A.

In the embodiment, the interstices are filled with the sealing resin 43, the organic EL panel 100, the heat releasing member 50, and the electrophoretic panel 150 which overlap are interposed and sealed (laminated) by the first flexible sheet member 400A and the second flexible sheet member 400B. The film sheets 410A of the sheet members that exceed the outer circumferential end portions are adhered to each other by using the adhesive agent layer 420A.

In addition, when lamination is performed by using a pair of sheet members, a spacer SP1 for burying the interstices with respect to the heat releasing plate 52 is disposed so that no cracks are generated in the insulating portion or the conducting portion due to the bending of the wiring substrate 3A at the end portion of the overhanging portion 33 of the organic EL panel 100. Similarly, a spacer SP2 for burying the interstices with respect to the heat releasing plate 52 is disposed so that no cracks are generated in the insulating portion or the conducting portion due to the bending of the wiring substrate 113A at the end portion of the overhanging portion 133 of the electrophoretic panel 150.

A method of filling the sealing resin 43 and a lamination method are described in the later-described method of manufacturing the organic EL apparatus 220.

Configuration of Organic EL panel

Figure 14:
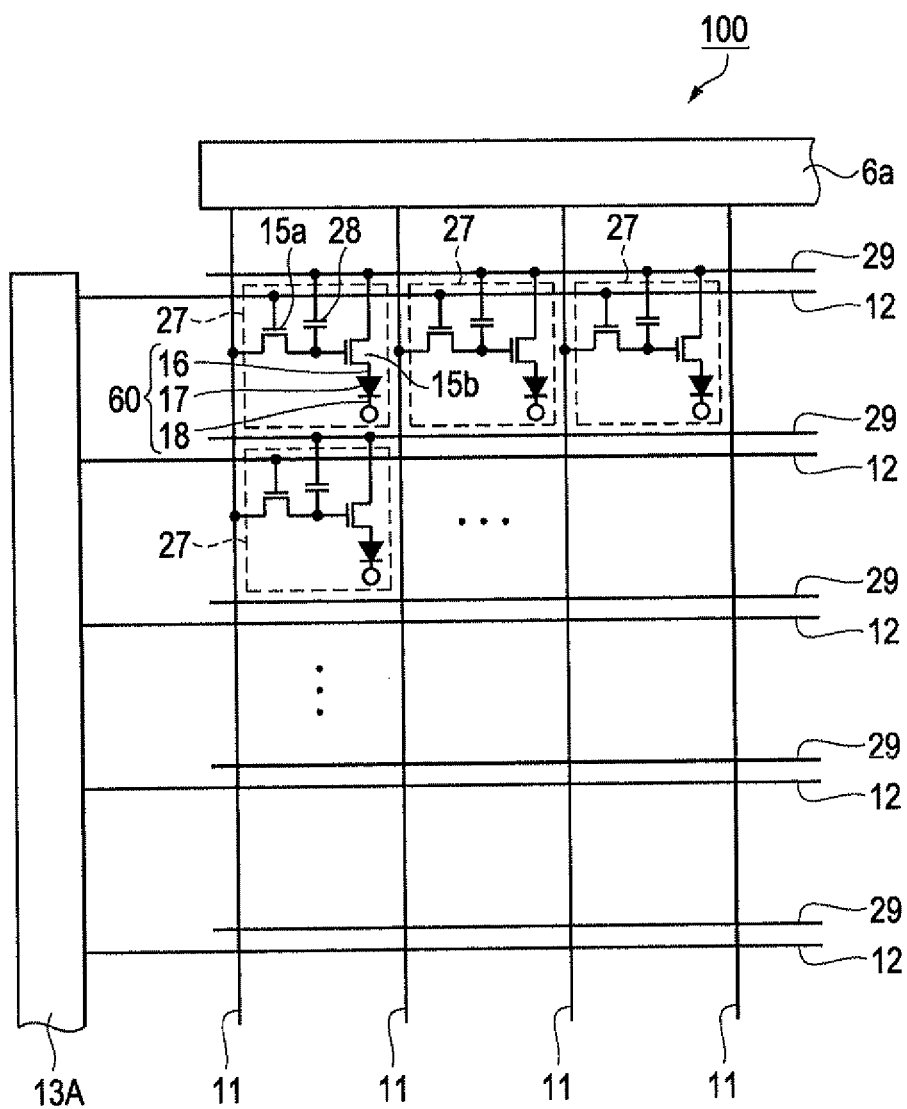
FIG. 14 is an equivalent circuit diagram illustrating an electrical configuration of an organic EL panel.

Now, the organic EL panel 100 is described with reference to FIGS. 14 and 5. FIG. 14 is an equivalent circuit diagram illustrating an electrical configuration of the organic EL panel 100.

As shown in FIG. 14, the organic EL panel 100 is an active matrix type organic EL panel using thin film transistors (hereinafter, referred to as TFTs). The organic EL panel 100 includes a plurality of scan lines 12 and a plurality of data lines 11, which intersect each other in the insulated state, and power supply lines 29 which is disposed to extend along the scan lines 12.

The light-emitting pixels 27 are disposed in the areas surrounded by the scan lines 12 and the data lines 11. The light-emitting pixels 27 are disposed in a matrix shape in the extension direction of the scan lines 12 and the extension direction of the data lines 11.

In each of the light-emitting pixels 27, an organic electroluminescence device (organic EL device) 60 that is constructed with a pixel electrode 16 as an anode, an organic light-emitting layer 17, and a common electrode 18 as a cathode is disposed. In addition, as a circuit portion for controlling driving of the organic EL device 60, a switching selection transistor 15a, a driving transistor 15b, and a storage capacitor 28 are disposed.

The organic light-emitting layer 17 is formed by sequentially laminating, for example, a hole injection layer, a hole transport layer, a light-emitting layer, and an electron transport layer. The holes injected from the pixel electrode 16 and the electrons injected from the common electrode 18 are re-combined, so that the organic light-emitting layer 17 is excited to emit light.

The configuration of the organic light-emitting layers 17 is not limited thereto. An intermediate layer or an electron injection layer may be included in order to more efficiently facilitating light emission, and a well-known configuration may be used.

The scan lines 12 are connected to the scan line driving circuit 13A including shift registers and level shifters. In addition, the data lines 11 are connected to the data line driving circuit 6a including shift registers, level shifters, video lines, and analog switches.

A scan signal is transmitted from the scan line driving circuit 13A through the scan line 12 to the switching selection transistor 15a. If the switching selection transistor 15a is in ON state, an image signal that is applied through the data line 11 from the data line driving circuit 6a is stored in the storage capacitor 28. According to the state of the storage capacitor 28, the ON/OFF states of the driving transistor 15b is determined. Next, when the pixel electrode 16 is electrically connected through the driving transistor 15b to a power supply line 29 (that is, when it is in the ON state), a driving current is allowed to flow from the power supply line 29 to the pixel electrode 16, and a current is allowed to flow into the common electrode 18 through the organic light-emitting layer 17. The light-emitting layer the organic light-emitting layer 17 emits light with the brightness according to the current amount flowing between the pixel electrode 16 and the common electrode 18.

The aforementioned semiconductor chip 6 that drives the organic EL panel 100 has a configuration capable of supplying power to at least one of the scan line driving circuit 13A and the data line driving circuit 6a and the power supply line 29. For example, the scan line driving circuit 13A may be formed as a portion of the circuit unit in the peripheral area along the short side of the light-emitting area Va of the organic EL panel 100. In this case, the semiconductor chip 6 may include the configuration of the data line driving circuit 6a. In addition, if the scan line driving circuit 13A and the data line driving circuit 6a are assembled in the inner portion of the organic EL panel 100, the semiconductor chip 6 may be unnecessary.

In addition, the detailed configuration of the organic EL panel 100 is the same as that described in FIG. 5. More specifically, the organic EL panel 100 is a flexible organic EL panel that is formed by interposing a lamination structure including the organic EL devices 60 between the first substrate 10 and the second substrate 20, of which each thickness is set to be equal to or smaller than 100 μm, and integrally adhering the two substrates with the seal member 30.

In a method of manufacturing the flexible organic EL panel 100, particularly, in the method where each thickness of the first base material layer 10F and the second base material layer 20F, each of which is the base of each substrate, is set to be equal to or larger than 20 μm and equal to or smaller than 50 μm as an appropriate example, a glass substrate having such thickness may be used. However, since cracks or the like may occur at the time of treating the glass substrate or forming elements on the glass substrate, the glass substrate having such thickness is not preferable.

Herein, preferably, a glass substrate having a thickness of, for example, about 500 μm is used, and after the attachment between the first substrate 10 and the second substrate 20, a method of polishing the glass substrate down to a desired thickness using a CMP (chemical mechanical polishing) method or a chemical etching method of chemically etching by immersing the glass substrate in an etching solution such as hydrofluoric acid may be used.

Configuration of Electrophoresis Panel

Figure 15:
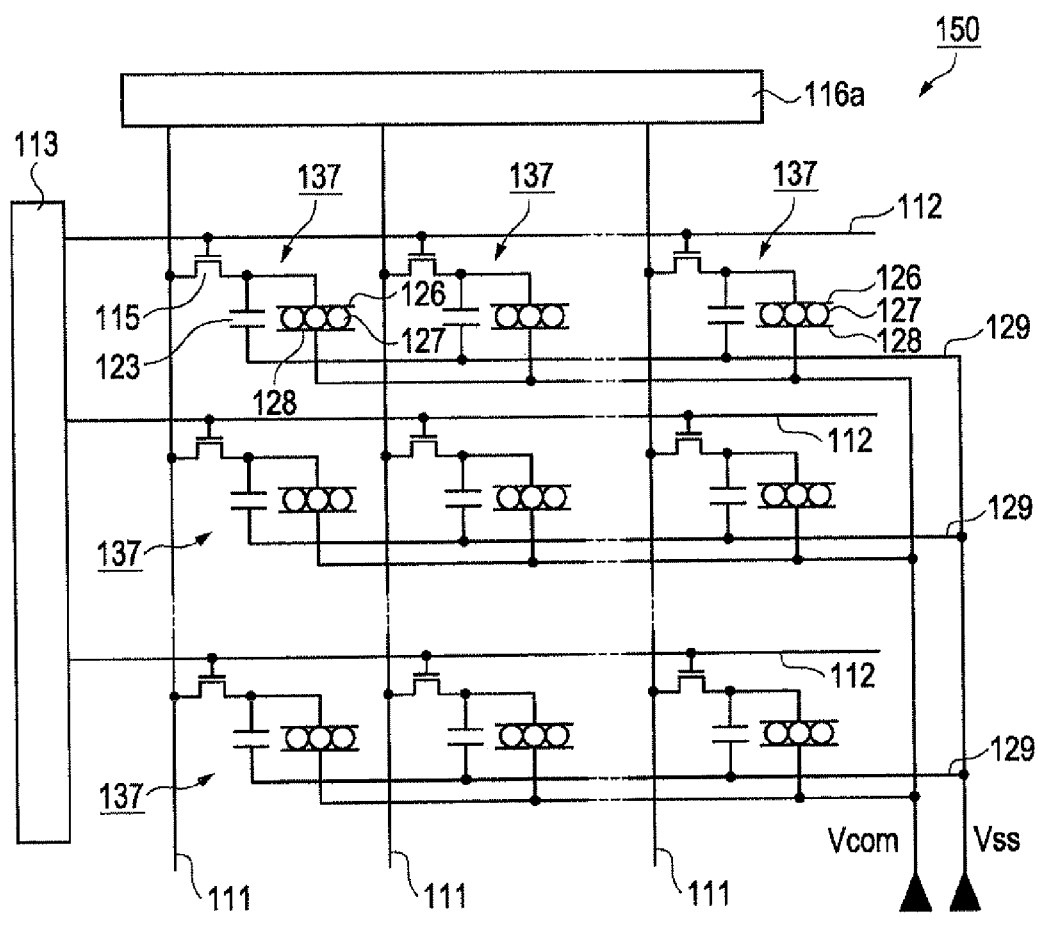
FIG. 15 is an equivalent circuit diagram illustrating an electrical configuration of an electrophoretic panel.
Figure 16:
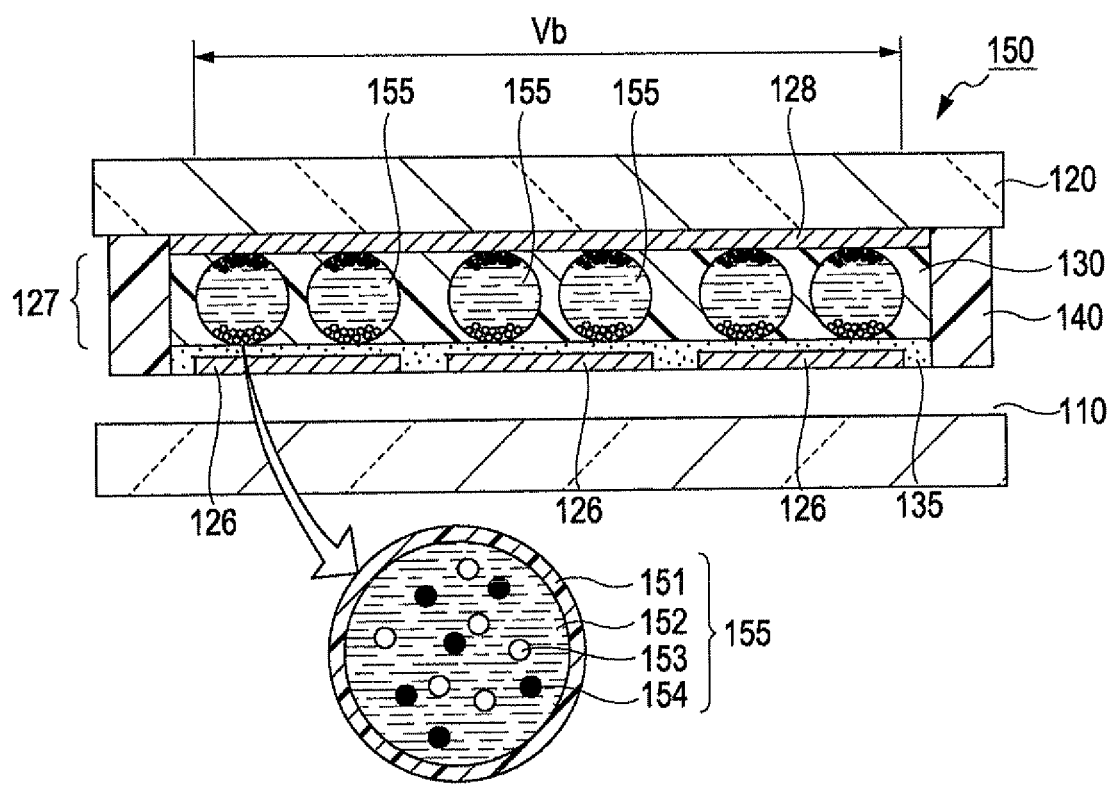
FIG. 16 is a schematic cross-sectional view illustrating a configuration of an electrophoretic panel.

Next, the electrophoretic panel 150 is described with reference to FIGS. 15 and 16. FIG. 15 is an equivalent circuit diagram illustrating an electrical configuration of an electrophoretic panel. FIG. 16 is a schematic cross-sectional view illustrating a configuration of an electrophoretic panel.

As shown in FIG. 15, the electrophoretic panel 150 includes a plurality of scan lines 112 and a plurality of data lines 111 that are insulated from each other and intersect each other. The pixels 137 are formed at the intersections of the scan lines 112 and the data lines 111. Each of the pixels 137 is connected to the scan line 112 and the data line 111. The pixels 137 are arrayed in a matrix shape in the extension direction of the scan lines 112 and the extension direction of the data lines 111.

Each of the pixels 137 includes a driving transistor 115 that is a thin film transistor (TFT) as a pixel switching device, a storage capacitor 123, a pixel electrode 126 and a common electrode 128 that is a pair of electrodes, and an electrophoretic layer 127 that is interposed between the pair of electrodes.

The driving transistor 115 is constructed as an N-type MOS (metal oxide semiconductor) TFT. The gate terminal of the driving transistor 115 is connected to the scan line 112; the source terminal thereof is connected to the data line 111; and the drain terminal thereof is connected to the one electrode of the storage capacitor 123 and the pixel electrode 126.

The storage capacitor 123 is formed on the later-described device substrate and is constructed with a pair of electrodes that are disposed to face each other with a dielectric layer interposed therebetween. The one electrode of the storage capacitor 123 is connected to the driving transistor 115, and the other electrode thereof is connected to each of capacitor lines 129 that are disposed in parallel to the scan lines 112. Due to the storage capacitor 123, the image signal applied through the driving transistor 115 can be sustained for a predetermined time.

The scan lines 112 are connected to the scan line driving circuit 113. The scan line driving circuit 113 sequentially supplies the selection signals for the scan lines 112 in pulse form based on timing signals supplied from a controller (not shown) so as to allow the scan lines 112 to be sequentially in exclusively selected state line by line. The selected state denotes the state where the driving transistor 115 connected to the scan line 112 turns ON.

The data lines 111 are connected to the data line driving circuit 116a. More preferably, the semiconductor chip 116 is embedded in the data line driving circuit 116a, and the data line driving circuit 116a supplies the data lines 111 based on timing signals supplied from the controller (not shown). For simplifying the description of the embodiment, the image signal is configured to be taken as one of binary-valued potentials of a high level potential VH (for example, 15 V) and a low level potential VL (for example, 0 V). In addition, the electrophoretic layer 127 can switch the display between the white display and the black display according to the potential applied between the pixel electrode 126 and the common electrode 128. The low level image signal (potential VL) is applied to the pixel 137 that is to be displayed in white, and the high level image signal (potential VH) is applied to the pixel 137 that is to be displayed in black.

A common electrode potential Vcom is applied from a common electrode driving circuit (not shown) to the common electrode 128. The common electrode driving circuit is configured to include, for example, a DAC (waveform generation circuit) and an operational amplifier (current amplifying circuit). The DAC is a D/A conversion apparatus that generates a potential waveform from an input setting signal Vset. The potential waveform output from the DAC is current-amplified by the operational amplifier to be applied to the common electrode 128. In the common electrode driving circuit, since an arbitrary potential waveform can be generated by the DAC, the common electrode potential Vcom can be changed according to the gradation written into the pixel 137.

In addition, in the embodiment, the common electrode potential Vcom is configured to be taken as one of binary-valued potentials of to the low level potential VL (for example, 0 V) and the high level potential VH (for example, 15 V).

A capacitor line potential Vss is applied from a capacitor line driving circuit (not shown) to the capacitor line 129. The capacitor line driving circuit is configured, for example, as a switch circuit having two switching devices that are exclusively operated. The one switching device switches the potential applied from the high level (VH) power supply to the output terminal. The other switching device switches the potential applied from the low level (VL) power supply to the output terminal. The control terminals of the two switching devices are input with a selection signal and an inverted selection signal, so that the two switching devices are exclusively operated.

In addition, in the embodiment, although the common electrode potential Vcom is configured to be output the low level potential VL (for example, 0 V) or the high level potential VH (for example, 15 V) as the capacitor line potential Vss, an arbitrary capacitor line potential Vss may be output by changing the potential of the power supply connected to the switching device.

As shown in FIG. 16, the electrophoretic panel 150 has a configuration where the electrophoretic layer 127 is interposed between the first substrate 110 and the second substrate 120. In addition, in the embodiment, the following description is made under the assumption that the image is displayed on the side of the second substrate 120.

As the first substrate 110, a substrate that is made of, for example, a glass or a plastic may be used. On the first substrate 110, a lamination structure that is constructed with the aforementioned driving transistors 115, the storage capacitors 123, the scan lines 112, the data lines 111, the capacitor lines 129, and the like is formed. A plurality of pixel electrodes 126 are formed in a matrix shape on the upper side of the lamination structure.

The second substrate 120 may be formed by using a transparent substrate which is constructed with, for example, a glass or plastic. In the side of first substrate 110 in the second substrate 120, the common electrode 128 is formed at least on the display area Vb to face a plurality of the pixel electrodes 126. The common electrode 128 is constructed with, for example, a transparent conductive material such as magnesium silver (MgAg), indium tin oxide (ITO), or indium zinc oxide.

The electrophoretic layer 127 is constructed with a plurality of microcapsules 155 including electrophoretic particles. A plurality of the microcapsules 155 is fixed between the first substrate 110 and the second substrate 120, for example, by a binder 130 made of a resin or the like or an adhesion layer 135. In addition, the electrophoretic layer 127 is manufactured by adhering the electrophoretic sheet, which is previously fixed to the side of the second substrate 120 by the binder 130, with the first substrate 110, which is manufactured separately from the electrophoretic sheet and on which the pixel electrode 126 or the like is formed, by using the adhesion layer 140, which is constructed with, for example, a thermosetting or ultraviolet curing epoxy series adhesive agent.

The microcapsules 155 are interposed between the pixel electrode 126 and the common electrode 128. One or a plurality of the microcapsules 155 are disposed within one pixel 137 (in other words, with respect to one pixel electrode 126).

The enlarged view in FIG. 16 is a cross-sectional view illustrating an internal structure of the microcapsule 155. The microcapsule 155 has a configuration where a dispersing medium 152, a plurality of white particles 153, and a plurality of black particles 154 are encapsulated inside a coat layer 151. The microcapsule 155 is formed in a spherical shape having a diameter of, for example, about 30 μm.

The coat layer 151 functions as a shell of the microcapsule 155. The coat layer 151 is made of a polymer resin having light-transmitting property such as an acryl resin (for example, polymethacrylate methyl, polymethacrylate ethyl, or the like), a urea resin, an arabic gum, or a gelatin.

The dispersing medium 152 is a medium that is obtained by dispersing white particles 153 and black particles 154 in the microcapsules 155 (in other words, in the coat layer 151). As the dispersing medium 152, there may be water, alcohol series solvents (methanol, ethannol, isoprophanol, butanol, octanol, methyl cellosolve, or the like), esters (acetic ethyl, acetic butyl, or the like), ketones (acetone, methyl ethyl ketone, methyl isobutyl ketone, or the like), aliphatic hydrocarbon (pentane, hexane, octane, or the like), alicyclic hydrocarbon (cyclohexane, methyl cyclohexane, or the like), aromatic hydrocarbon (benzene, toluene, benzenes having a long-chain alkyl group (xylene, hexyl benzene, butyl benzene, octyl benzene, nonyl benzene, decyl benzene, undecyl benzene, dodecyl benzene, tridecyl benzene, tetradecyl benzene, or the like)), halogenated hydrocarbon (chlorinated methylene, chloroform, carbon tetrachloride, 1,2-dichloro ethane, or the like), carboxylic acid salt, or the like, and other oils. These materials may be used as a sole component or as a component in a mixture. Moreover, these materials may be mixed with a surface active agent or the like.

The white particle 153 is a particle made of a white pigment, for example, titan dioxide, zinc oxide, antimony trioxide, or the like (polymer or colloid) and is used, for example, in a negatively charged form. The black particle 154 is a particle made of a black pigment, for example, aniline black, carbon black, or the like (polymer or colloid) and is used, for example, in a positively charged form.

An electrolyte, a surface active agent, a charge controlling agent that is made of particles in a metal soap, a resin, a rubber, an oil, a vanish, or a compound, a dispersing agent such as a titan series coupling agent, an aluminum series coupling agent, or a silan series coupling agent, a lubricant, a stabilizing agent, or the like may be added to the pigment, if necessary.

Since the white particles 153 and the black particles 154 are moved in the dispersing medium 152 by the electric field (potential difference) generated between the pixel electrode 126 and the common electrode 128, the displayed colors of the pixels 137 depend on the color tones of the particles collected to the side of the common electrode 128. In other words, one of the white display and the black display are performed according to the potential difference.

In addition, if the potential difference is allowed to be stored, the white display state or the black display state can be sustained. In other words, the electrophoretic panel 150 is a power-saving display panel in comparison with a self-luminous organic EL panel 100 where power is consistently supplied for display.

In addition, instead of the white particles 153 or the black particles 154, for example, red, green, blue pigment, or the like may be used. According to this configuration, red, green, blue, or the like can be displayed in the pixels 137. In addition, in order to increase the color reproducibility for the displayed colors, color layers (so-called color filter layers) corresponding to the red, green, and blue colors may be disposed between the second substrate 120 and the common electrode 128.

In the embodiment, similarly to the organic EL panel 100, each of the first substrate 110 and the second substrate 120 in the electrophoretic panel 150 is formed by using a glass substrate. In addition, similarly to the organic EL panel 100, in order to obtain a thin, flexible glass substrate, the thickness of the glass substrate is set to be equal to or larger than 20 μm and equal to or smaller than 50 μm. With respect to the method of thinning a glass substrate, similarly to the aforementioned organic EL panel 100, preferably, a glass substrate having a thickness of, for example, about 500 μm is used, and after the attachment between the first substrate 110 and the second substrate 120 with the electrophoretic layer 127 interposed therebetween, the glass substrate is thinned down to a desired thickness by using a CMP method or a chemical etching method.

Method of Manufacturing Organic EL Apparatus

Figure 17:
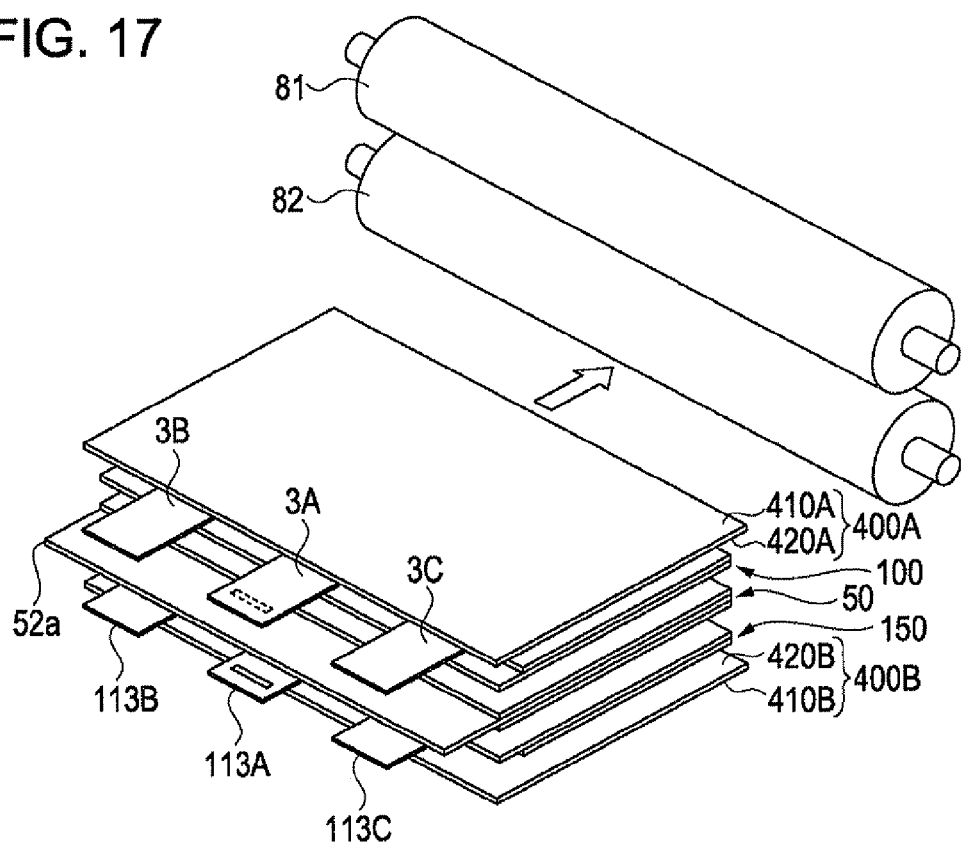
FIG. 17 is a schematic perspective view illustrating a method of manufacturing an organic EL apparatus.
Figure 18:
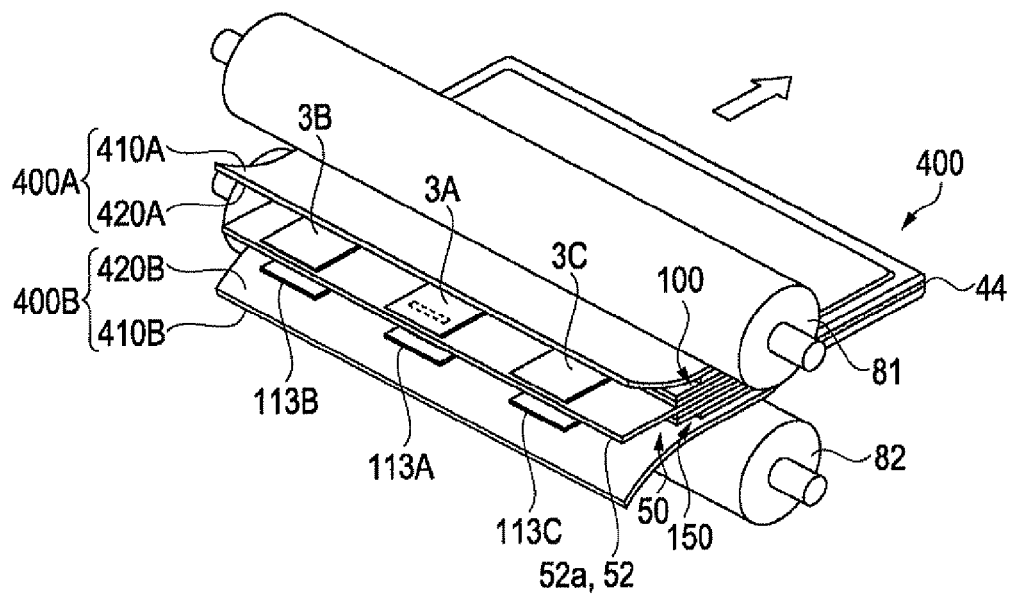
FIG. 18 is a schematic perspective view illustrating a method of manufacturing an organic EL apparatus.

Next, a method of manufacturing an organic EL apparatus 220 according to the embodiment, particularly a lamination method using a pair of sheet members is described with reference to FIGS. 17 and 18. FIGS. 17 and 18 are schematic perspective views illustrating a method of manufacturing an organic EL apparatus.

The method of manufacturing an organic EL apparatus 220 according to the embodiment includes an disposing process of overlappedly disposing the organic EL panel 100, the heat releasing member 50, and the electrophoretic panel 150 between the two sheet members so that the portion 52a of the sheet-shaped heat releasing member 50 is exposed outside the pair of sheet members. In addition, the method includes a sealing resin disposing process of disposing the sealing resin 43 in the interstices between the pair of sheet members, and the outer circumferential end surfaces of the organic EL panel 100, the heat releasing member 50, and the electrophoretic panel 150. In addition, the method includes a laminating process of pressing the pair of sheet members which interpose the organic EL panel 100, the heat releasing member 50, the electrophoretic panel 150, and the sealing resin 43 by using a pressing unit and sealing the circumferential portions of the sheet members.

First, in the disposing process, as shown in FIG. 17, components are disposed at two-dimensional or three-dimensional predetermined positions. More specifically, the organic EL panel 100 and the electrophoretic panel 150 overlap the heat releasing member 50. As described above, since the heat releasing member 50 is constructed with the heat releasing sheet 51 having the glutinous layer 51b and the heat releasing plate 52, the separator at the side of the graphite sheet 51a of the heat releasing sheet 51 is moved, and the graphite sheet 51a overlaps the organic EL panel 100. Similarly, the separator at the side of the graphite sheet 51a of the one heat releasing sheet 51 disposed at the side opposite to the heat releasing plate 52, and the graphite sheet 51a overlaps the electrophoretic panel 150 (refer to FIG. 13). In addition, the spacers SP1 and SP2 are disposed between the heat releasing plate 52 and the wiring substrates 3A, 3B, 3C, 113A, 113B, and 113C (refer to FIG. 12). As a result, the display portion lamination structure having a configuration where the organic EL panel 100, the electrophoretic panel 150, and the heat releasing member 50 are interposed is completed.

First, the second flexible sheet member 400B is disposed so that the adhesive agent layer 420B faces up, and the electrophoretic panel 150 of the display portion lamination structure is disposed to face down. In addition, the portion 52a of the heat releasing plate 52 is disposed to exceed second flexible sheet member 400B as viewed in plane. At this time, in the side of the adhesive agent layer 420B of the second flexible sheet member 400B. The sealing resin 43 that is to be the sealing resin layer is previously coated on the area corresponding to the outer circumferential portion of the display portion lamination structure and the area corresponding to the overhanging portion 133 of the electrophoretic panel 150. In addition, the sealing resin 43 is also coated on the overhanging portion 33 of the organic EL panel 100. In other words, the sealing resin 43 is previously coated on the portions which are to be the interstices when the lamination is performed by using the pair of sheet members. Next, the first flexible sheet member 400A is overlappedly disposed so as to cover the display portion lamination structure. In other words, the sealing resin disposing process and the disposing process are performed simultaneously.

Herein, the state where all the aforementioned components overlap is called a to-be-laminated member.

In the laminating process, a laminating apparatus shown in FIG. 17 is used. The laminating apparatus includes a pair of rollers 81 and 82 where elastic members such as an elastomer having a circumferential surface having a thermal conductivity as a pair of pressing units. The laminating apparatus has a configuration of maintaining the rotation shafts of the pair of rollers 81 and 82 to be parallel to each other and pressing and heating each other. The rollers 81 and 82 are heated at a temperature of about 80° C. to 120° C.

Next, as shown in FIG. 18, the to-be-laminated member is inserted into the laminating apparatus so that the side portion of the side opposite to the side which the portion 52a of the heat releasing member 50 exceeds, that is, the side which the wiring substrates 3A, 3B, 3C, 113A, 113B, and 113C exceed is in parallel to the pair of rollers 81 and 82. According to this insertion method, the lamination is performed so that bubbles are pressed out. Therefore, there is no problem in that the bubbles remain on the surfaces or the end portions of the to-be-laminated member due to the step differences of the to-be-laminated member, for example, the step differences between the heat releasing member 50, the organic EL panel 100, and electrophoretic panel 150. Therefore, it is possible to provide the organic EL apparatus 220 having excellent display quality or sealing performance, and the releasing of the heat generated from the surfaces of the sheet members is not influenced by the remaining bubbles.

In addition, as described above, the sealing resin 43 is previously coated at least on the portions along the three sides of the to-be-laminated member and the overhanging portions 33 and 133 where spaces may be easily formed after the lamination. Therefore, after burying the spaces, the redundant sealing resin 43 is also pressed out into the end portions of the sheet members, so that the redundant sealing resin 43 becomes the sealing resin 44 forming the frame shape (refer to FIG. 12). Next, in the circumferential portion of the to-be-laminated member, the two sheet members are thermally pressed and are sealed by the encapsulation structure 400. The laminated member is pressed out between the rollers 81 and 82, so that the laminating process is finished.

Although the laminating process may be performed in a general environment, it is performed in a depressurized environment by taking into consideration the sealing property. In FIGS. 17 and 18, although only the rollers 81 and 82 are shown, the laminating apparatus includes a chamber (not shown) for setting an internal environment to a desired pressure environment.

Preferably, in order to remove remaining stress from the laminated organic EL apparatus 220, an annealing process is performed. The annealing process may be performed in the above depressurized environment, or it may be performed in a general environment. Particularly, in the embodiment, although the first flexible sheet member 400A (second flexible sheet member 400B) where the adhesive agent layer 420B is disposed on the film sheet 410A is used, in the case where a thermal fusing type resin film including a cross-linked component is used as the first flexible sheet member 400A, it is preferable that an annealing process is performed at a temperature of about 100° C., so that a complete cross-linking is formed.

The laminating apparatus used for the lamination is not limited to the roll lamination type where the pair of rollers 81 and 82 is provided. For example, there may be used a diaphragm type vacuum laminating apparatus where a preparation body is set on a one plate-shaped heating plate (hot plate), and heating and pressing are performed in a state where a deformable rubber sheet is pressed on the preparation body according to a difference of air pressure.

According to the aforementioned first embodiment, the following advantages can be obtained.

(1) The organic EL apparatus 220 has a configuration where a display portion lamination structure having a flexibility where the organic EL panel 100, the heat releasing member 50, and the electrophoretic panel 150 are laminated in this order are laminated by the pair of first flexible sheet member 400A and the second flexible sheet member 400B. In addition, since the lamination and exposure is performed so that the portion 52a of the heat releasing member 50 is exposed outside the first flexible sheet member 400A, the heat generated from the organic EL panel 100 can be efficiently released. Therefore, the brightness of the organic EL panel 100 is not varied due to the heat, and stabilized light emission characteristics can be obtained. In addition, since the electrophoretic panel 150, which is a light-receiving type display panel, has a high heat releasing performance and can use the heat generated from the organic EL panel 100, stabilized display characteristics can be obtained even in a low temperature state, for example, in a temperature of 0° C. or less.

(2) The heat releasing member 50 is formed by laminating the heat releasing sheet 51 including the graphite sheet 51a, of which thermal conductivity in the in-plane direction is higher than that in the inter-layer direction on the heat releasing plate 52 made of phosphor bronze having excellent thermal conductivity and a spring property, of which a thickness is 50 μm. Since the side of the graphite sheet 51a can overlap the organic EL panel 100 through the glutinous layer 51b, although the organic EL panel 100 is locally heated, the heat can be distributed over the light-emitting area Va of the organic EL panel 100. In other words, non-uniformity in the brightness due to the heat cannot easily occur.

In addition, since the wiring substrates 3A, 3B, 3C, 113A, 113B, and 113C are exposed in the same direction as the extraction direction, in the bending portion of the organic EL apparatus 220, the bending strength of the portion of the wiring substrate can be reinforced.

(3) The organic EL apparatus 220 can have a flexibility because the organic EL panel 100 and other components of the display portion lamination structure are allowed to be thinned. In addition, the organic EL panel 100 is constructed by using a glass substrate, and since the hermetical state is sealed by using the first flexible sheet member 400A having a low gas permeability, the infiltration of external moisture or gases can be prevented. Therefore, in comparison with the case where the organic EL panel 100 is used as a sole component, a long life cycle can be implemented.

Electronic Apparatus 1

Figure 19A:
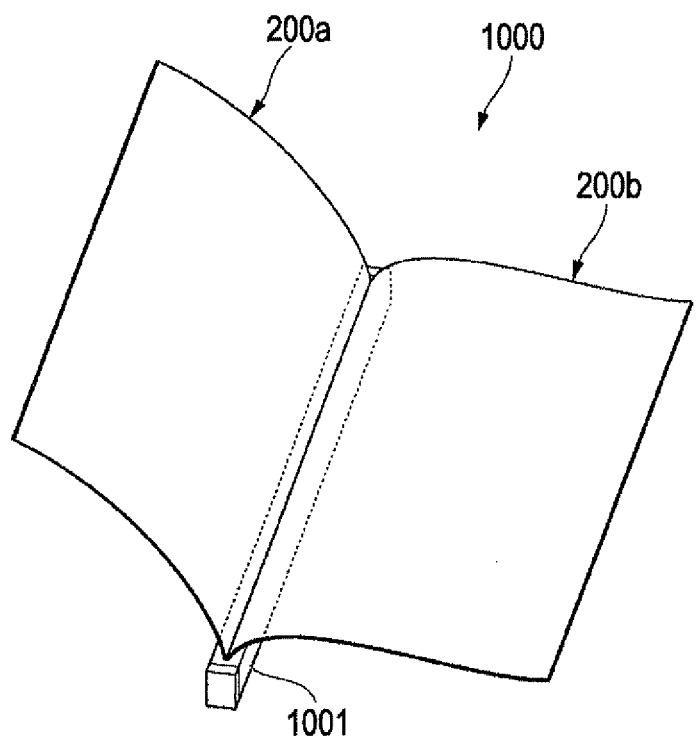
FIGS. 19A and 19B are schematic views illustrating a configuration of a book type display as an example of an electronic apparatus according to the invention.
Figure 19B:
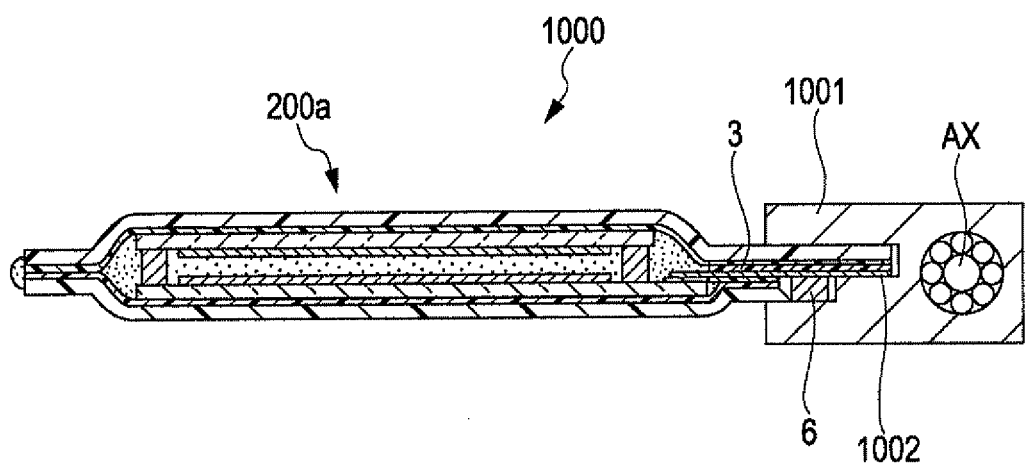

FIGS. 19A and 19B are schematic views illustrating a configuration of a book type display 1000 as an example of an electronic apparatus including an organic EL apparatus 200. FIG. 19A is a perspective view illustrating the display 1000, and FIG. 19B is a schematic cross-sectional view illustrating a configuration of a connector portion of the electronic display.

The display 1000 is a book type display where the organic EL apparatus 200 according to the first embodiment is used as an electronic paper. In the display 1000, as shown in FIG. 19B, a hinge portion 1001 having a connector 1002 connectable to the wiring substrate 3 of the organic EL apparatus 200a is provided to the portion corresponding to the booking filing portion. The connector 1002 is attached to the hinge portion 1001, so that it can rotate about the rotation axis Ax. Therefore, the organic EL apparatus 200a can be turned over by rotating the connector 1002 as a type paper is turned over.

In addition, as shown in FIG. 19A, a plurality of the organic EL apparatuses 200a and 200b may be detachably connected to the hinge portion 1001. Accordingly, similarly to loose-leaf papers, necessary sheets of electronic paper are attached or detached to be carried.

Electronic Apparatus 2

Figure 20A:
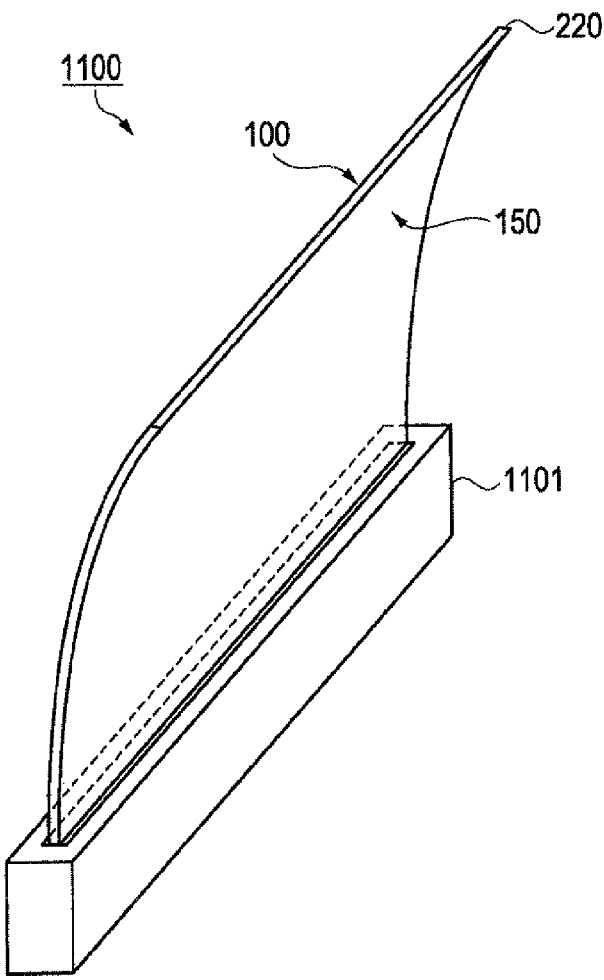
FIG. 20A is a schematic perspective view illustrating a display as an example of an electronic apparatus.
Figure 20B:
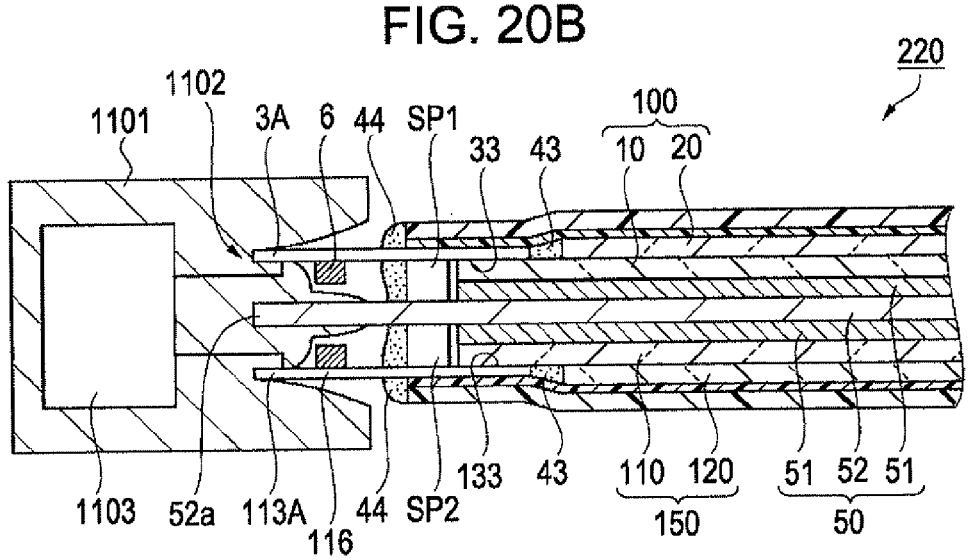
FIG. 20B is a schematic cross-sectional view illustrating main components in a connection structure of a display body and an organic EL apparatus.

FIG. 20A is a schematic perspective view illustrating a display as an example of an electronic apparatus, and FIG. 20B is a schematic cross-sectional view illustrating main components in a connection structure of a display body and an organic EL apparatus.

Next, an electronic apparatus using the organic EL apparatus 220 according to the third embodiment is described with reference to FIGS. 20A and 20B.

As shown in FIGS. 20A and 20B, a display 1100 as an electronic apparatus includes a display body 1101 having a shape of an elongated rectangular parallelepiped and an organic EL apparatus 220 connected to the display body 1101 as a display portion.

On the one surface of the display body 1101, a passage for connection to the organic EL apparatus 220 is provided. In the inner portion of the passage, as shown in FIG. 20B, the wiring substrates 3A and 113A which are exposed outside the encapsulation structure 400 of the organic EL apparatus 220 and a connecter portion 1102 for holding the portion 52a of heat releasing member 50 for electrical connection to a driving circuit portion 1103 are provided. The connection to other wiring substrates 3B, 3C, 113B, and 113C is configured in the same manner.

According to the display 1100, in addition to thin and lightly-weighted structure suitable for carrying, since the display portion has a flexibility, the display can be perceived as the pages of paper seams to be turned over.

In addition, since a color image can be displayed on the side of the organic EL panel 100 and a monochrome image can be displayed on the side of the electrophoretic panel 150, the display 1100 can be used in a dividable manner according to the types of the to-be-displayed image information. For example, in the case where character information is main information, the information is displayed on the electrophoretic panel 150. Therefore, high visibility can be obtained, and low power consumption can be implemented.

In addition, in the embodiment, one organic EL apparatus 220 is connected to the display body 1101, but the invention is not limited thereto. A plurality of connector portions 1102 may be embedded, so that a plurality of organic EL apparatuses 220 or an organic EL apparatus where only the electrophoretic panel 150 is laminated may be connected.

In addition, in the organic EL apparatus according to the invention, the electronic apparatus is not limited to the aforementioned book type display, but various electronic apparatuses can be mounted. As the electronic apparatuses, there may be used, for example, a personal computer, a digital still camera, a view finder type or monitor directly-viewing type digital video camera, a car navigation apparatus, an in-vehicle display, pager, an electronic wallet, a calculator, a word processor, a workstation, an image telephone, a POS terminal, an apparatus having a touch panel, and the like. The organic EL apparatus can be very appropriately used as these display units. In addition, the organic EL apparatus according to the invention can be used as a device other than the display device, for example, a light source of an exposure head of a printer head.

Modified Examples

Various modified examples as well as the aforementioned embodiments are considered. Hereinafter, the modified examples are described.

Modified Example 1

In the configuration of the first embodiment, the wiring substrates 3A, 3B, and 3C are connected to the end portion of the organic EL panel 100 which is provided with a flexibility by thinning a glass substrate; the lamination structure of the organic EL panel 100, the wiring substrates 3A, 38, and 3C, and the heat releasing member 5 is disposed between the first flexible sheet member 4A and second flexible sheet member 4B; and the organic EL panel 100 is encapsulated inside the first flexible sheet member 4A and the second flexible sheet member 4B.

However, the wiring substrates 3A, 3B, and 3C may be previously connected to the surface connected to the organic EL panel 100 of the first flexible sheet member 4A; the organic EL panel 100 and the heat releasing member 5 are disposed between the first flexible sheet member 4A and second flexible sheet member 48 where the wiring substrates 3A, 3B, and 3C are connected; the organic EL panel 100 is inserted between the pair of pressing rollers 81 and 82 from the end portion of the side opposite to the side, where the wiring substrates 3A, 3B, and 3C is connected; and the organic EL panel 100 may be encapsulated inside the first flexible sheet member 4A and the second flexible sheet member 4B.

Since the organic EL panel 100 is very thin and has a flexibility, the handling is not easily performed. Therefore, in the modified example where the wiring substrates 3A, 3B, and 3C are previously connected to the first flexible sheet member 4A, in comparison with the case where, after the wiring substrates 3A, 3B, and 3C are connected to the organic EL panel 100, the organic EL panel 100 to which the wiring substrates 3A, 3B, and 3C are connected is encapsulated by the first flexible sheet member 4A and the second flexible sheet member 4B, the number of times of handling the organic EL panel 100 is reduced, so that the manufacturing can be easily performed.

In addition, in the case where ACF is used for connection between the organic EL panel 100 and the wiring substrates 3A, 3B, and 3C, in the case where the wiring substrates 3A, 3B, and 3C are previously connected to the organic EL panel 100, since the first substrate 10 of the organic EL panel 100 is formed to be very thin, the ACF exceeding the first substrate 10 is spread not only to the end surface (side surface) of the first substrate 10 but also to the stage where the organic EL panel 100 is disposed. Therefore, when the organic EL panel 100 is allowed to be moved from the stage, the first substrate 10 may be cracked due to the ACF attached to the stage and the first substrate 10.

On the contrary, in the modified example where the wiring substrates 3A, 3B, and 3C are previously connected to the first flexible sheet member 4A, organic EL panel 100 is encapsulated by the first flexible sheet member 4A and the second flexible sheet member 4B by using the pressing rollers 81 and 82, and at the same time, the organic EL panel 100 and the wiring substrates 3A, 3B, and 3C are connected to each other. Therefore, when the organic EL panel 100 and the wiring substrates 3A, 3B, and 3C are to be connected, the organic EL panel 100 may not have to be disposed on the stage. In addition, the exceeding ACF is within the connection area between the wiring substrates 3A, 3B, and 3C, the first flexible sheet member 4A, and the second flexible sheet member 4B, there is no problem in that the first substrate 10 is cracked.

In addition, in the modified example, although the wiring substrates 3A, 3B, and 3C are previously connected to the first flexible sheet member 4A, wire lines and external terminals may be previously patterned on the first flexible sheet member 4A and the first flexible sheet member 4A may be used as a wiring substrate.

According to the above configuration, since the wiring substrates 3A, 38, and 3C or the adhesive agent layers 8A, 8B, 8C, 9A, 9B, and 9C formed on the surfaces thereof are unnecessary, the number of parts can be greatly reduced. In addition, since the step difference does not occur in the wiring substrates 3A, 3B, and 3C or the adhesive agent layers 8A, 8B, SC, 9A, 9B, and 9C, air layers may not be easily induced in the interstices between the organic EL panel 100, the first flexible sheet member 4A, and the second flexible sheet member 4B, very high sealing performance can be obtained.

In addition, similarly to the organic EL apparatus 210 according to the second embodiment shown in FIG. 10, the first wiring substrates 301A, 301B, and 301C may be previously connected to the first flexible sheet member 400A, and the second wiring substrates 302A, 302B, and 302C may be previously connected to the second flexible sheet member 400B.

In addition, wire lines or external terminals may be previously patterned on the first flexible sheet member 400A and the second flexible sheet member 400B, and the first flexible sheet member 400A and the second flexible sheet member 400B may be used as the wiring substrates.

According to the method (configuration), the same functions and advantages can be obtained.

Modified Example 2

In the aforementioned organic EL apparatus 220 according to the third embodiment, the direction of exposure of the heat releasing member 50 from the first flexible sheet member 400A is not limited to only one direction. For example, the heat releasing member 50 may be exposed in the direction of the long side and the short side. More over, the exposed area can be enlarged, so that the heat releasing performance can be improved. In addition, if the wiring substrate is disposed so that the connection portion is exposed in the same direction, the bending strength of the connection portion can be reinforced.

Modified Example 3

In the aforementioned organic EL apparatus 220 according to the third embodiment, the configuration of the heat releasing member 50 is limited thereto. As a configuration using only the heat releasing plate 52, it may overlap at least the organic EL panel 100.

Figure 21A:
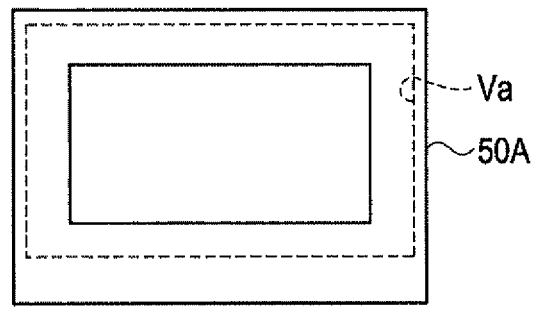
FIGS. 21A to 21C are schematic plan views illustrating heat releasing members according to modified examples.
Figure 21B:
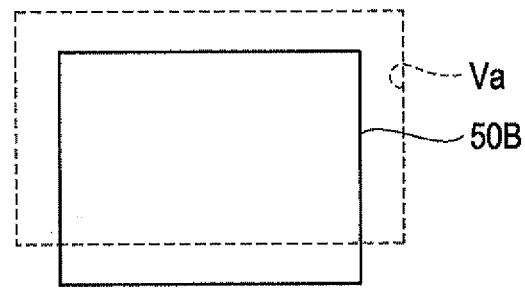
Figure 21C:
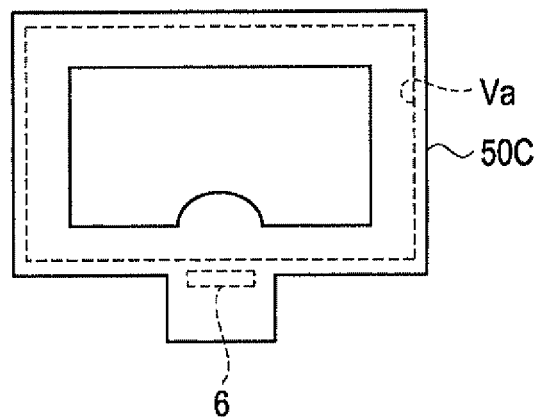

In addition, the shape of the heat releasing member 50 is not limited to the sheet shape. FIGS. 21A to 21C are schematic plan views illustrating heat releasing members according to modified examples. For example, as shown in FIG. 21A, the heat releasing member 50A according to the modified example is configured to have an outer shape of a frame so as to overlap the peripheral area in the light-emitting area Va of the organic EL panel 100. According to the configuration, the heat can be effectively released from the outer circumferential side of the organic EL apparatus 220. In addition, as shown in FIG. 21B, the heat releasing member 50B according to the modified example is configured to have an outer shape so as to overlap the substantially central area of the light-emitting area Va. According to the configuration, the heat generated from the central area where a large amount of heat is easily accumulated can be effectively released, and the heat releasing material can be effectively used. In addition, heat is also generated from the semiconductor chip 6 that is at least a portion of the driving circuit (refer FIG. 26 in Example). Therefore, in the organic EL panel 100, in the case where the semiconductor chip 6 is mounted on the surface of the overhanging portion 33, as shown in FIG. 21C, the heat releasing member 50C according to the modified example has a configuration where the portion where the semiconductor chip 6 overlaps the heat releasing member 50A is extended. According to the configuration, the heat generated from the semiconductor chip 6 can be effectively released out. In other words, the heat releasing member 50 may have a shape so that at least a portion thereof overlaps the heat releasing portion of the organic EL panel 100 (for example, the light-emitting area Va or the terminal portion), so that it can have a passage for releasing the heat outside a pair of first flexible sheet members 400A.

Modified Example 4

In the aforementioned organic EL apparatus 220 according to the third embodiment, the configuration where the electrophoretic panel 150 is necessarily included may not be employed. In a configuration where at least the organic EL panel 100 and the heat releasing member 50 overlap, the corresponding functions and effects may be obtained. In this case, the heat releasing member 50 may has a configuration where the heat releasing sheet 51 and the heat releasing plate 52 are laminated. In addition, in the case where the pair of first flexible sheet members 400A are laminated, since the one surface becomes the display surface, the first flexible sheet member 400A covering the side opposite to the display surface may not be configured to be transparent.

Modified Example 5

In the aforementioned organic EL apparatus 220 according to the third embodiment, the organic EL panel 100 is not limited to the top emission type. A bottom emission type organic EL panel may be used. In addition, the invention is not limited to the active driving type where the selection transistors 15a and the driving transistors 15b are provided as the switching devices, but a passive driving type may be used.

Figure 22:
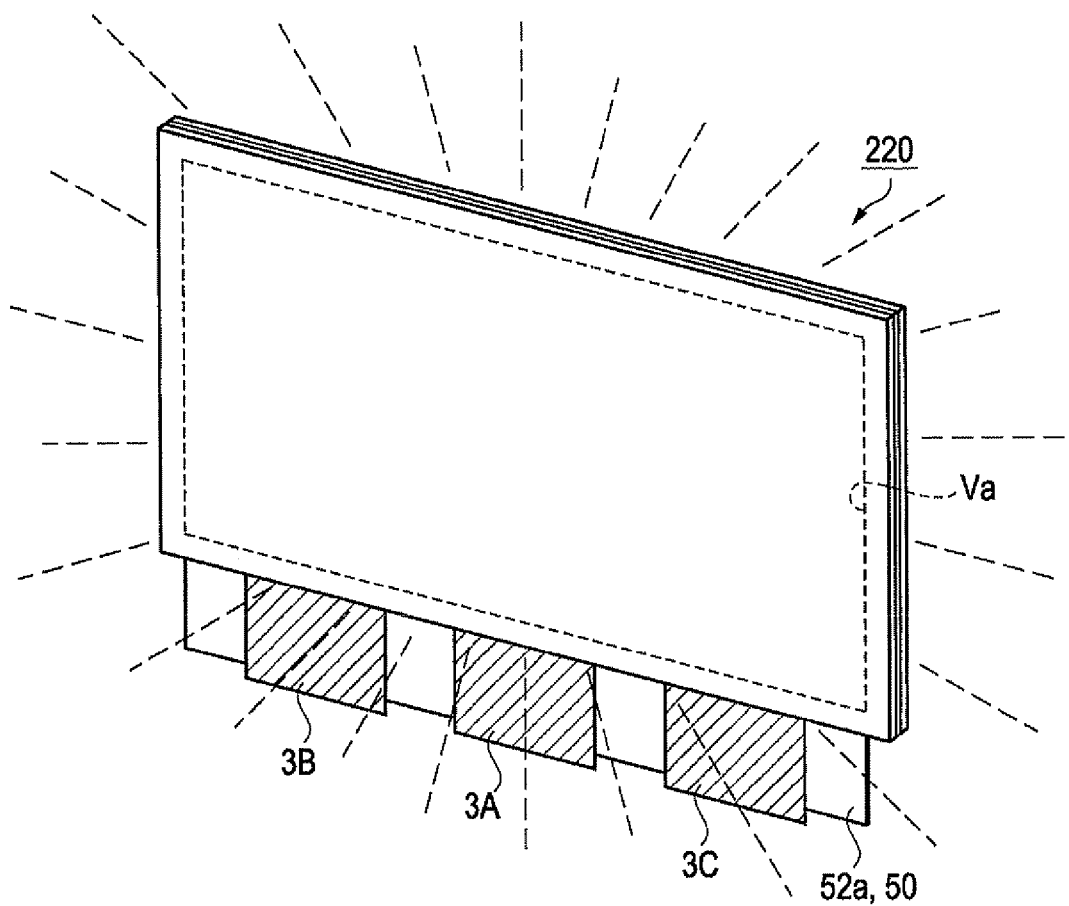
FIG. 22 is a schematic perspective view illustrating usage forms of modified examples of an organic EL apparatus.
Figure 24B:
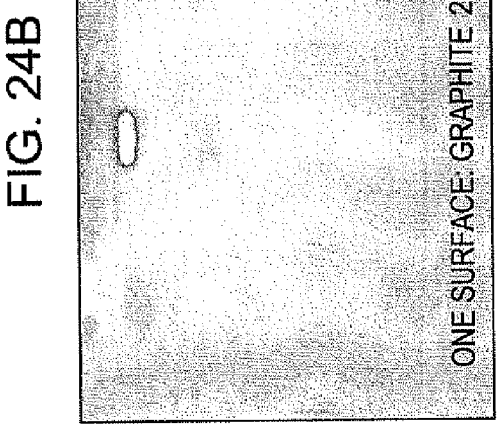
FIGS. 24A to 24D are views illustrating a distribution of a temperature of a display area at the time of light emission.
Figure 24D:
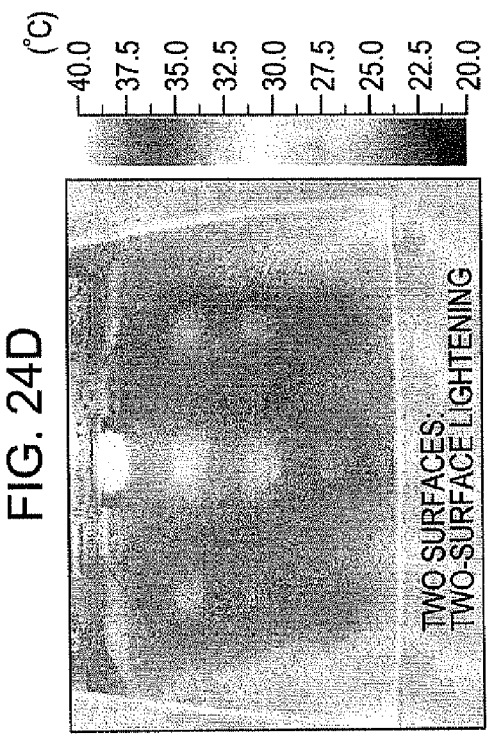
Figure 24A:
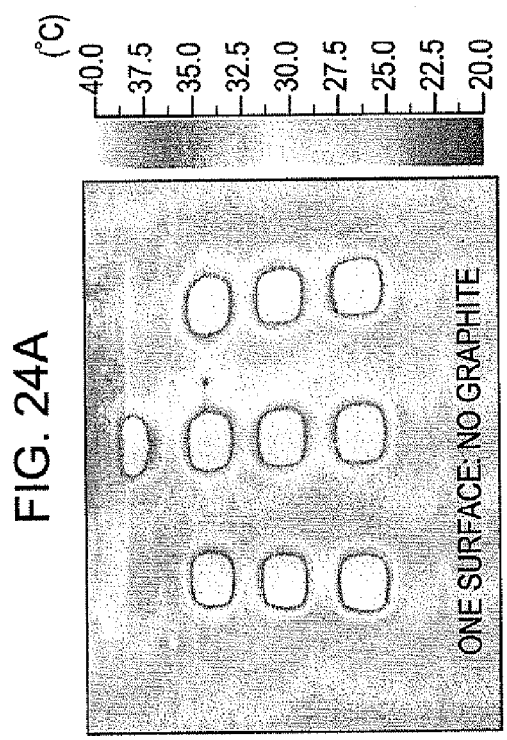
Figure 24C:
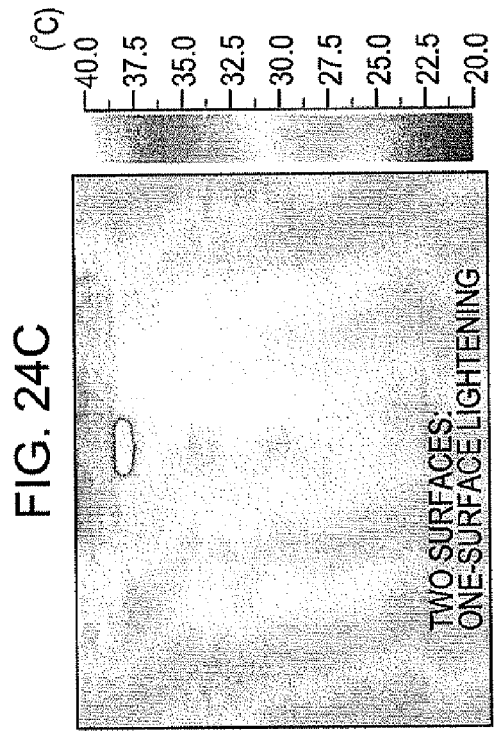

In addition, although the organic EL panel 100 has a configuration where difference colors can be obtained and a color display can be performed, the invention is not limited thereto, but a monochrome light emission configuration may be used. For example, as shown in FIG. 22, the white light emission may be used for an illumination apparatus.

Modified Example 6

In the aforementioned organic EL apparatus 220 according to the third embodiment, the electrophoretic panel 150 is not limited to the configuration having a microcapsule type electrophoretic layer 127. For example, an electron liquid powder type electrophoretic panel where electron liquid powders having an electrical charge property may be introduced into the pixels 137 and display On/OFF control is performed by changing plus/minus (polarity). In addition, an electrophoretic panel using cholestric liquid crystals may be used.

Modified Example 7

In the aforementioned organic EL apparatus 220 according to the third embodiment, the light-receiving type display panel which is laminated through the heat releasing member 50 on the organic EL panel 100 is not limited the electrophoretic panel 150. For example, a reflection type liquid crystal panel may be used to expect the same heat releasing effect and display effects.

EXAMPLES

Example 1

Hereinafter, Examples according to the first and second embodiments and advantages thereof are described with reference to FIGS. 23 and 24A to 24D.

FIG. 23 is a view illustrating a graph of a change in a temperature of a display area with respect to time at the time of light emission of an organic EL apparatus. In FIG. 23, the horizontal axis denotes time; and the vertical axis denotes a temperature of the entire surface of the display area (temperature of a surface of the flexible sheet member) when the entire surface (the entire pixels) of the display area is allowed to emit light.

An organic EL apparatus that is formed by integrating an organic EL panel having 9 pixels (3 rows×3 columns) and a heat releasing member with a pair of laminating films is used as the measurement object, that is, the organic EL apparatus. Experiment is performed under the room temperature environment (23° C.), and the light emission is continuously performed for 100 minutes starting at the boiling state.

In FIG. 23, the graph 91 indicates the example where the heat releasing sheet is not provided in the one-side emission type configuration according to the first embodiment (only the heat releasing plate is provided) (Example 1).

The graph 92 indicates the example where PGS graphite sheet (trade mark, manufactured by Panasonic Corporation) having a thickness of 25 μm is used as the heat releasing sheet in the one-side emission type configuration according to the first embodiment (Example 2).

The graph 93 indicates the example where PGS graphite sheet (trade mark, manufactured by Panasonic Corporation) having a thickness of 70 μm is used as the heat releasing sheet in the one-side emission type configuration according to the first embodiment (Example 3).

The graph 94 indicates the example where PGS graphite sheet (trade mark, manufactured by Panasonic Corporation) having a thickness of 25 μm is used as the heat releasing sheet to allow only one organic EL panel to emit light in the two-side emission type configuration according to the second embodiment (Example 4).

The graph 95 indicates the example where PGS graphite sheet (trade mark, manufactured by Panasonic Corporation) having a thickness of 25 μm is used as the heat releasing sheet to allow two organic EL panels to emit light in the two-side emission type configuration according to the second embodiment (Example 5).

As shown in FIG. 23, in the organic EL panels according to Examples 1 to 5, the temperature is increased at most up to 55° C. for long time light emission. In the organic EL apparatus of the related art where the heat releasing member is not provided, for long time light emission, the temperature of the display area is increased up to about 100° C., so that bad influence on the light emission characteristic of the organic EL device may occur. However, in the organic EL apparatuses according to Examples 1 to 5, the temperature may be much lower than the above temperature, so that the influence on the light emission characteristic may be greatly decreased.

Particularly, in the organic EL apparatus according to Examples 2 to 5 where the heat releasing sheet is provided, the temperature of the display area is less than 40° C., so that the temperature can be limited to a very low temperature. At this temperature, the influence on the light emission characteristic does not almost occur.

FIGS. 24A to 24D are views illustrating a distribution of a temperature of a display area at the time of light emission of the organic EL apparatuses according to Examples 1, 2, 4, and 5. FIGS. 24A to 24D are views corresponding to Examples 1, 2, 4, and 5. In FIGS. 24A to 24D, the upper portion is a portion where the heat releasing member is exposed from the laminating films.

As shown in FIGS. 24A to 24D, within the surfaces of the organic EL apparatuses of Examples, the temperatures of the 9 pixels disposed in the display areas are almost uniform. A greatly-changed temperature distribution, for example, a temperature distribution where the temperature of the central pixel is much higher than those of the pixels in the side portions does not occur, but almost uniform temperature distributions occur. Therefore, the light emission characteristic of each pixel is uniform, and the influence on the light emission characteristic is also uniform.

Particularly, in the organic EL apparatuses according to Examples 2, 4, and 5 where the heat releasing sheet is provided, the heat generated from the pixels are distributed through the heat releasing sheet over the entire surface of the display area, in comparison with the configuration according to Example 1 where no heat releasing sheet is provided, the temperatures of the individual pixels are lowered. For example, in the organic EL apparatus according to Examples 2 where the heat releasing sheet is provided, in comparison with the configuration according to Example 1 where no heat releasing sheet is provided, the temperatures of the individual pixels are lowered down to about 20° C.

In this manner, according to the organic EL apparatuses according to Example 1 and 2, it is possible to implement an organic EL apparatus where the light emission characteristics of the pixels are uniform.

Example 2

Next, the heat releasing effect of the organic EL apparatus 220 according to the third embodiment is described with reference to FIGS. 25 and 26.

Figure 25:
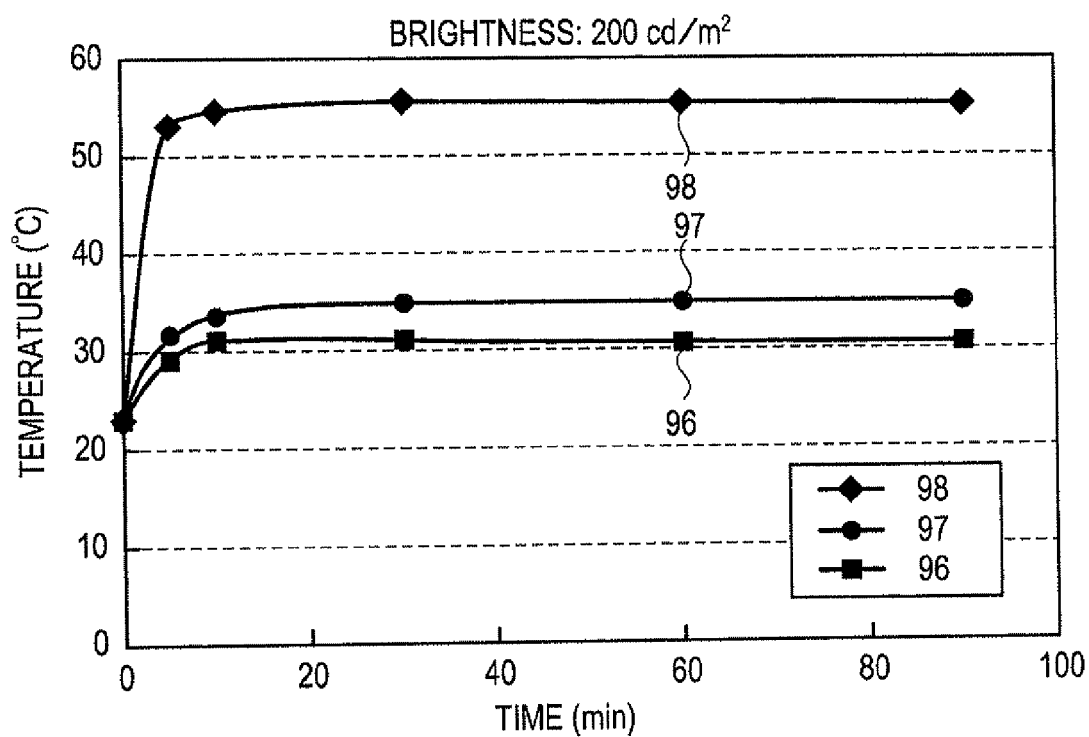
FIG. 25 is a view illustrating a graph of a change in a temperature of a display area with respect to time at the time of light emission in Examples according to the third embodiment.

FIG. 25 is a view illustrating a graph of a change in a temperature of a light-emitting area with respect to time at the time of light emission of the organic EL apparatus. In FIG. 25, the horizontal axis denotes time; and the vertical axis denotes a temperature (temperature of a surface of the first flexible sheet member 400A) when the entire surface (the entire pixels) of the light-emitting area is allowed to emit light.

Measurement is performed under the room temperature environment (23° C.). The light emission is continuously performed for 100 minutes starting at the boiling state, and during the time interval, the temperature of the surface is measured.

First, the graph 96 indicates Example 1 having a configuration of OLED (organic EL panel 100)+heat releasing member+EPD (electrophoretic panel 150).

In addition, the graph 97 indicates Example 2 having a configuration where the organic EL panel 100 and the heat releasing member are laminated by the first flexible sheet member 400A without the electrophoretic panel 150.

In addition, the graph 98 indicates Comparative Example having a configuration where only the organic EL panel 100 is laminated by the pair of first flexible sheet members 400A.

As shown in FIG. 25, in Comparative Example shown in the graph 98 where the heat releasing treatment is not provided, the temperature of the surface is increased up to 55° C. in 10 minutes after turned on, and after that, the temperature is almost constant. However, practically, it is difficult to directly touch and treat the first flexible sheet member 400A.

In Example 2, as shown in the graph 97, similarly although the temperature of the surface is increased up to about 35° C. in 10 minutes after turned on, but after that, the temperature is maintained almost constant. Therefore, it can be understood that, the heat generated from the organic EL devices 60 is not accumulated within the organic EL apparatus 220, and the heat can be efficiently released out through the heat releasing member 50.

In addition, in Example 1, as shown in the graph 96, similarly although the temperature of the surface is increased up to about 30° C. in 10 minutes after turned on, the temperature is maintained almost constant. Therefore, it can be understood that the heat releasing performance is further improved in comparison with Example 2. In other words, since the electrophoretic panel 150 that is a light-receiving type display panel further overlaps the heat releasing member 50, heat capacity is increased, so that the heat releasing effect is further improved.

Figure 26:
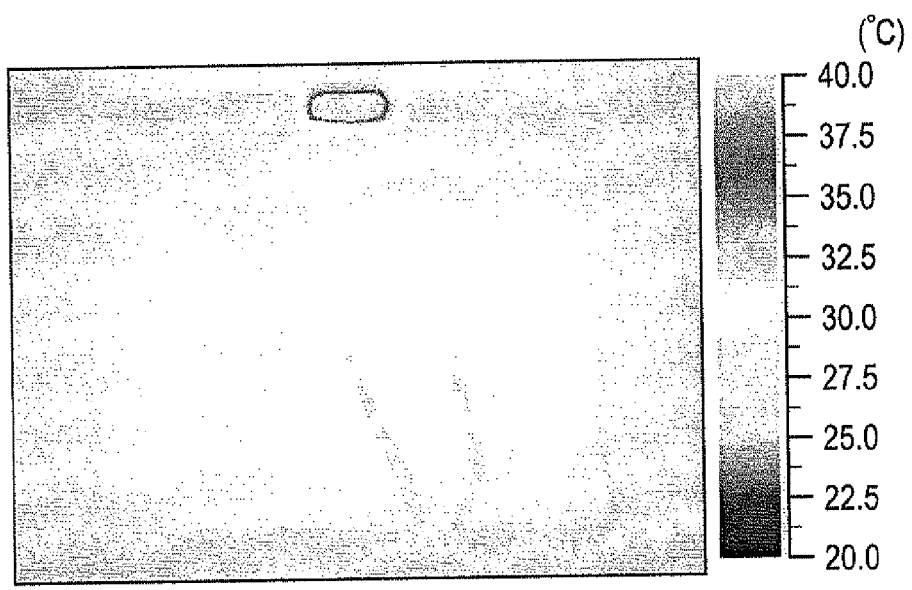
FIG. 26 is a view illustrating a distribution of a temperature of a display area at the time of light emission.

FIG. 26 is a view illustrating a distribution of a temperature of surface of an organic EL apparatus. More specifically, in the organic EL apparatus 220, the light-emitting area Va is divided into vertically three light-emitting areas and horizontally three light-emitting areas, totally 9 light-emitting areas for light emission, which are separated from each another. Next, the organic EL apparatus 220 in the light emitting state is photographed by an infrared camera, and a distribution of the temperature of surface is shown as a thermography.

As shown in FIG. 26, although the temperatures of the selectively emitted 9 light-emitting areas are about 30° C., the temperature of the non-light-emitting area as the peripheral area is also 30° C. Therefore, it can be understood that the heat is efficiently distributed over the entire area of the light-emitting area Va.

In addition, the temperature of the peripheral portion in the organic EL apparatus 220 is almost 23° C. In the upper central portion of the figure, the portion where the temperature of surface is increased as a shape of island (about 40° C.) denotes the semiconductor chip 6 that is mounted on the wiring substrate 3A. In addition, the four stripe-shaped portions that are extended toward the center of the organic EL apparatus 220 denote the connection cords of the probes that directly measure the temperature of surface.

The entire disclosure of Japanese Patent Application No.: 2009-077571, filed Mar. 26, 2009 and 2009-267189, filed Nov. 25, 2009 are expressly incorporation by reference herein.

What is claimed is:

1. An organic EL apparatus comprising:
    a first substrate that has a first surface and a second surface being opposite to the first surface;
    a second substrate that is opposite to the first surface of the first substrate;
    a light emitting element that is disposed between the first surface of the first substrate and the second substrate, the light emitting element having a first electrode, a second electrode, and a light emitting layer disposed between the first electrode and the second electrode;
    a heat releasing member having a thermal conductivity and including at least one of graphite or a metal; and
    a pair of film sheets,
    the heating releasing member having a first portion being in contact with the second surface of the first substrate and a second portion not being in contact with the first substrate,
    the first portion of the heat releasing member overlapping the light emitting element in plan view,
    the second portion of the heat releasing member being disposed outside of the first and second substrate in plan view,
    the first substrate, the second substrate, and the first portion of the heat releasing member being interposed and sealed between the pair of film sheets, and
    the second portion of the heat releasing member being exposed outside the pair of film sheets.

2. The organic EL apparatus according to claim 1,
    wherein the heat releasing member is a lamination structure constituted by a heat releasing sheet, of which thermal conductivity in the in-plane direction is higher than that in the thickness direction thereof, and a heat releasing plate that is made of the metal,
    wherein the first substrate and the second substrate overlap the heat releasing sheet, and
    wherein a portion of the heat releasing plate is exposed outside the pair of film sheets.

3. The organic EL apparatus according to claim 1, wherein at least interstices generated between the pair of film sheets and outer circumferential portion end surfaces of the first and second substrate are filled with a sealing resin, and the first and second substrate are encapsulated by the pair of film sheets.

4. The organic EL apparatus according to claim 3,
    wherein the first substrate is composed of a glass substrate, and
    wherein a thickness of the first substrate is equal to or larger than 20 μm and equal to or smaller than 50 μm.

5. The organic EL apparatus according to claim 2, wherein the heat releasing sheet includes a graphite sheet.

6. The organic EL apparatus according to claim 1,
    wherein a display panel is further disposed at a side of the heat releasing member opposite to a side where the heat releasing member and the first and second substrate overlap, and
    wherein the first and second substrate, the heat releasing member, and the display panel are interposed and encapsulated by the pair of film sheets.

7. The organic EL apparatus according to claim 6, wherein the display panel is an organic EL panel or an electrophoretic panel having an electrophoretic layer.

8. An electronic apparatus having the organic EL apparatus according to claim 1.

9. The organic EL apparatus according to claim 1, wherein the second portion of the heat releasing member is exposed outside peripheries of the pair of film sheets.

10. The organic EL apparatus according to claim 4, wherein the thickness of the first substrate is equal to or larger than 20 μm and equal to or smaller than 40 μm.

* * * * *